United States Patent [19]

Matthews

[11] Patent Number: 5,112,761
[45] Date of Patent: May 12, 1992

[54] BICMOS PROCESS UTILIZING NOVEL PLANARIZATION TECHNIQUE

[75] Inventor: James A. Matthews, Milpitas, Calif.

[73] Assignee: MicroUnity Systems Engineering, Sunnyvale, Calif.

[21] Appl. No.: 463,290

[22] Filed: Jan. 10, 1990

[51] Int. Cl.⁵ ............... H01L 21/328; H01L 21/335; H01L 21/225

[52] U.S. Cl. ........................... 437/31; 437/34; 437/44; 437/50; 437/57; 437/162; 437/193; 437/200; 437/228; 357/43

[58] Field of Search ............ 437/31, 32, 33, 34, 437/41, 56, 57, 58, 59, 160, 162, 193; 357/34, 43

[56] References Cited

U.S. PATENT DOCUMENTS

| | | | |
|---|---|---|---|
| 4,688,314 | 8/1987 | Weinberg et al. | 437/56 |
| 4,707,456 | 11/1987 | Thomas et al. | 437/41 |
| 4,727,046 | 7/1986 | Tuntasood et al. | 437/54 |
| 4,735,916 | 4/1988 | Homma et al. | 437/57 |
| 4,808,548 | 2/1989 | Thomas et al. | 437/57 |
| 4,816,423 | 5/1987 | Havemann | 437/31 |
| 4,826,783 | 5/1989 | Choi et al. | 437/31 |
| 4,857,481 | 8/1989 | Tam et al. | 437/182 |
| 4,902,640 | 2/1990 | Sachitano et al. | 437/57 |

Primary Examiner—T. N. Quach
Attorney, Agent, or Firm—Blakely, Sokoloff, Taylor & Zafman

[57] ABSTRACT

A method for forming a BICMOS integrated circuit having MOS field-effect devices and bipolar junction transistors formed in a silicon substrate is disclosed. The process comprises the steps of first defining separate active areas in a substrate for each of the transistors. Next, a gate dielectric layer is formed over the surface of the wafer. Above the gate dielectric, a first layer of polysilicon is deposited. This first layer of polysilicon is then selectively etched to form a plurality of first polysilicon members each of which is equally-spaced apart from one another. The polysilicon members comprise the gates of the MOS transistors and the extrinsic base contacts of the NPN transistors. After the first polysilicon members have been defined, the base regions of the NPN transistors are formed. After insulating the first polysilicon members, an additional layer of polysilicon is deposited over the substrate to replanarize the entire wafer surface. The additional layer of polysilicon is then etched to form a plurality of second polysilicon members which are electrically isolated from the first polysilicon members. Impurities are diffused from the polysilicon members into the substrate to form the source/drain regions of the MOS transistors, and the extrinsic base and emitter regions of the NPN transistors. The final processing steps include those required for the interconnection of the MOS and NPN transistors.

50 Claims, 52 Drawing Sheets

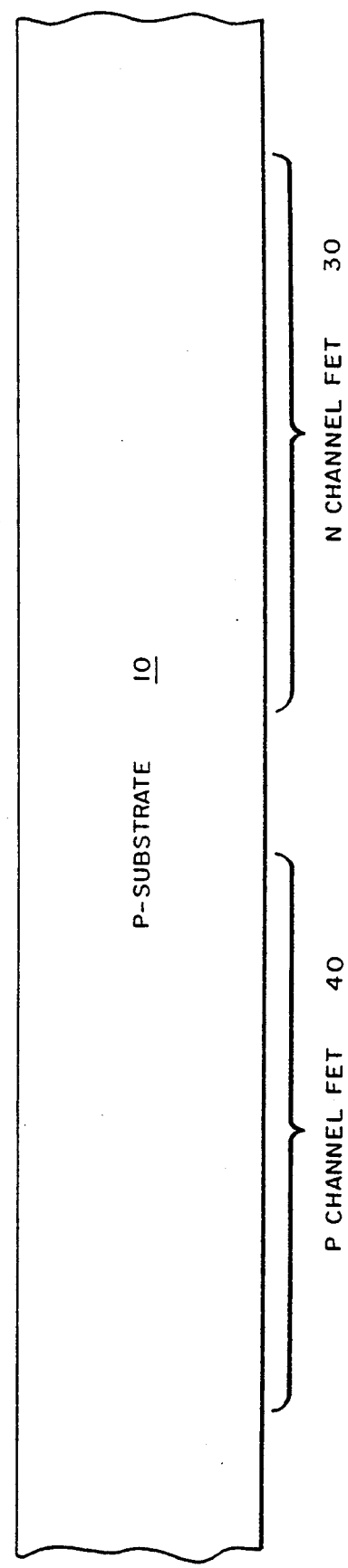

FIG._1B
→ FIG._1A
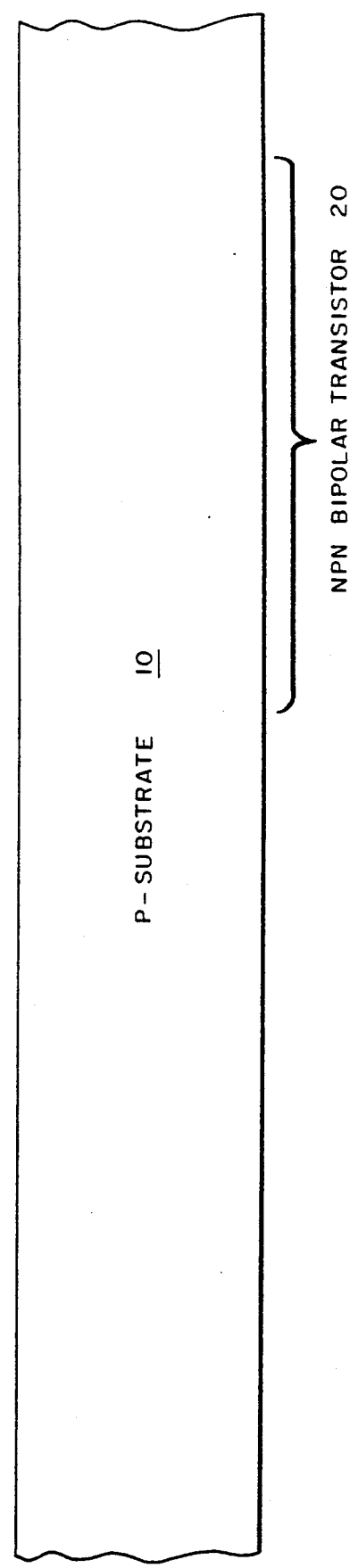

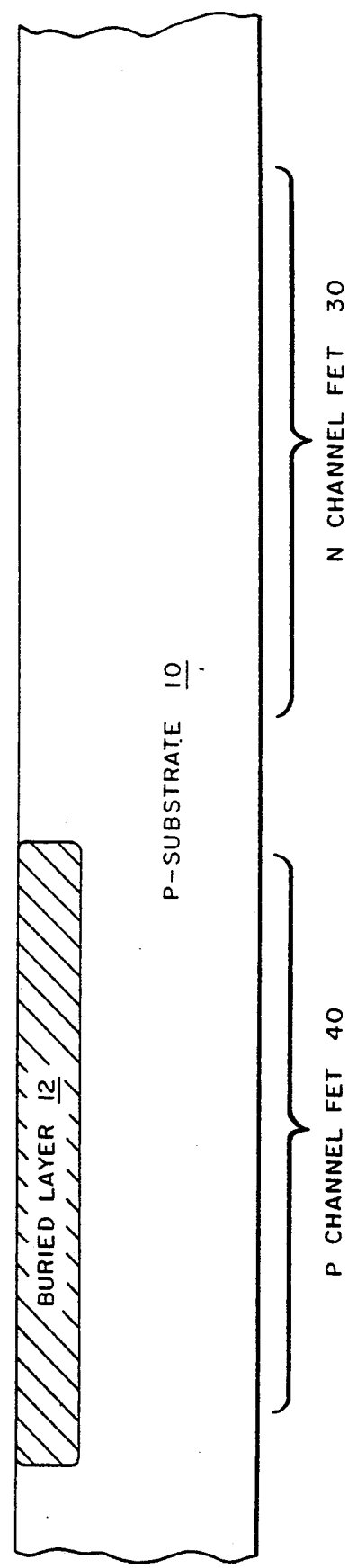

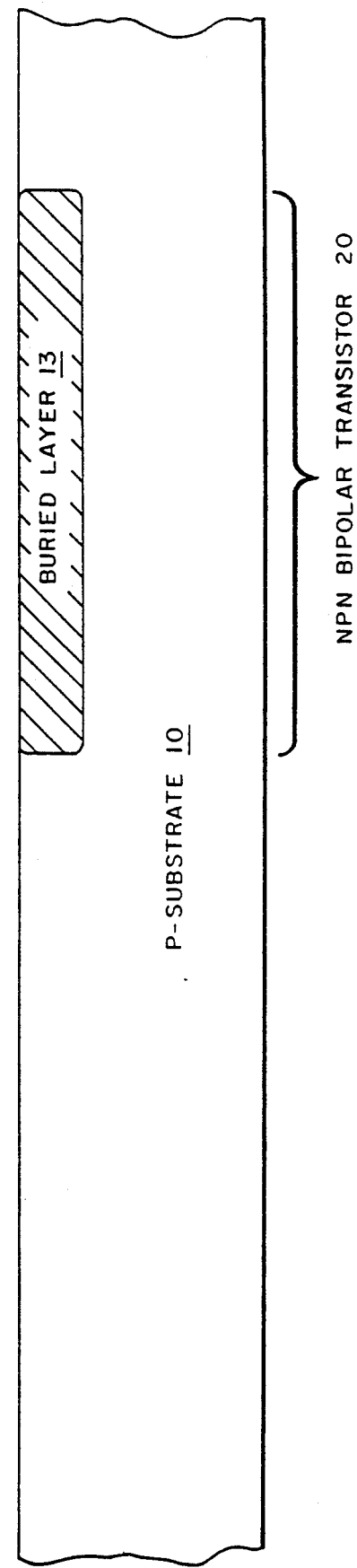
FIG_2B

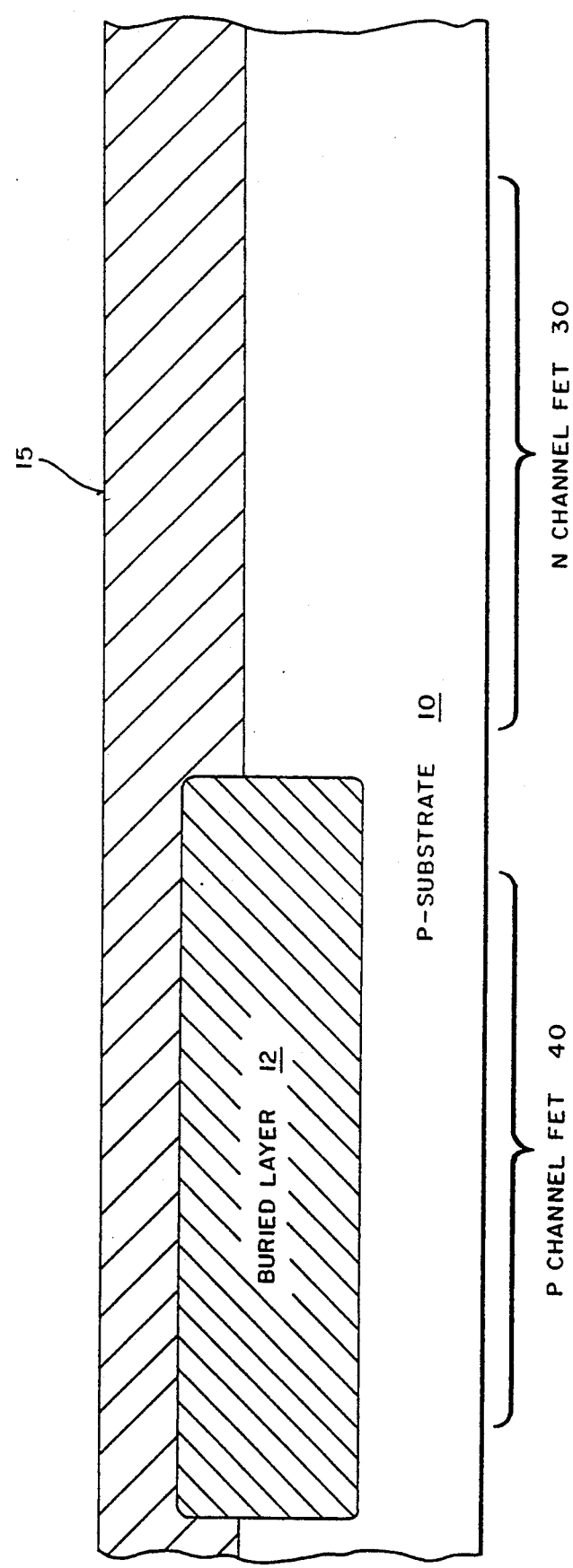

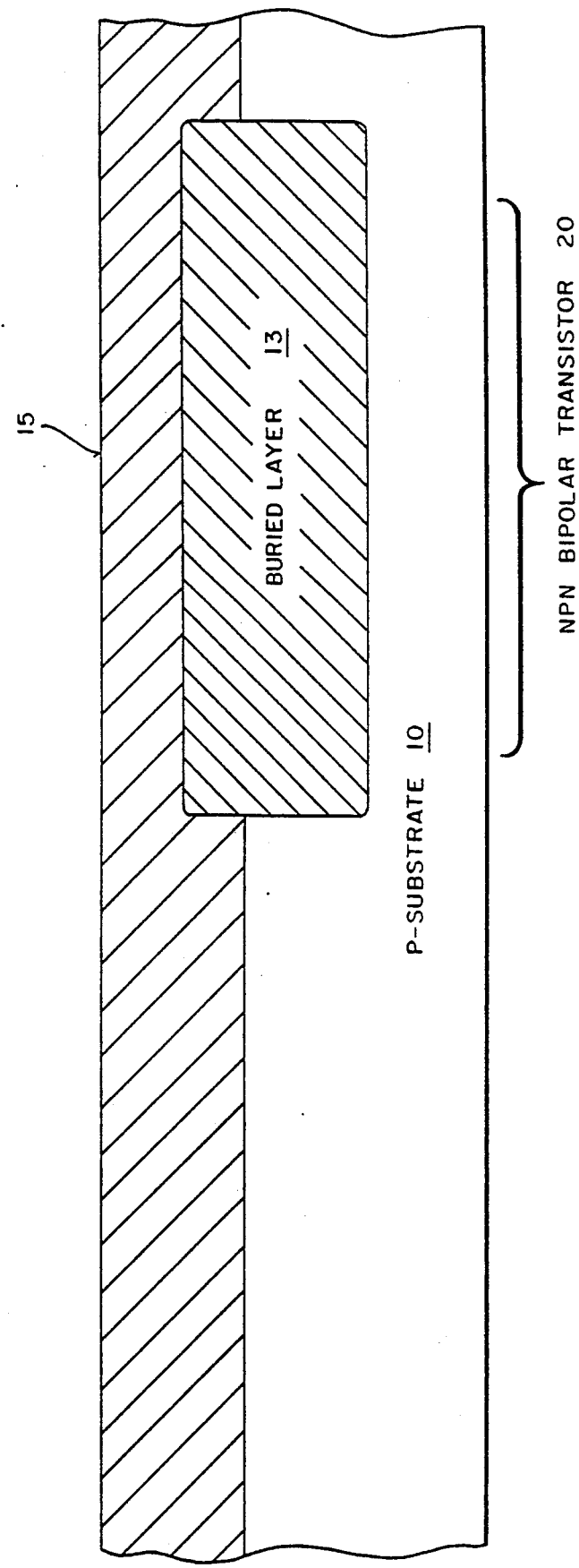

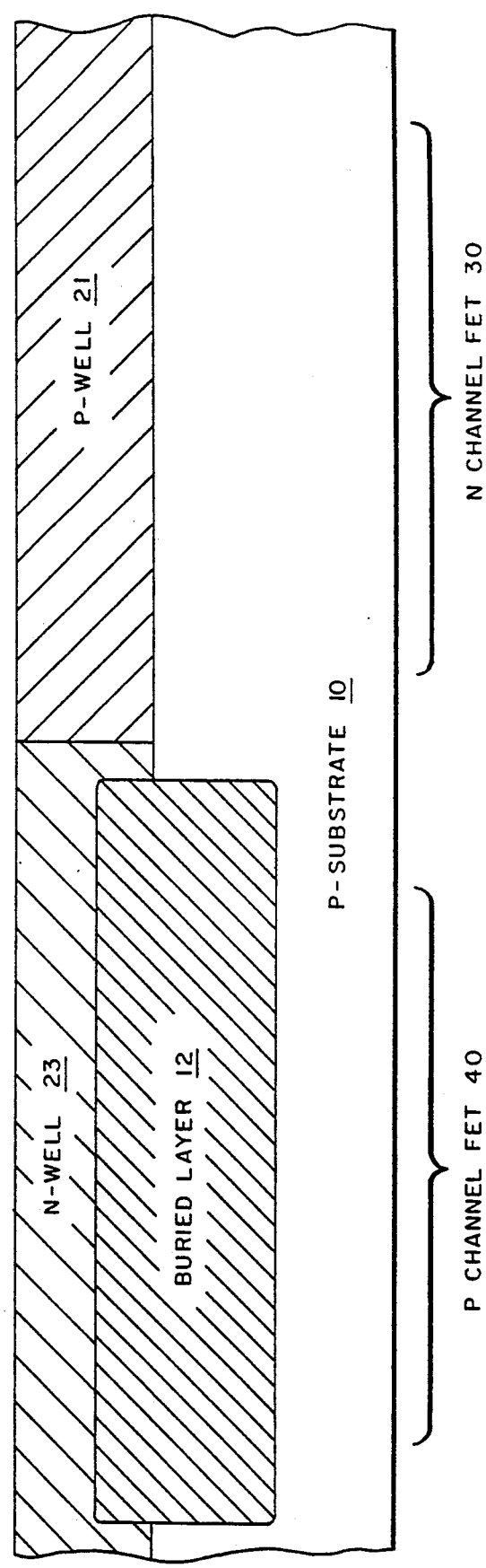

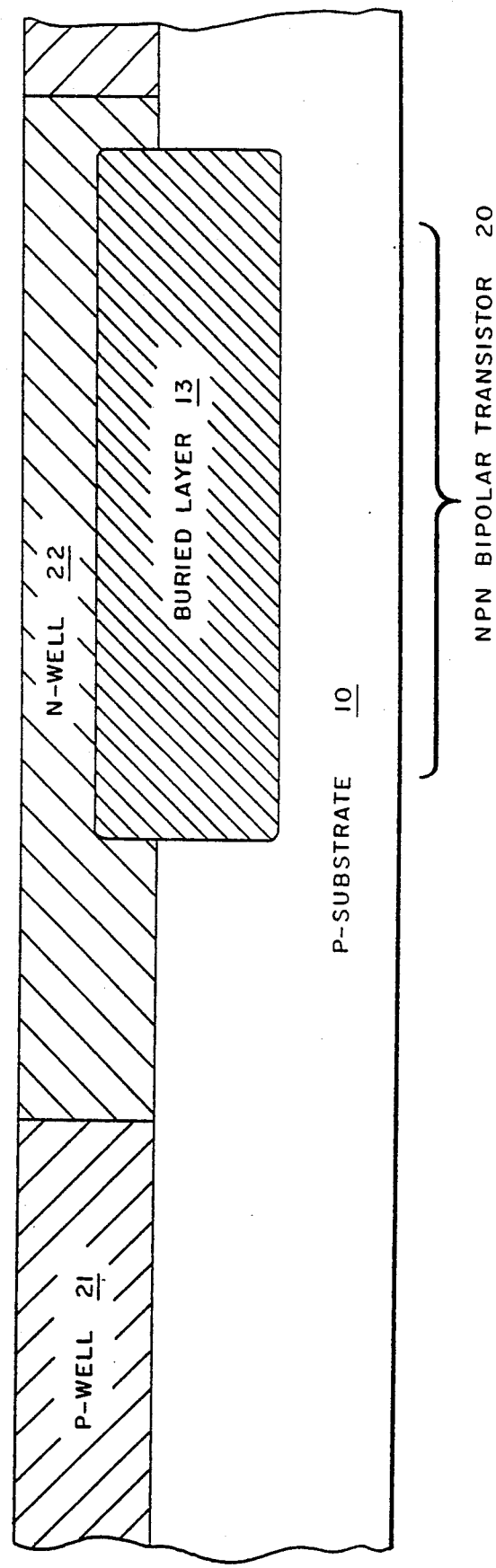

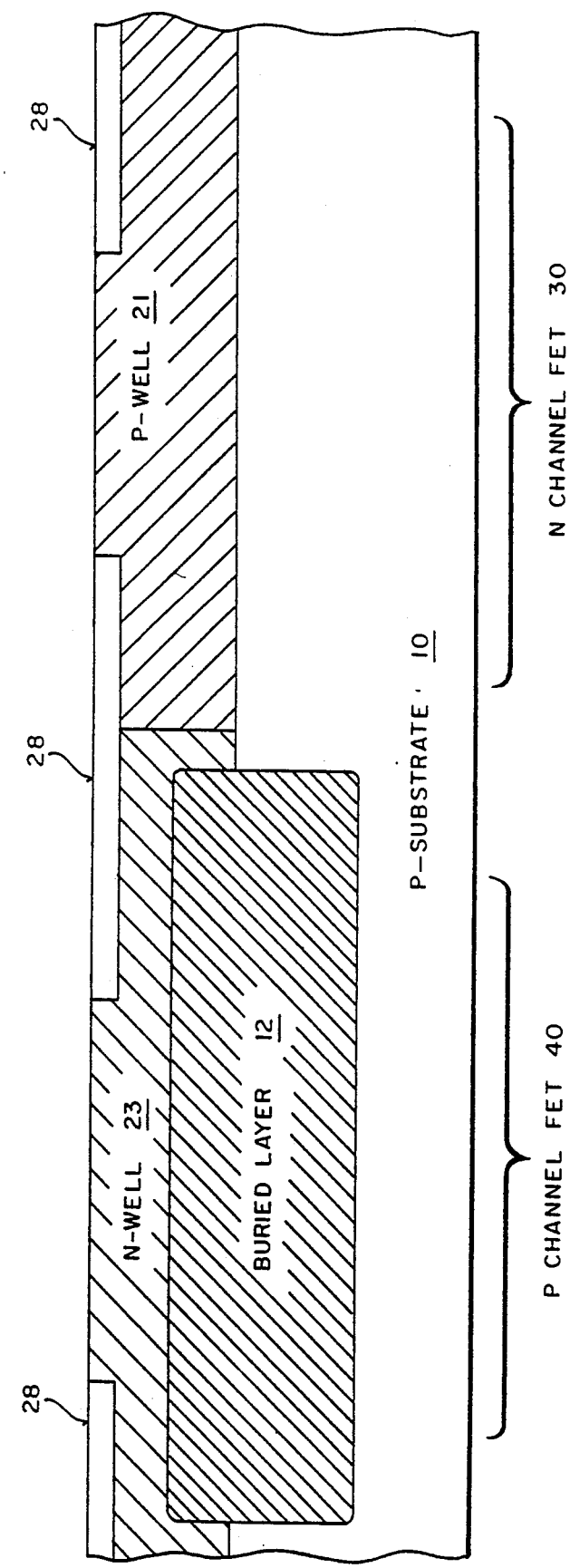

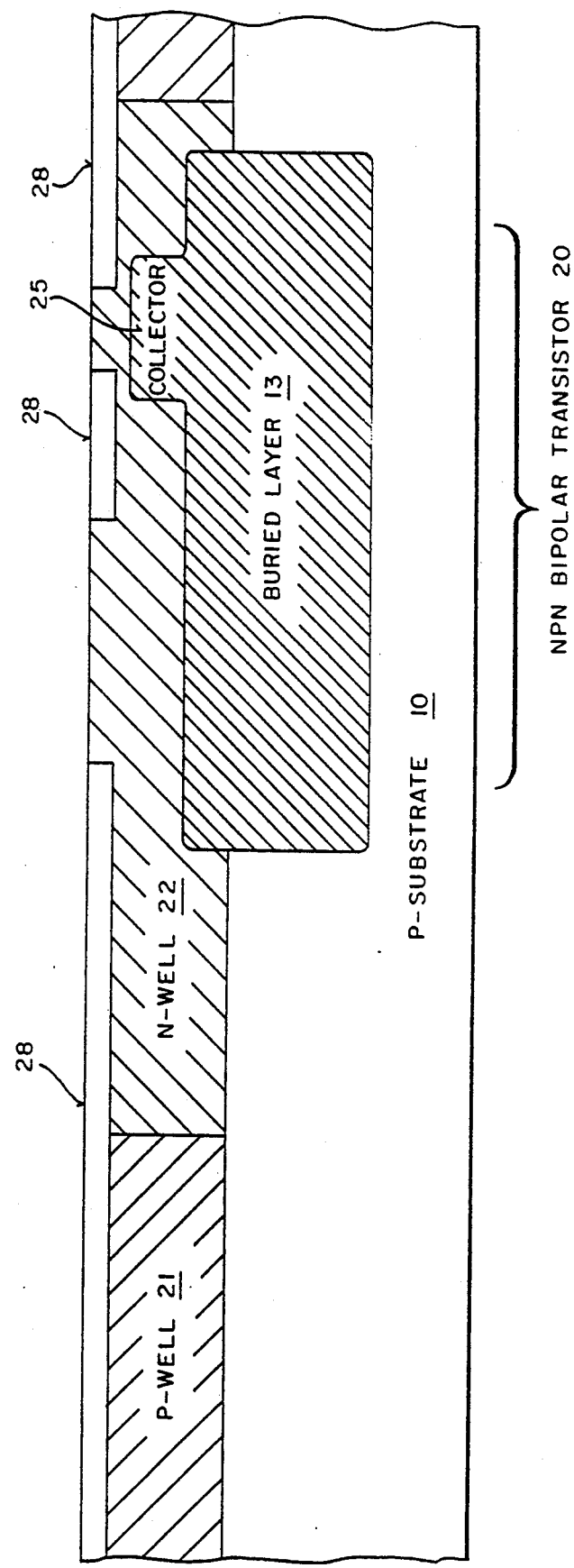

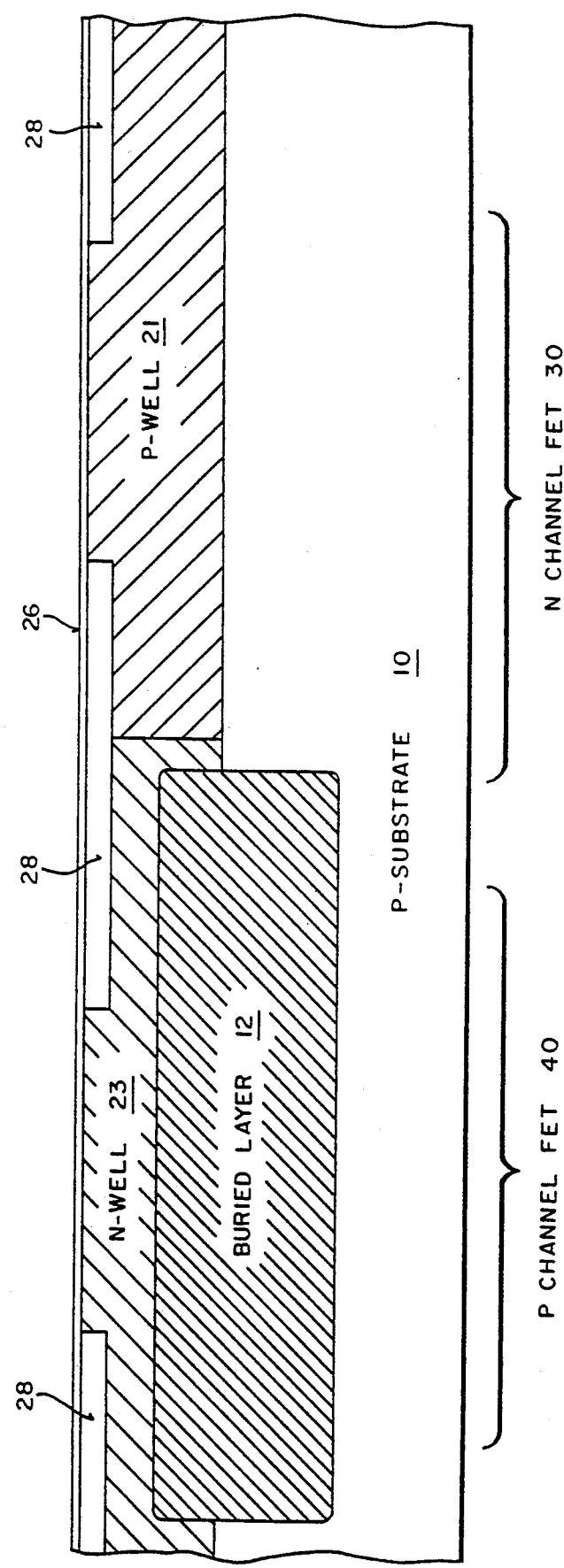

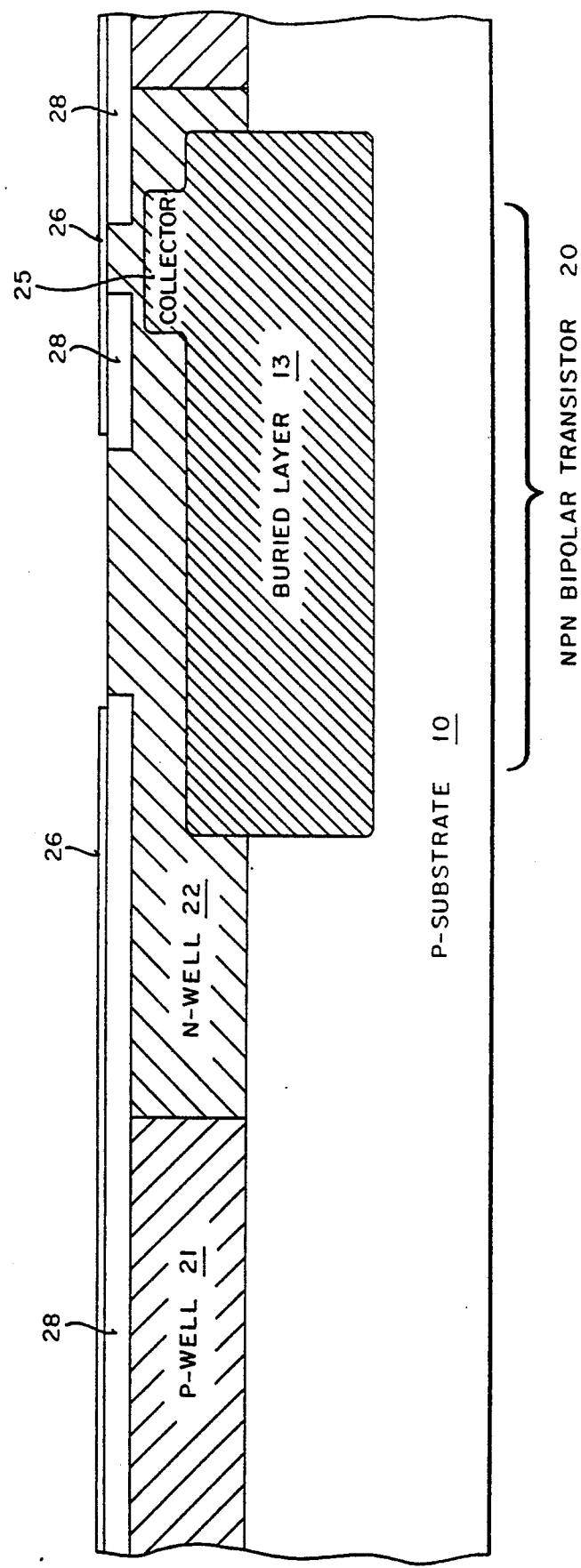

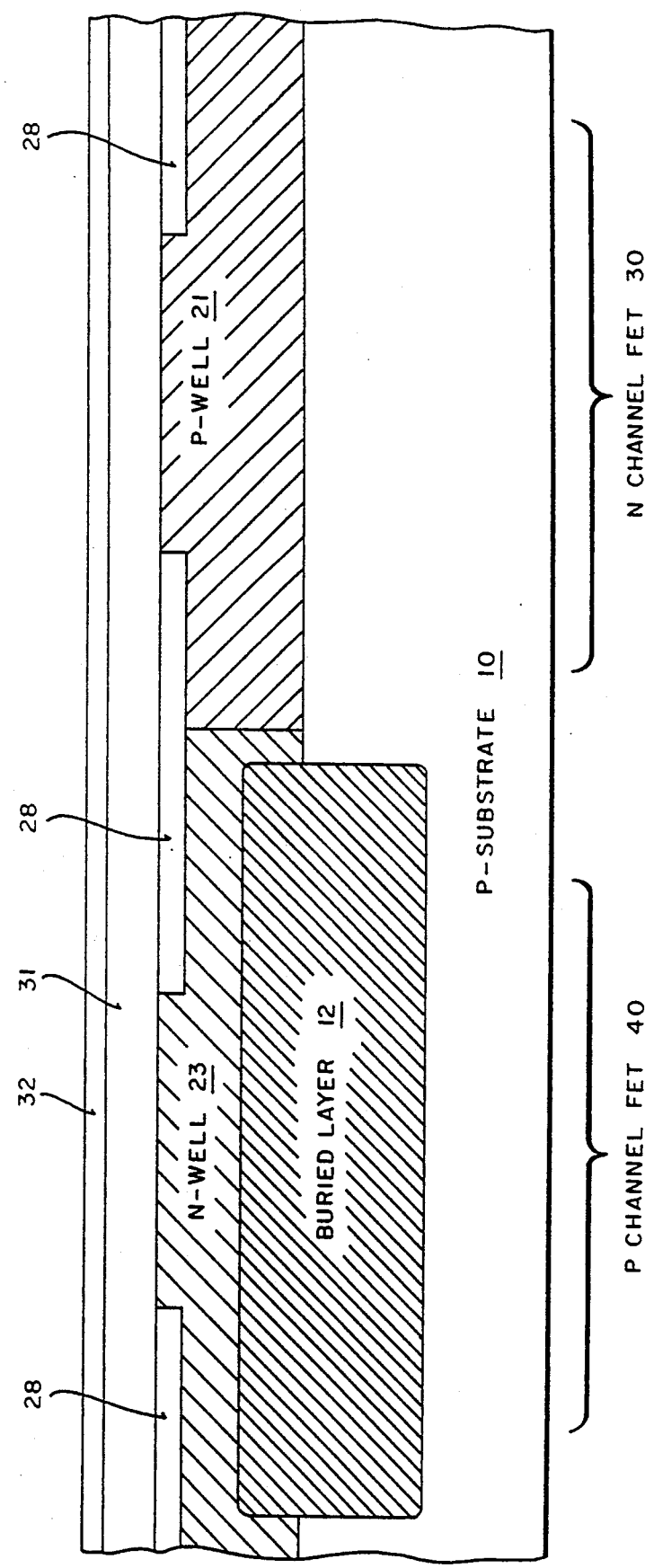

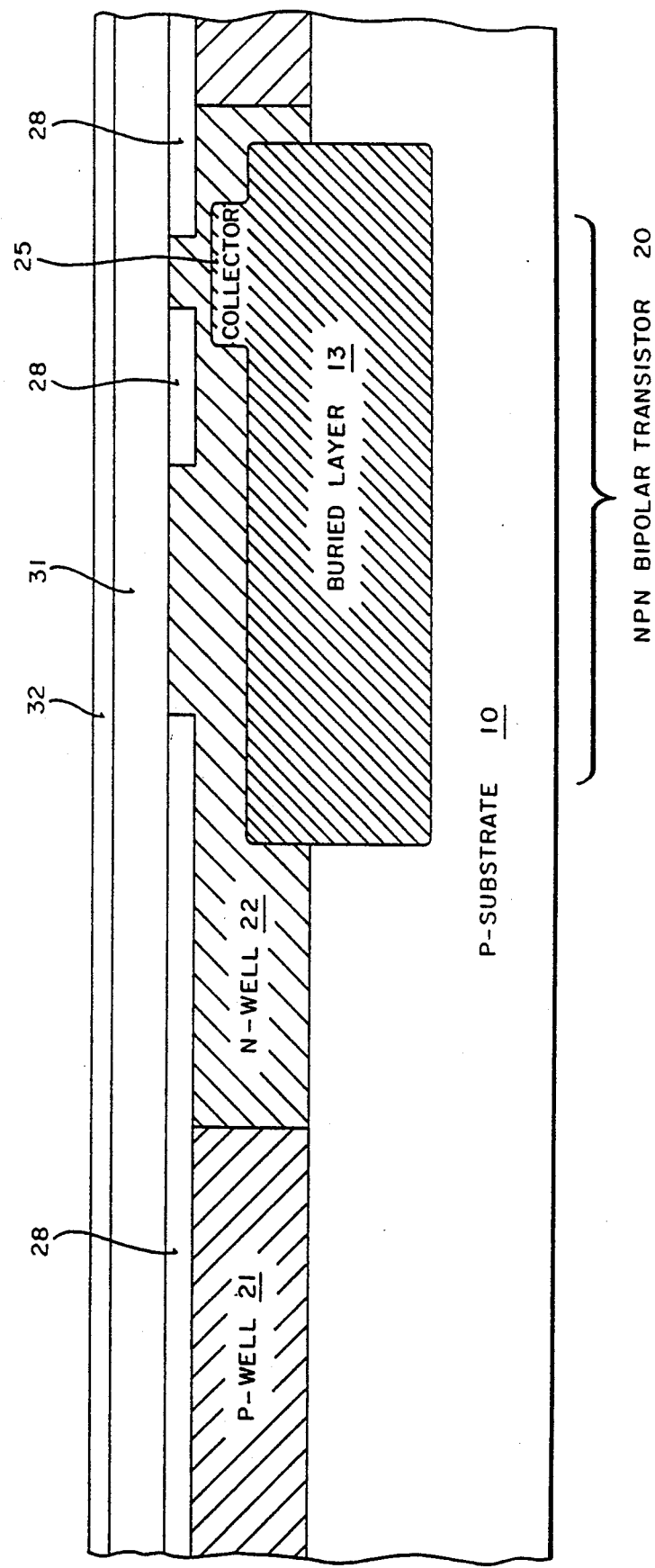

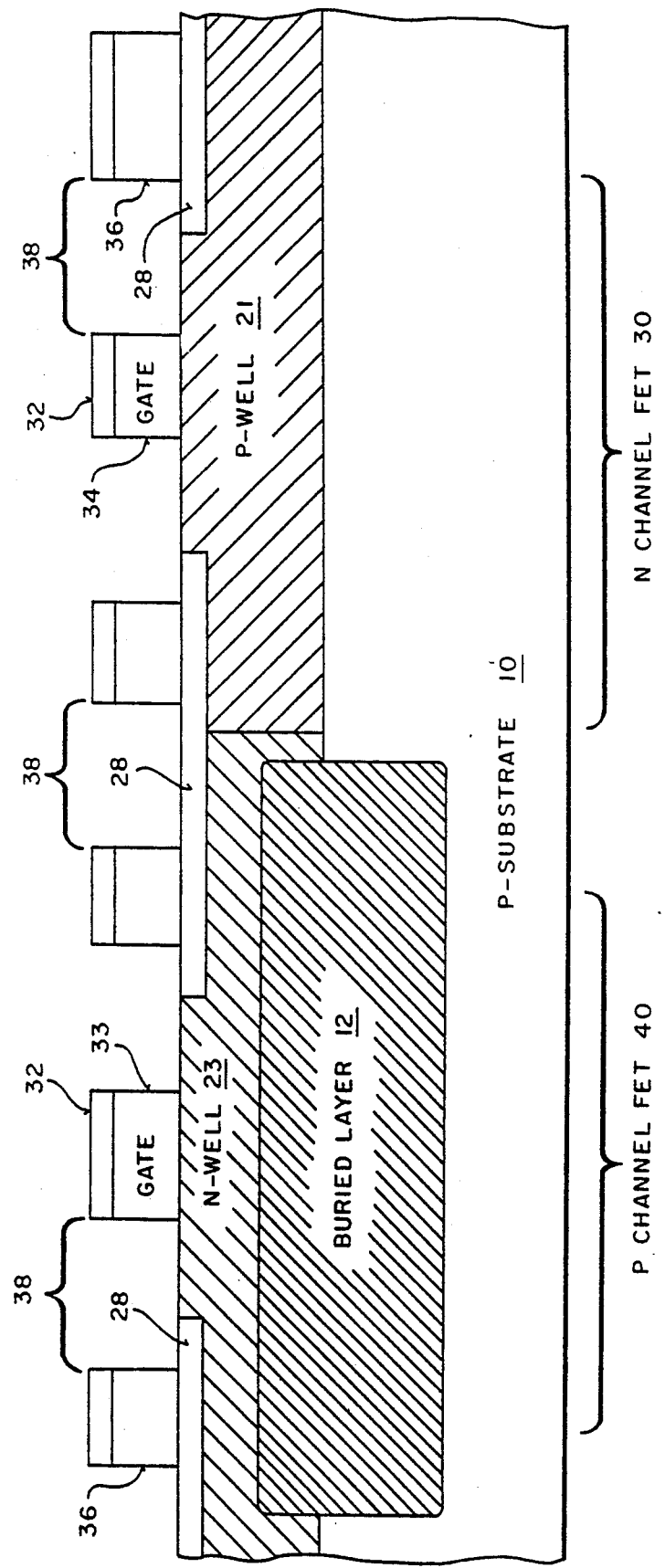

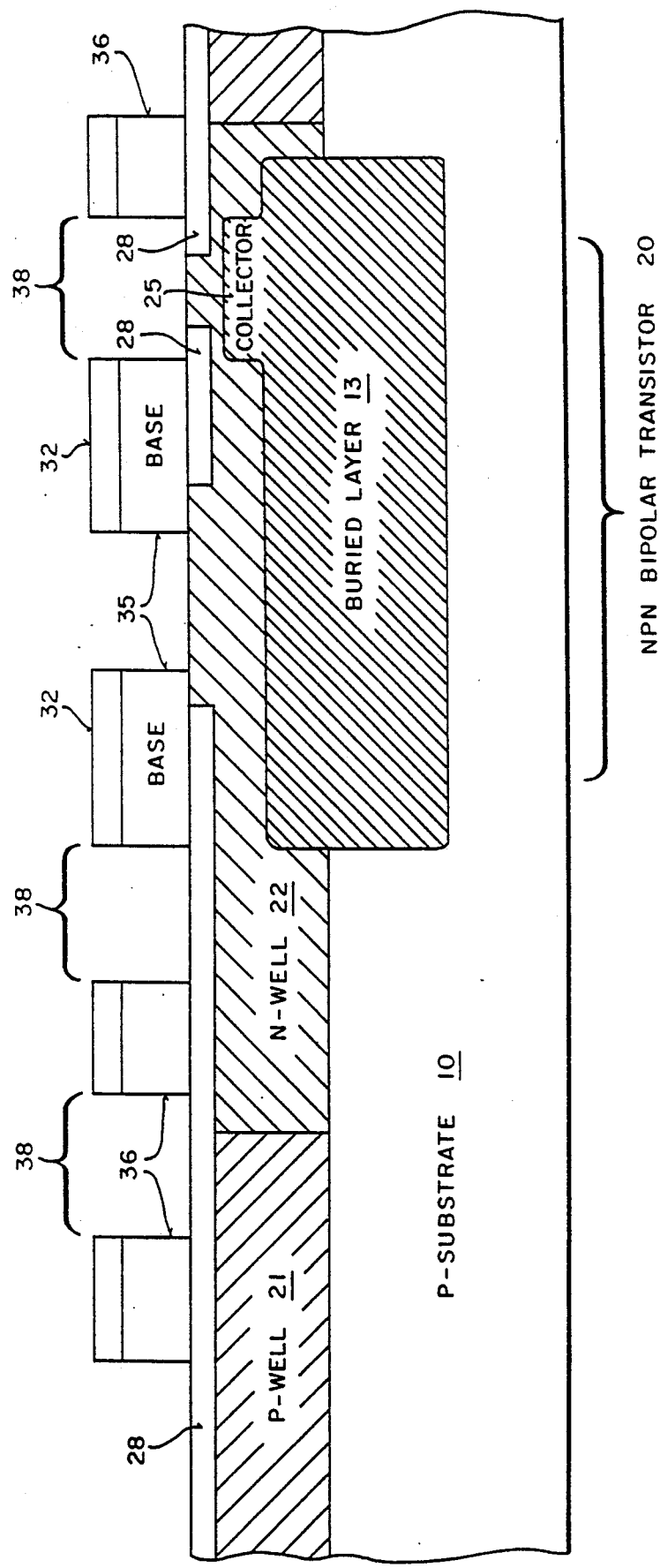
FIG—11
←FIG—8A

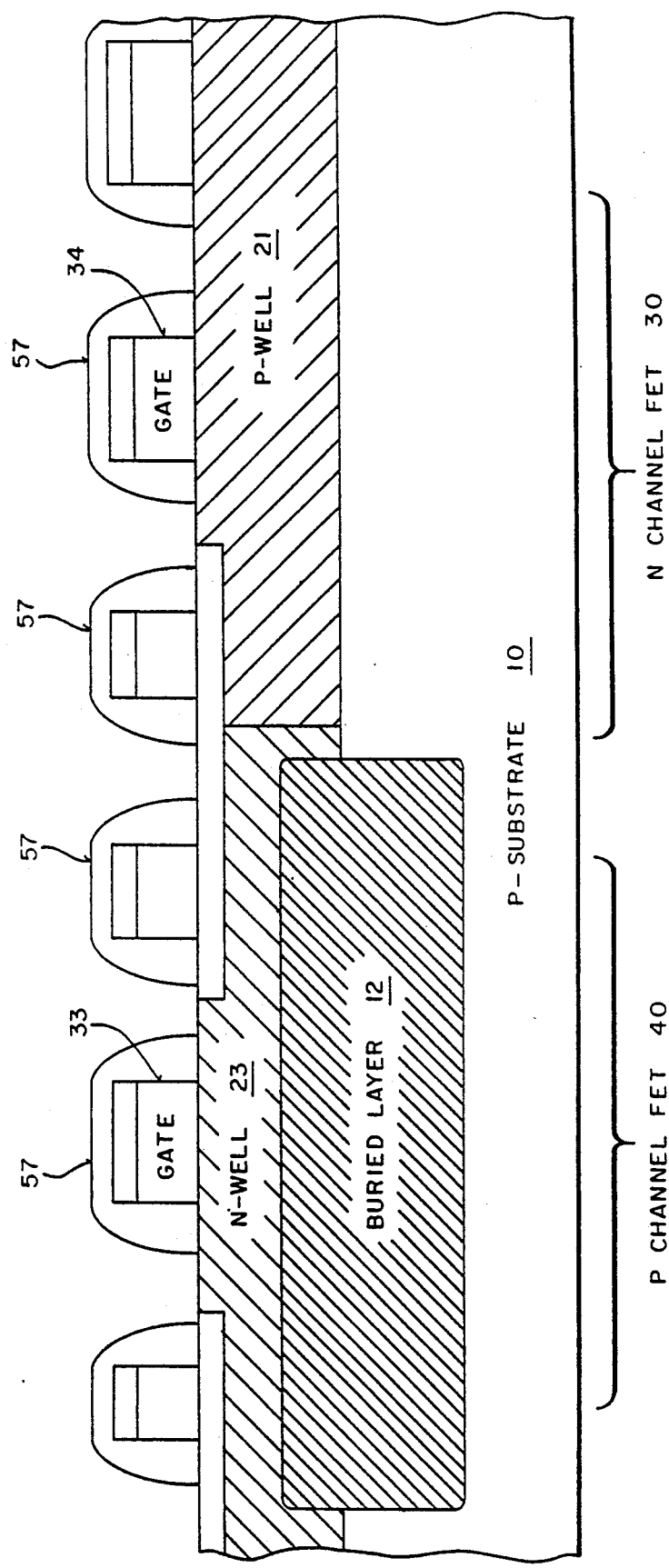

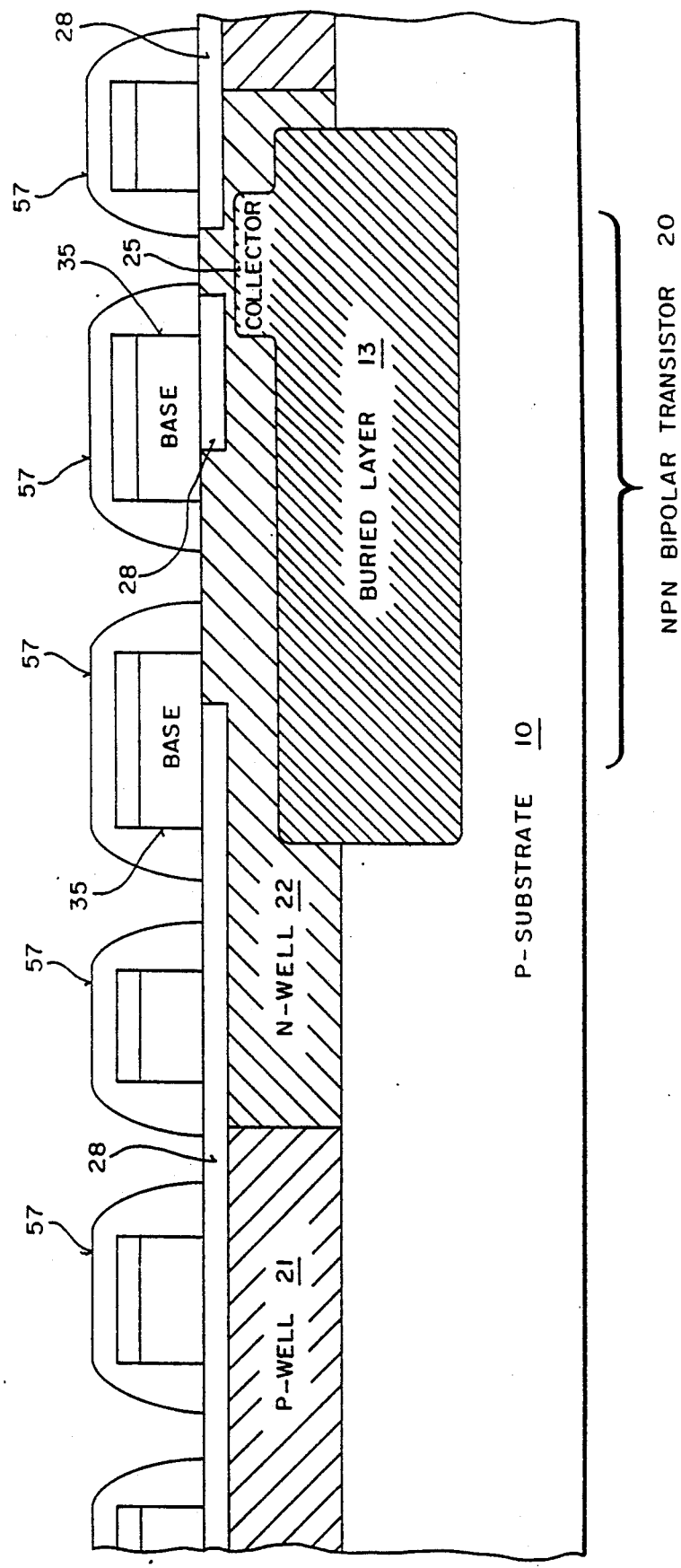

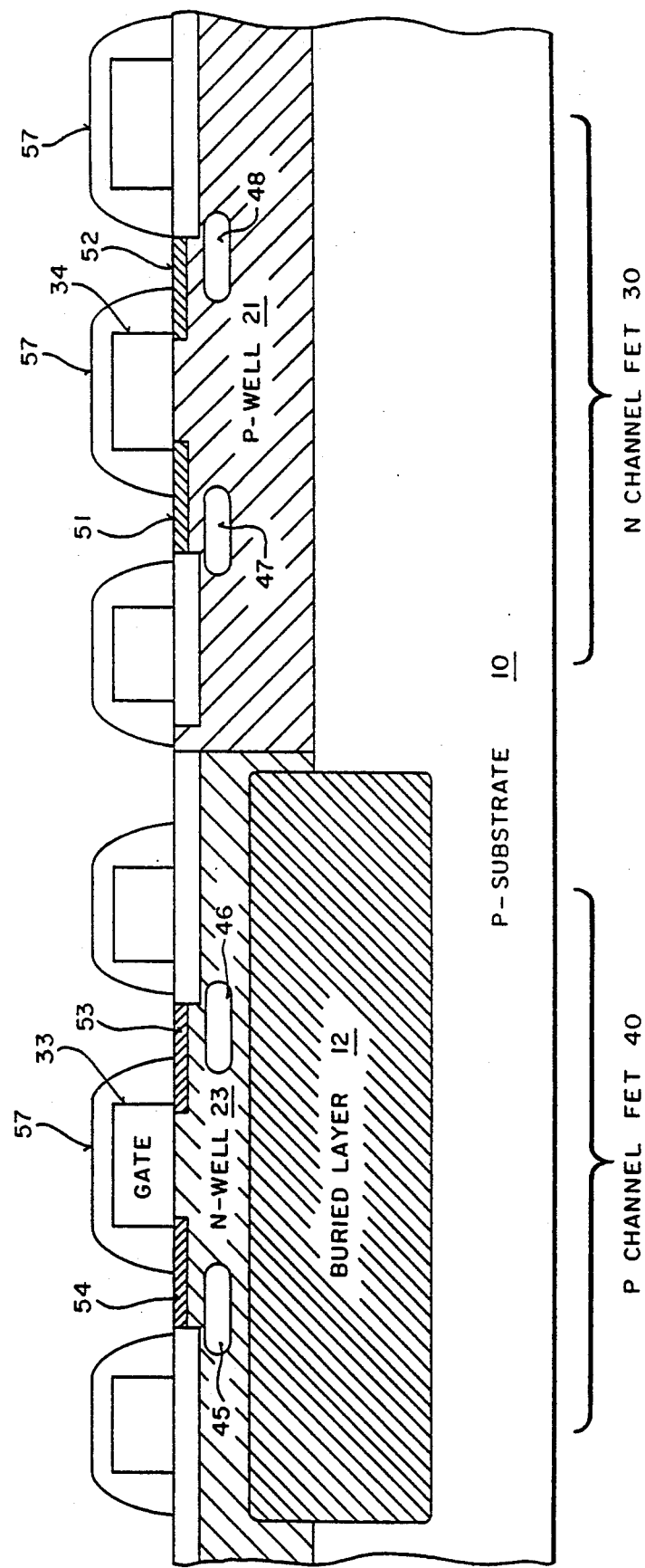

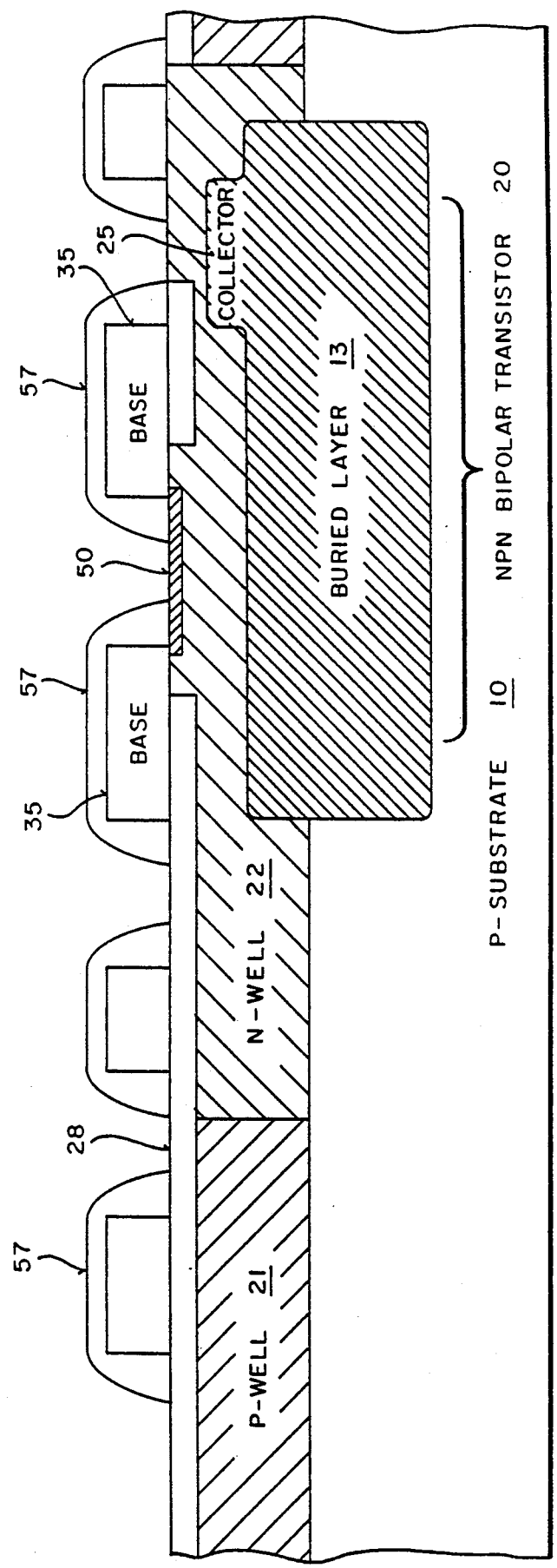

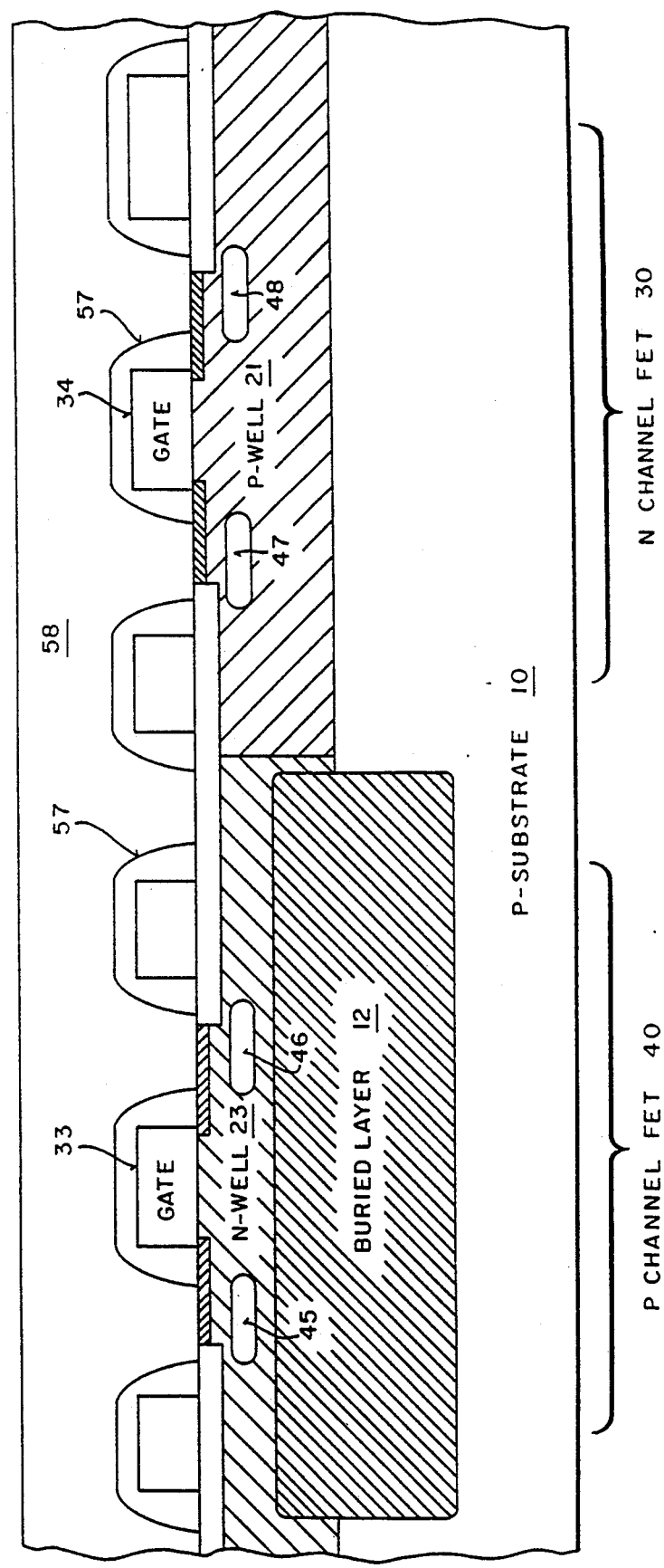

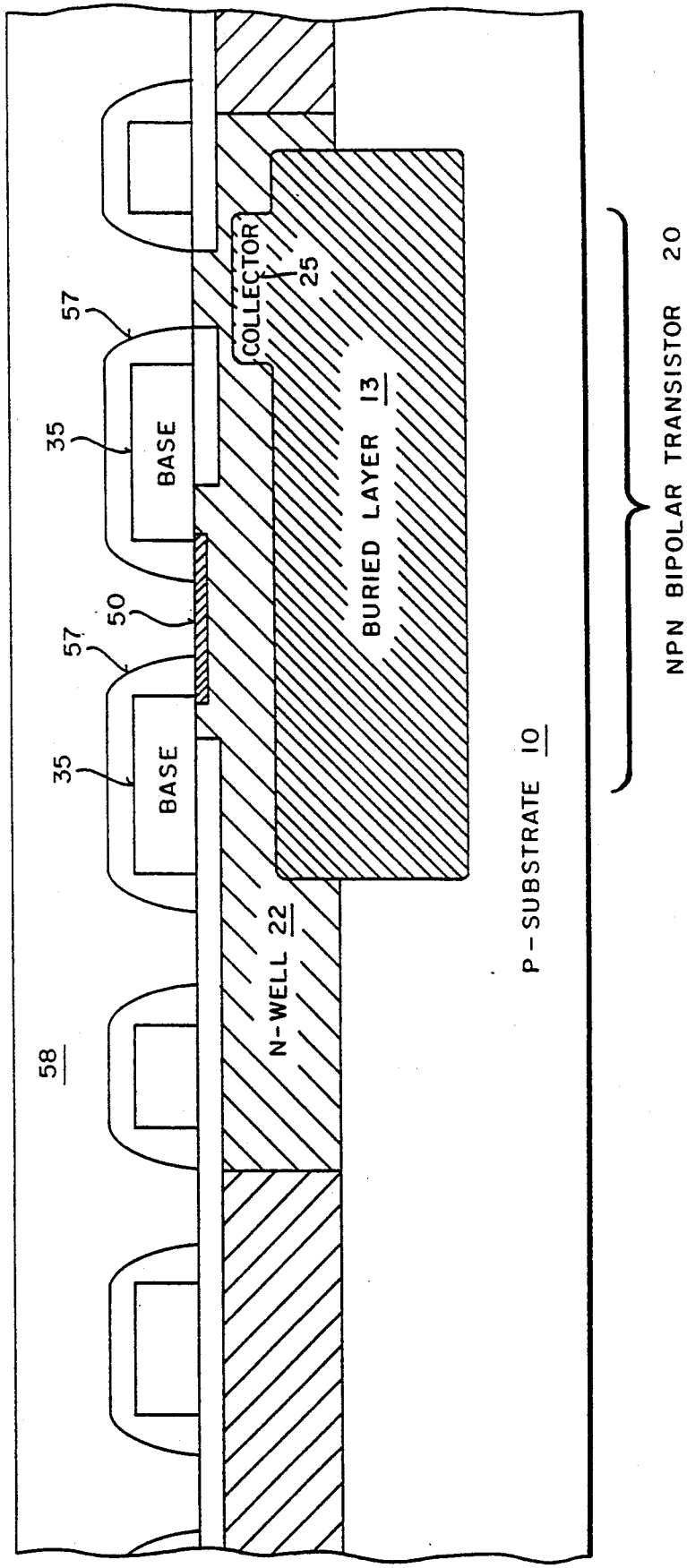
FIG_11B
← FIG_11A

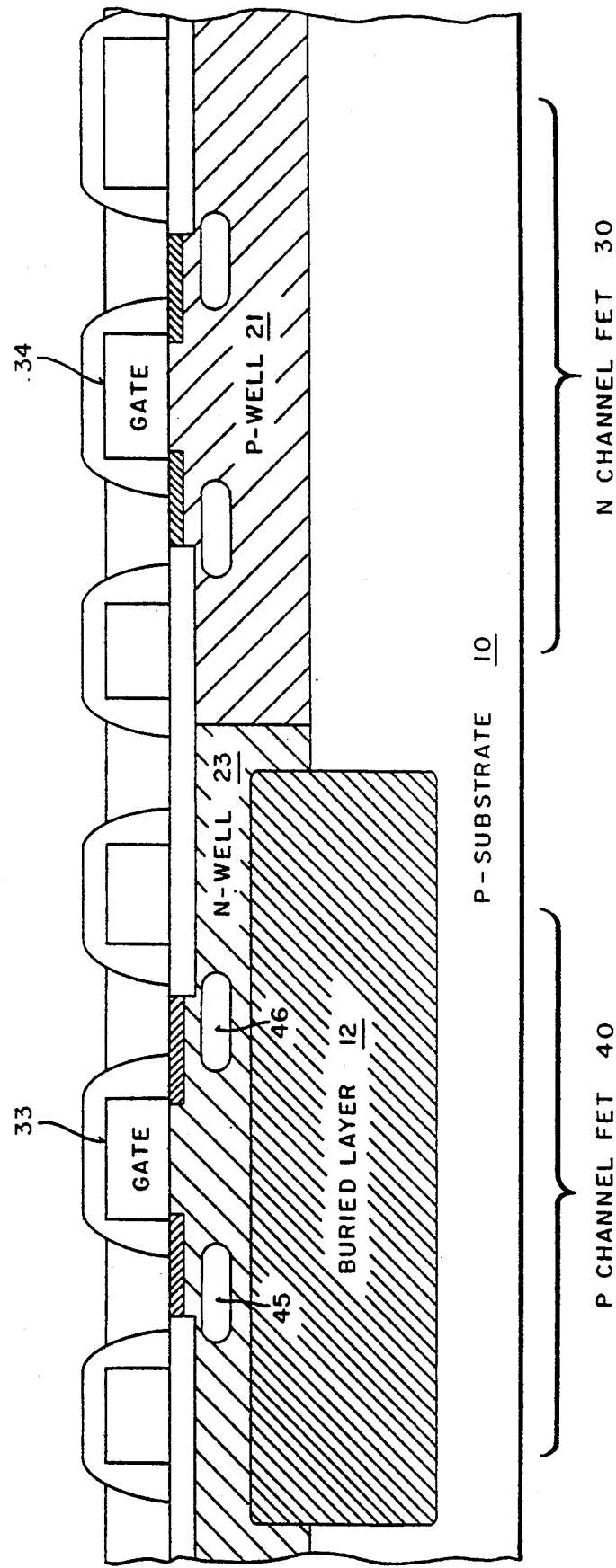

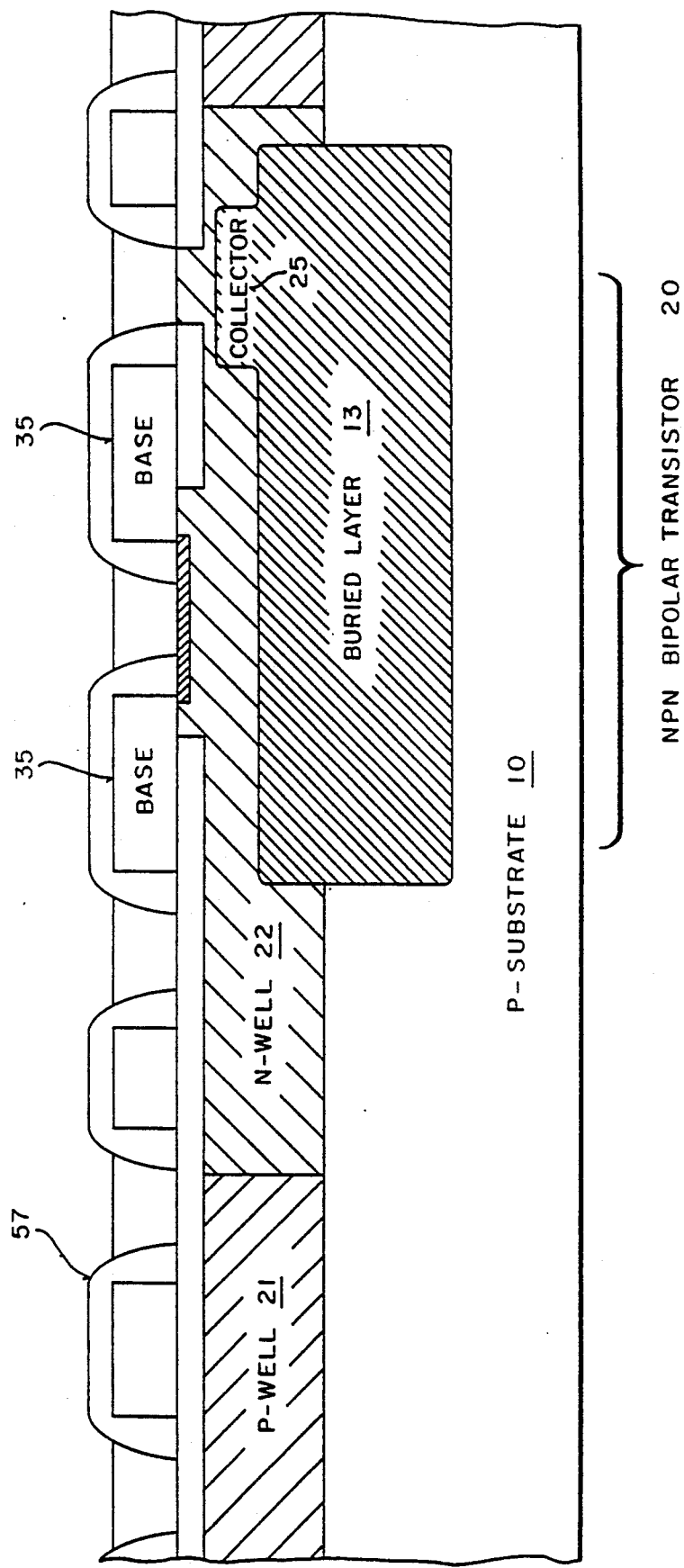
FIG_12K

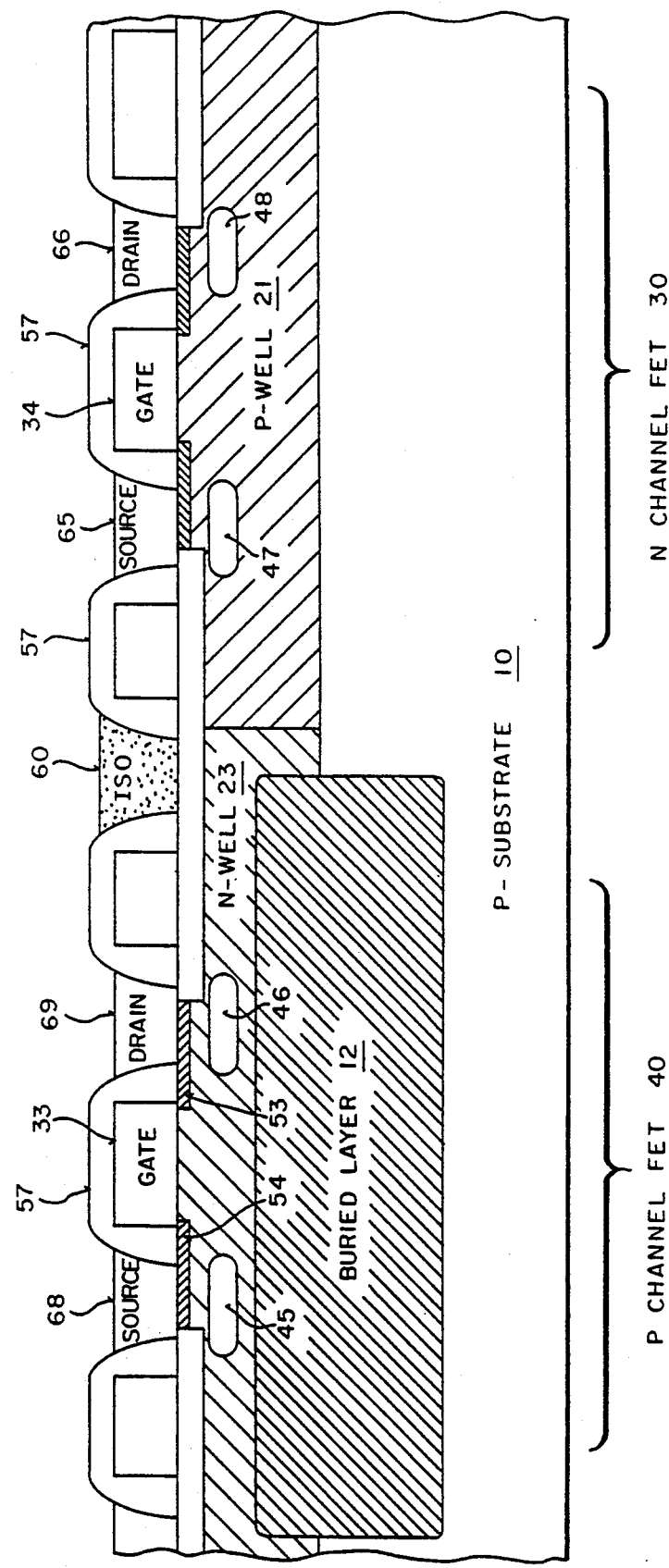
FIG_13B

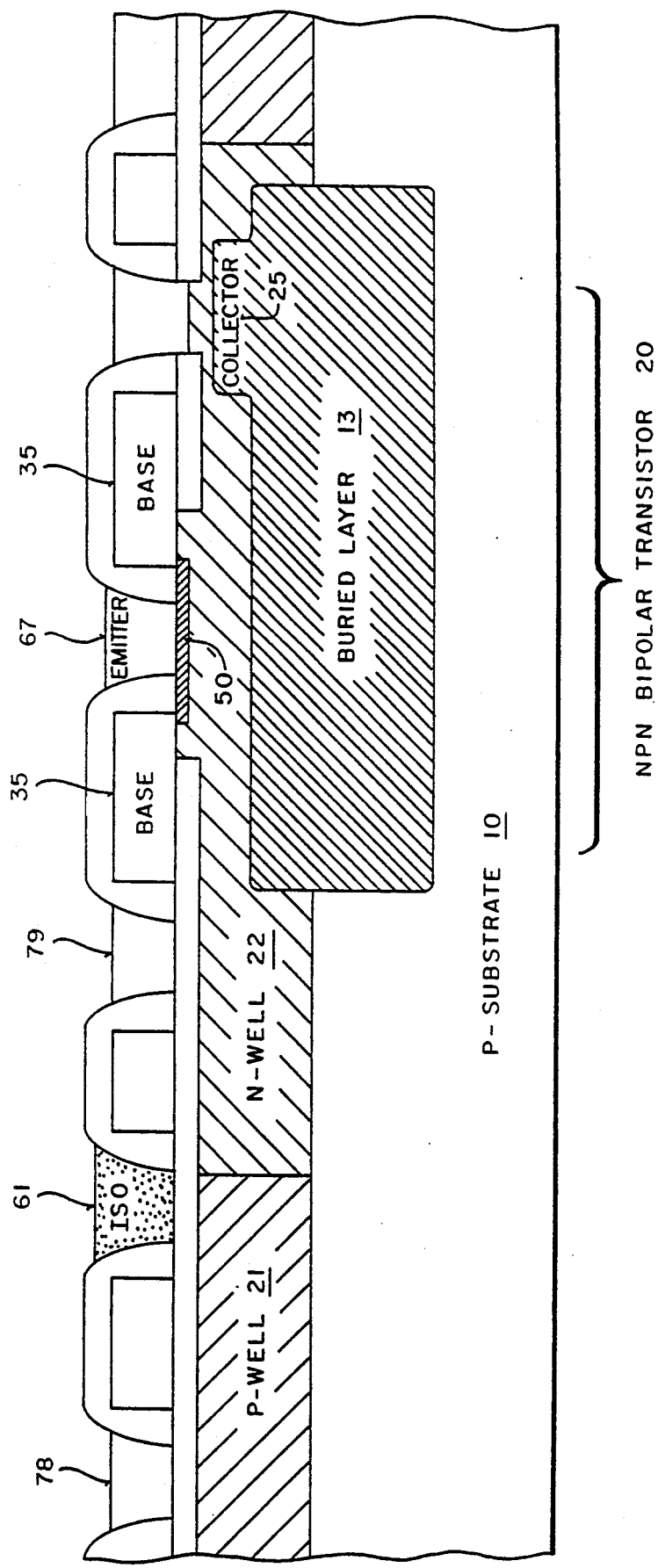

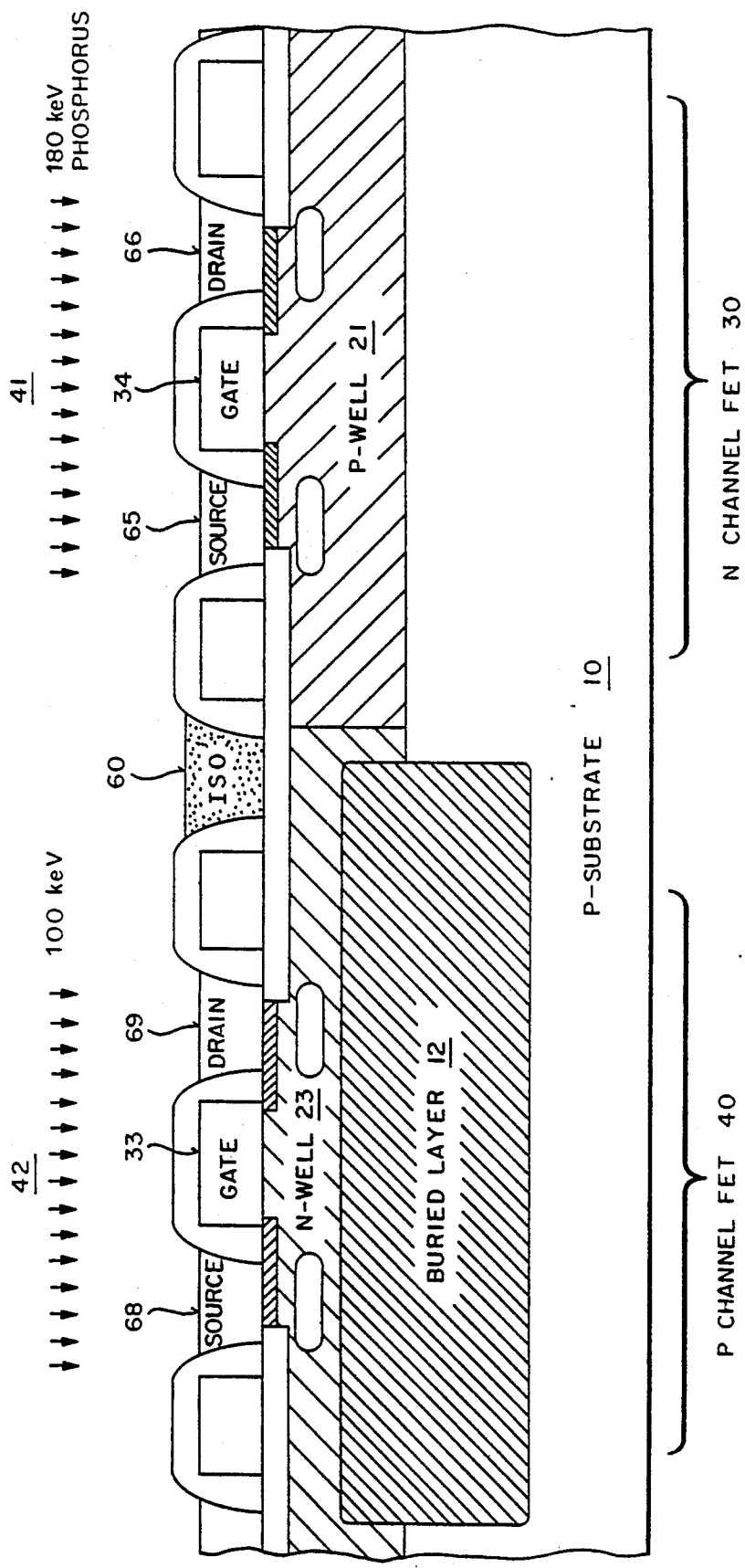

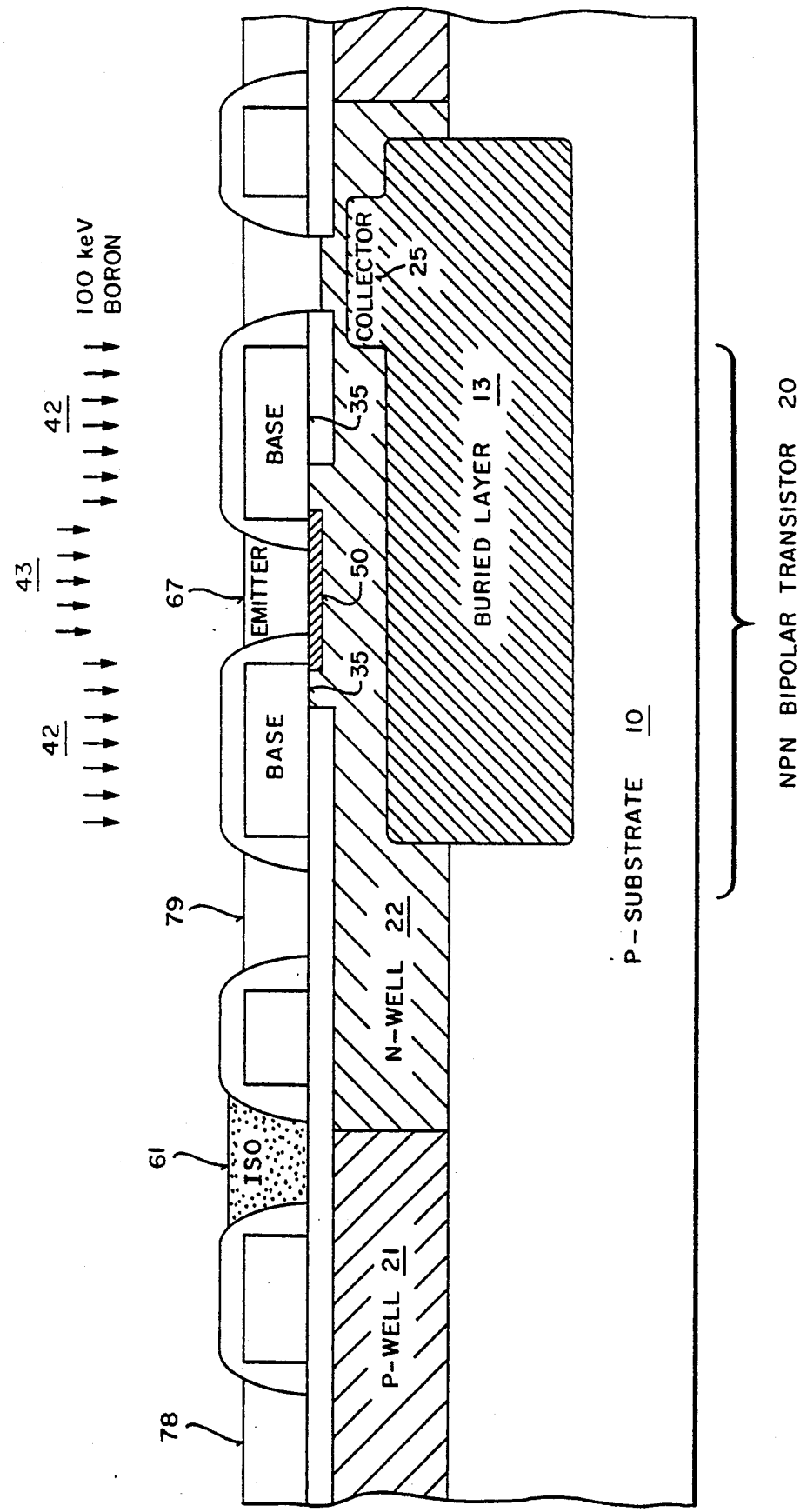
FIG_14B

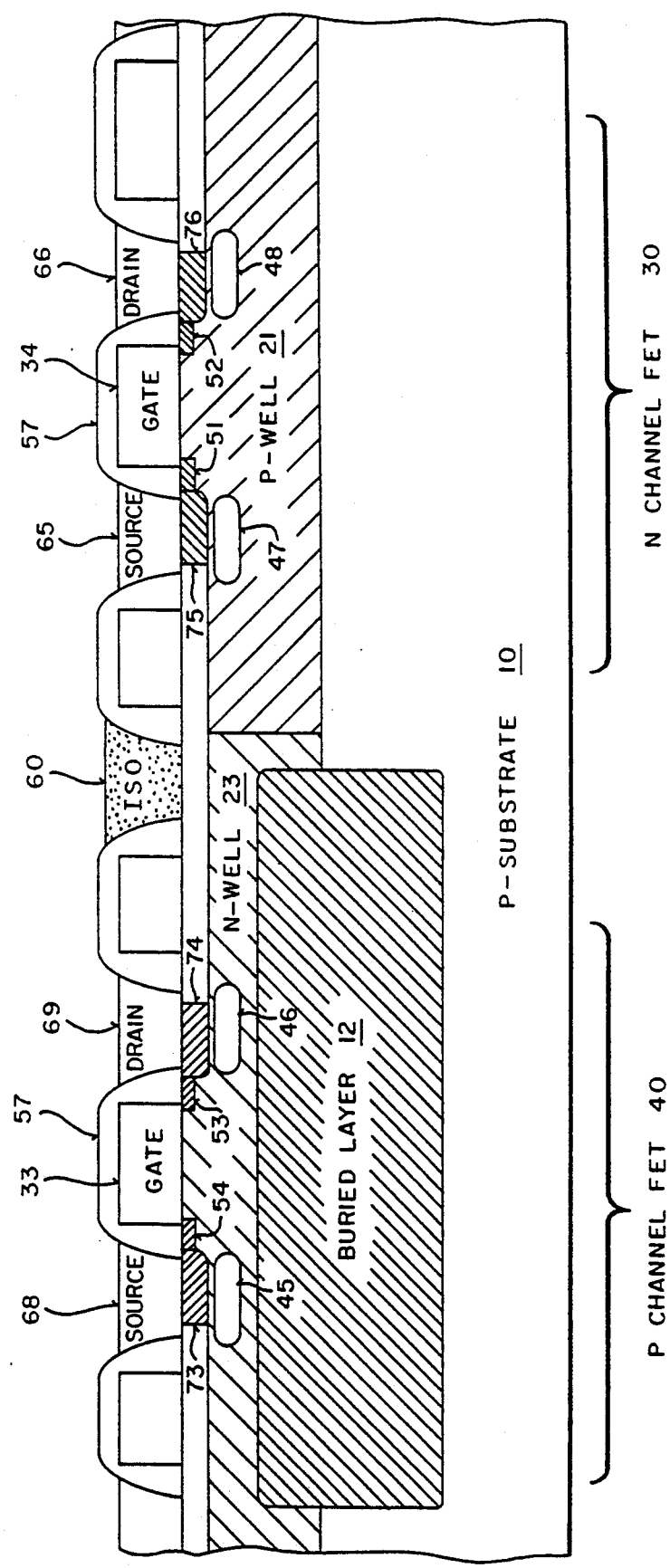

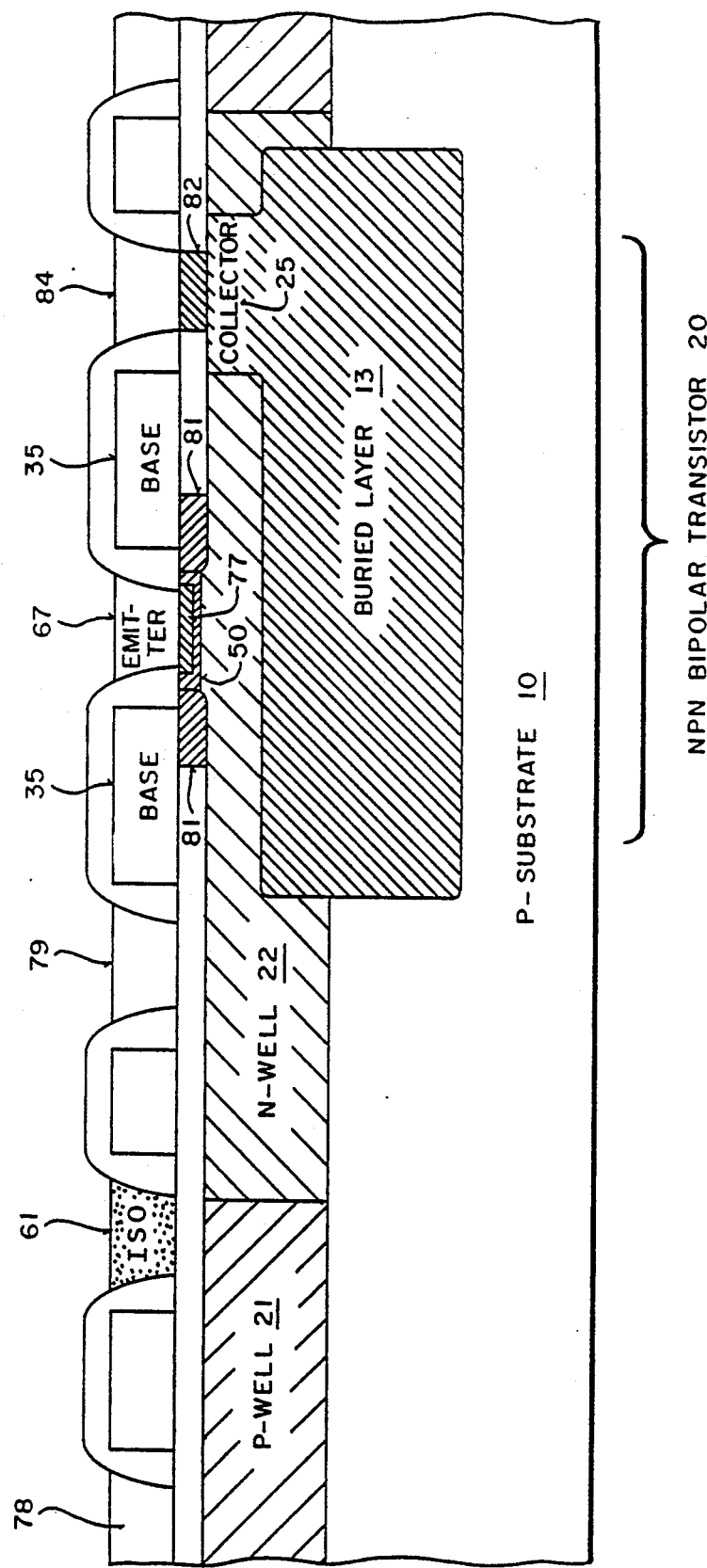
FIG_15B
FIG_15A

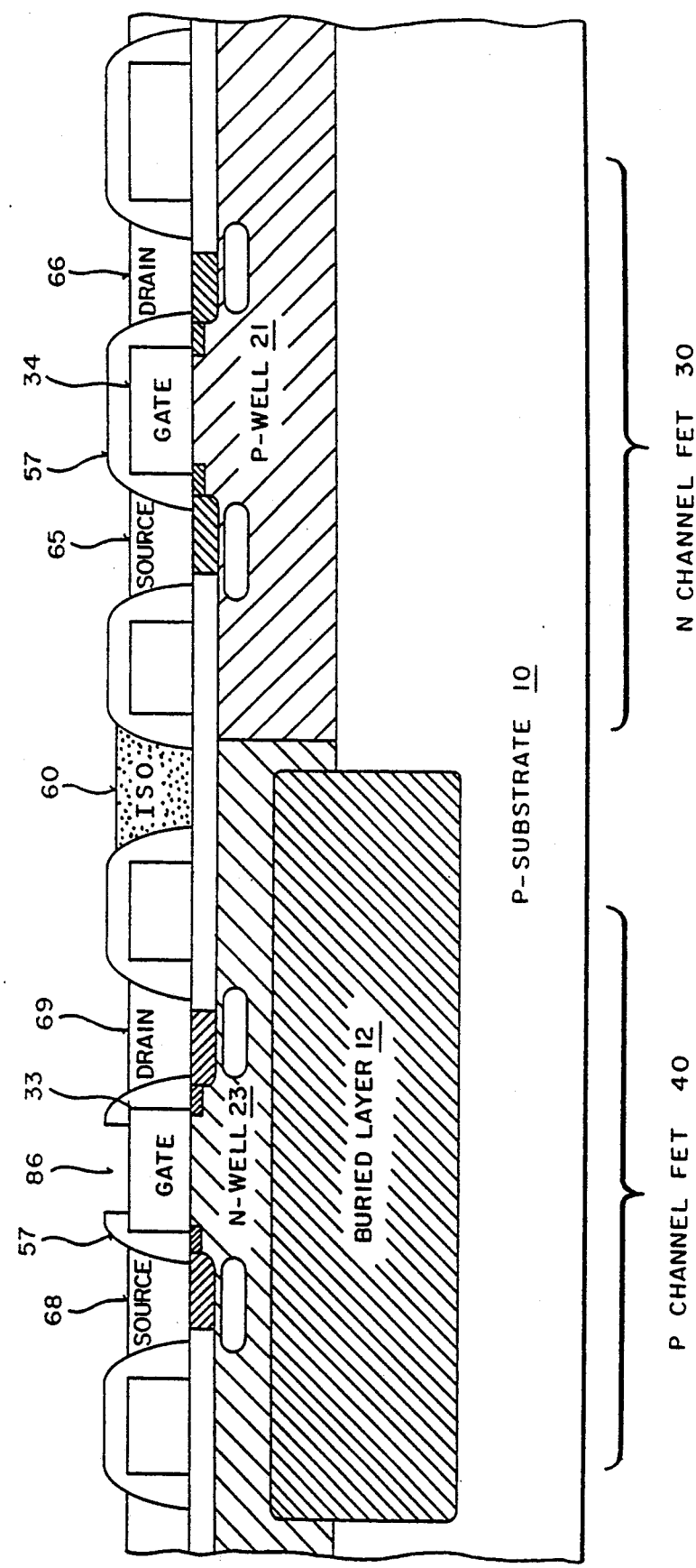

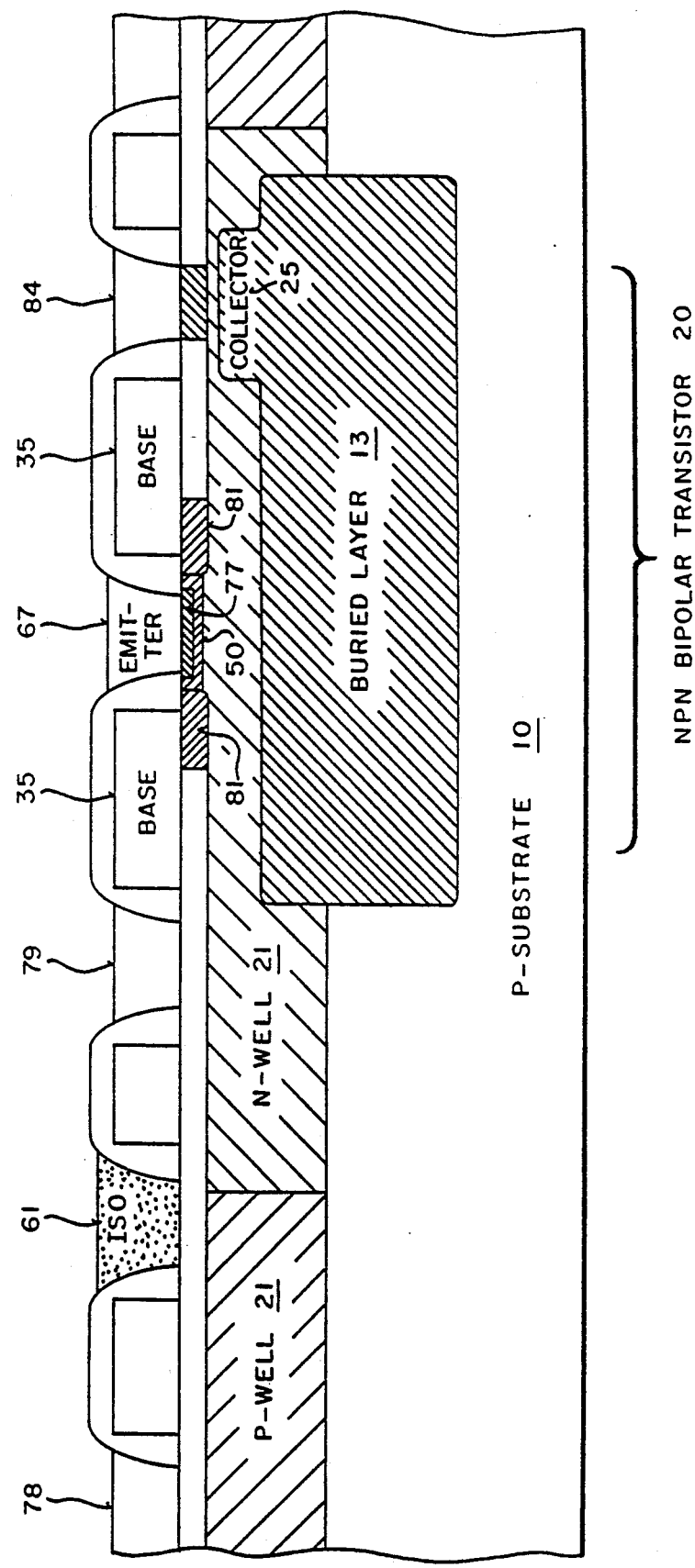

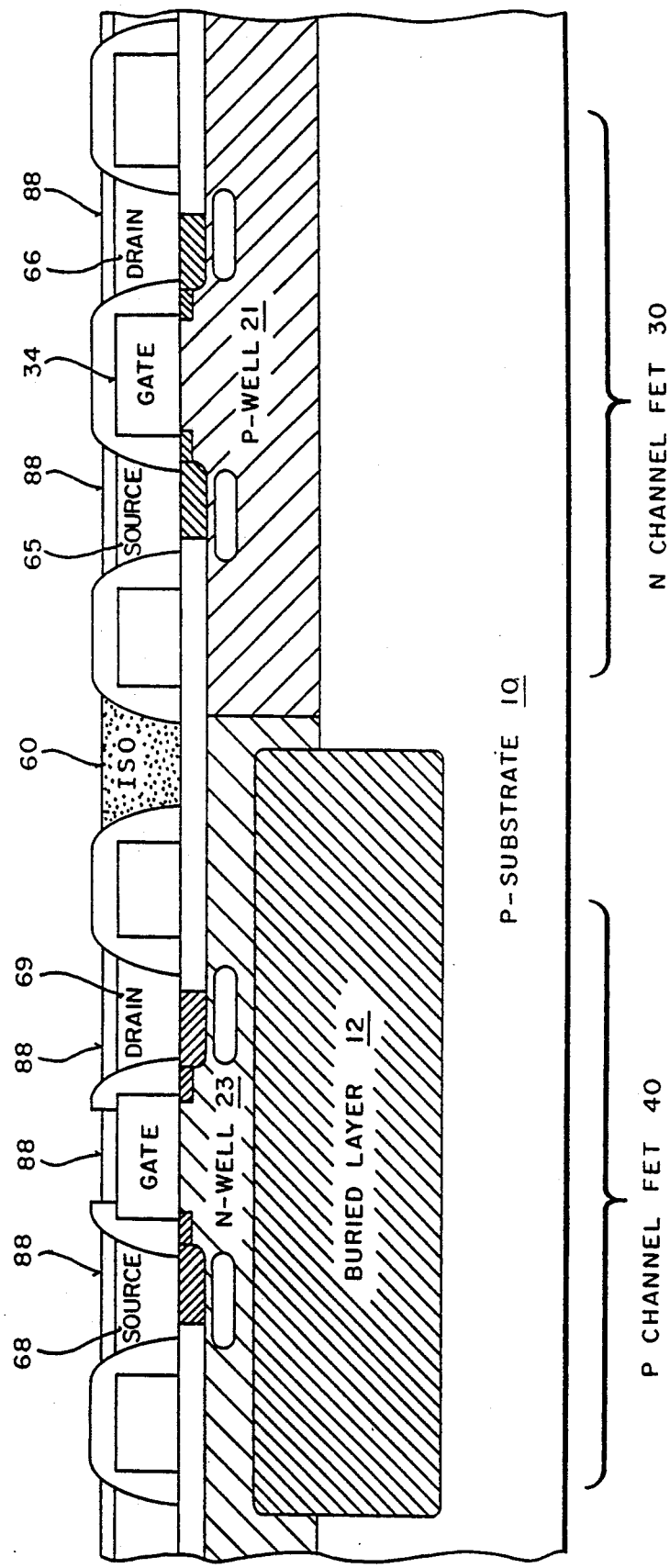

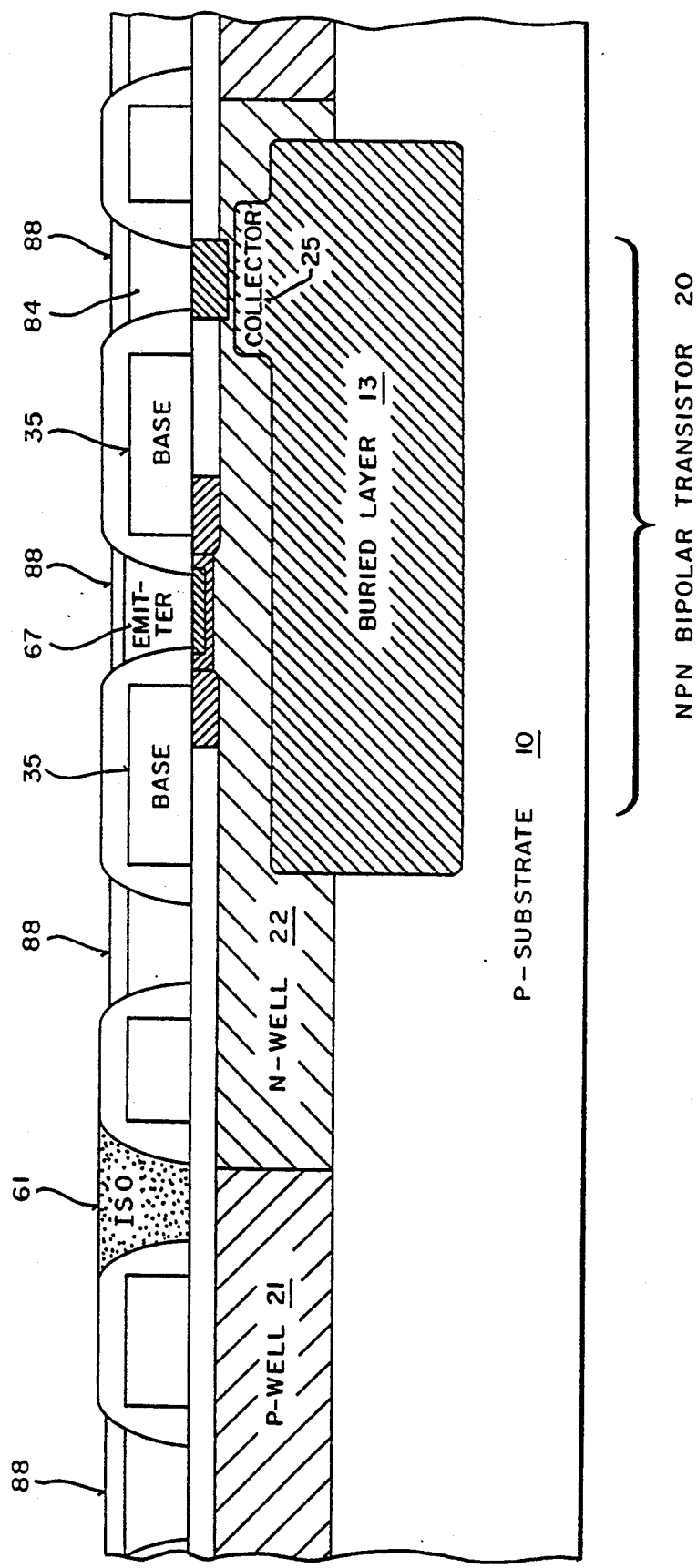

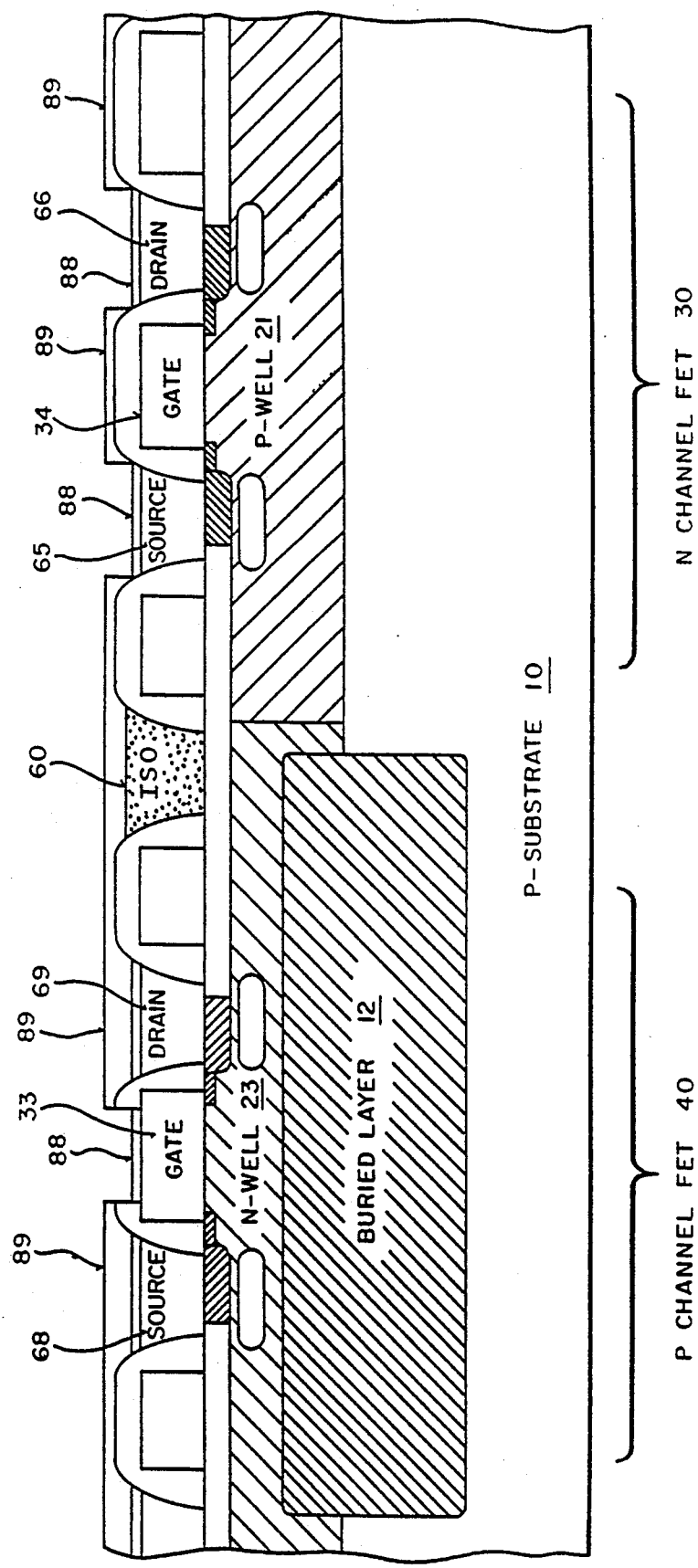

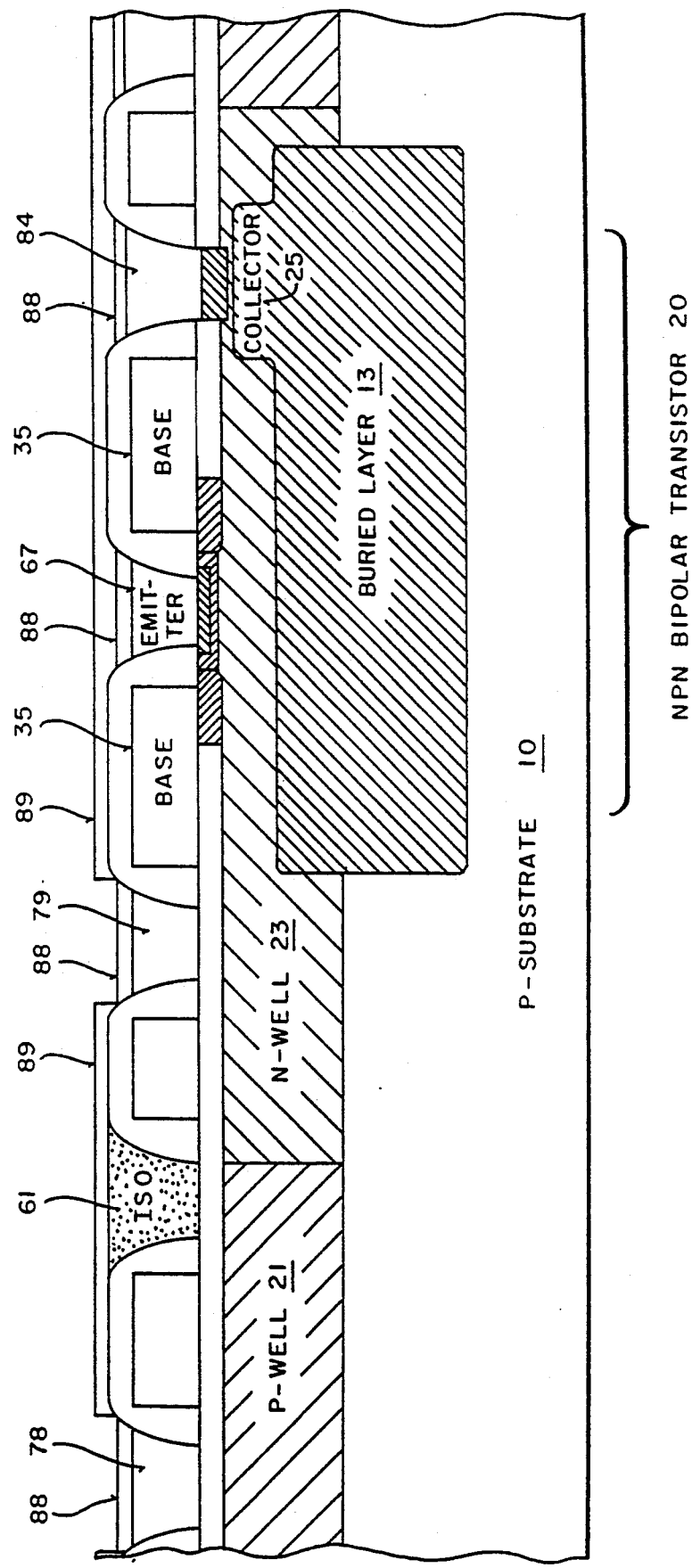

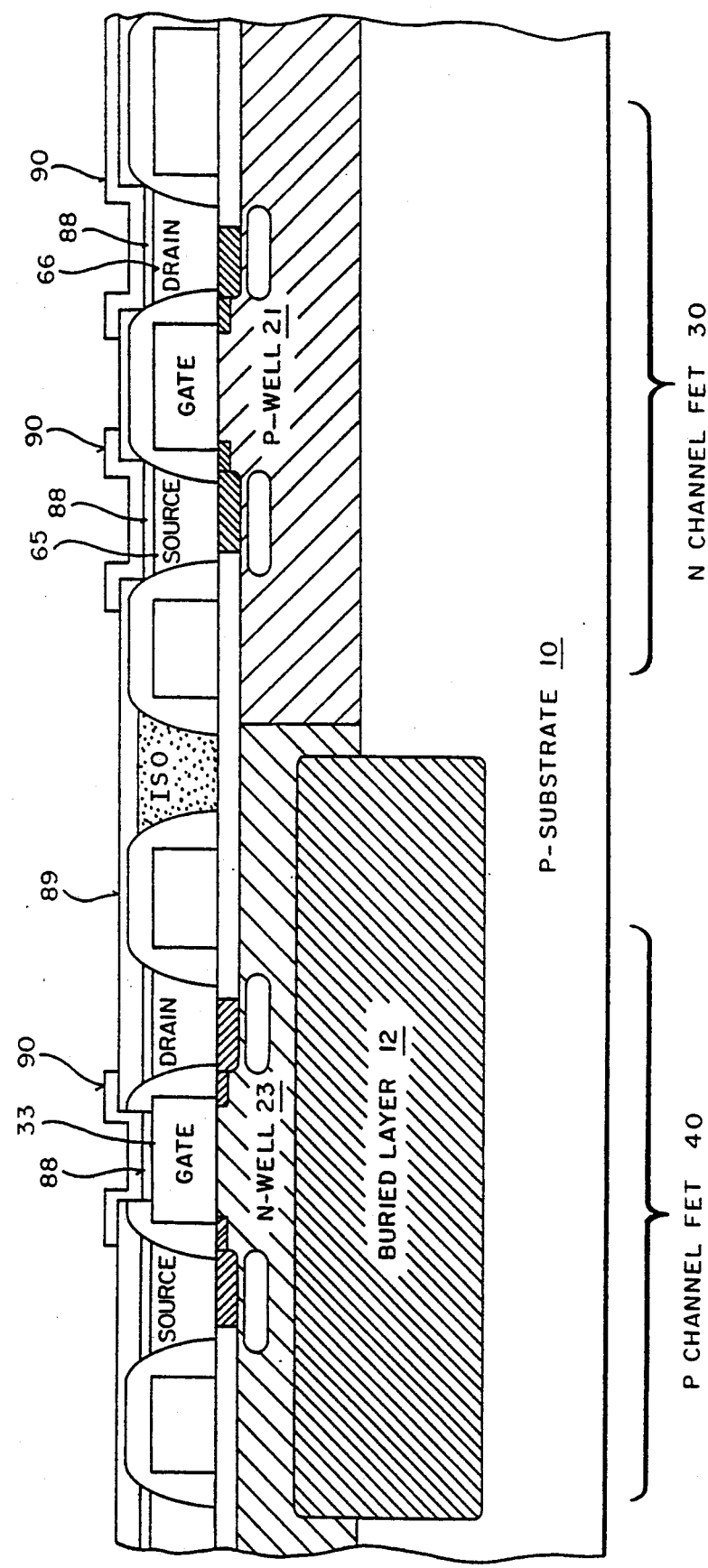

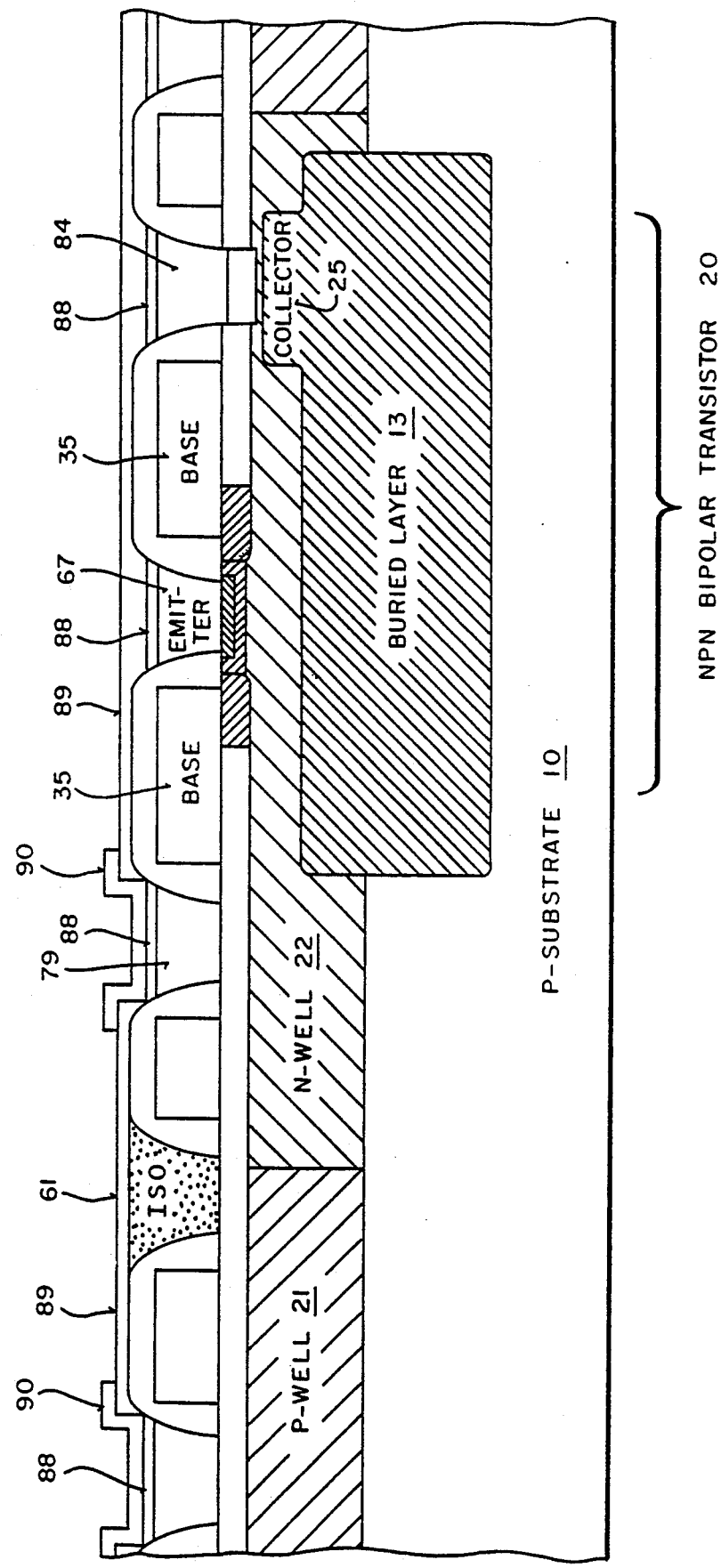

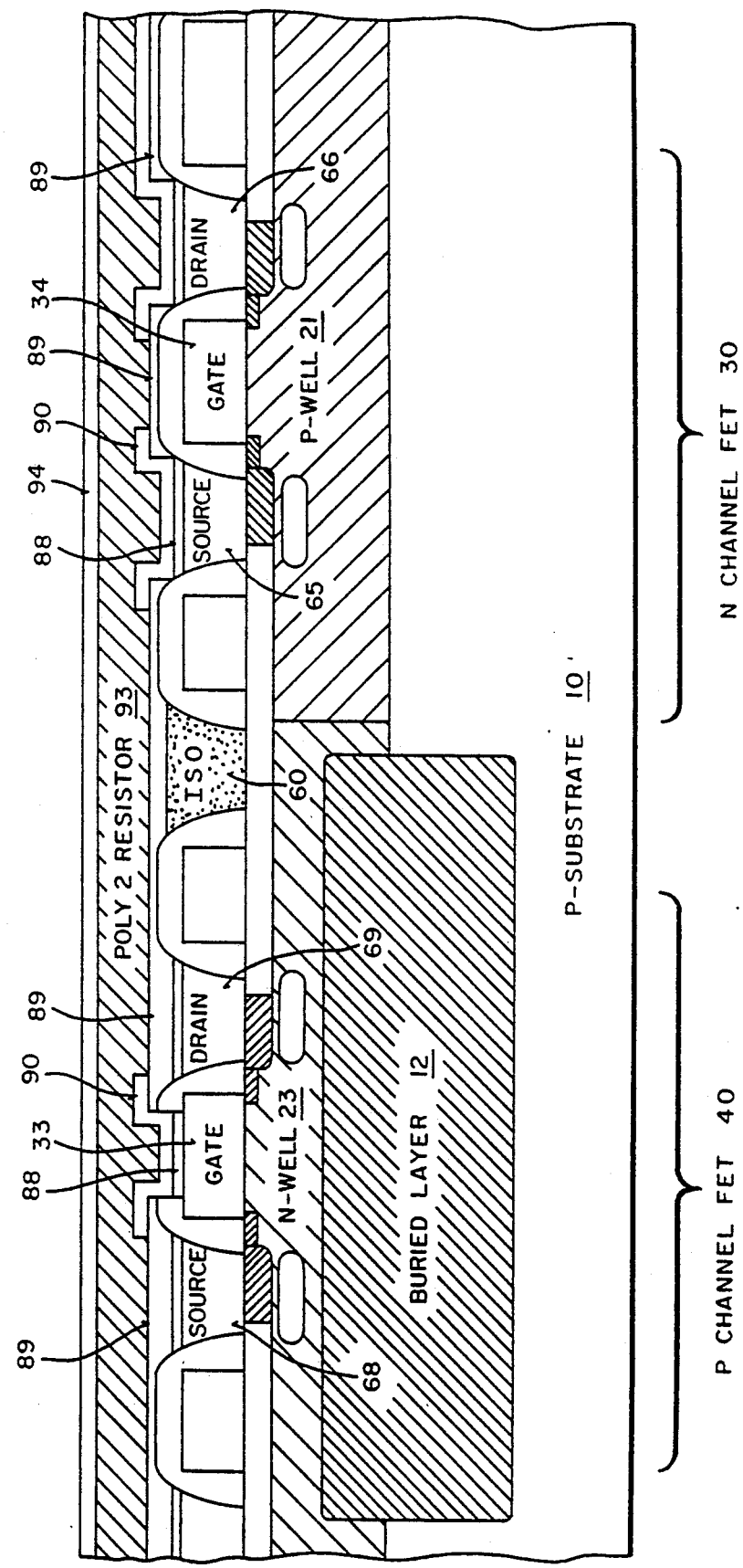

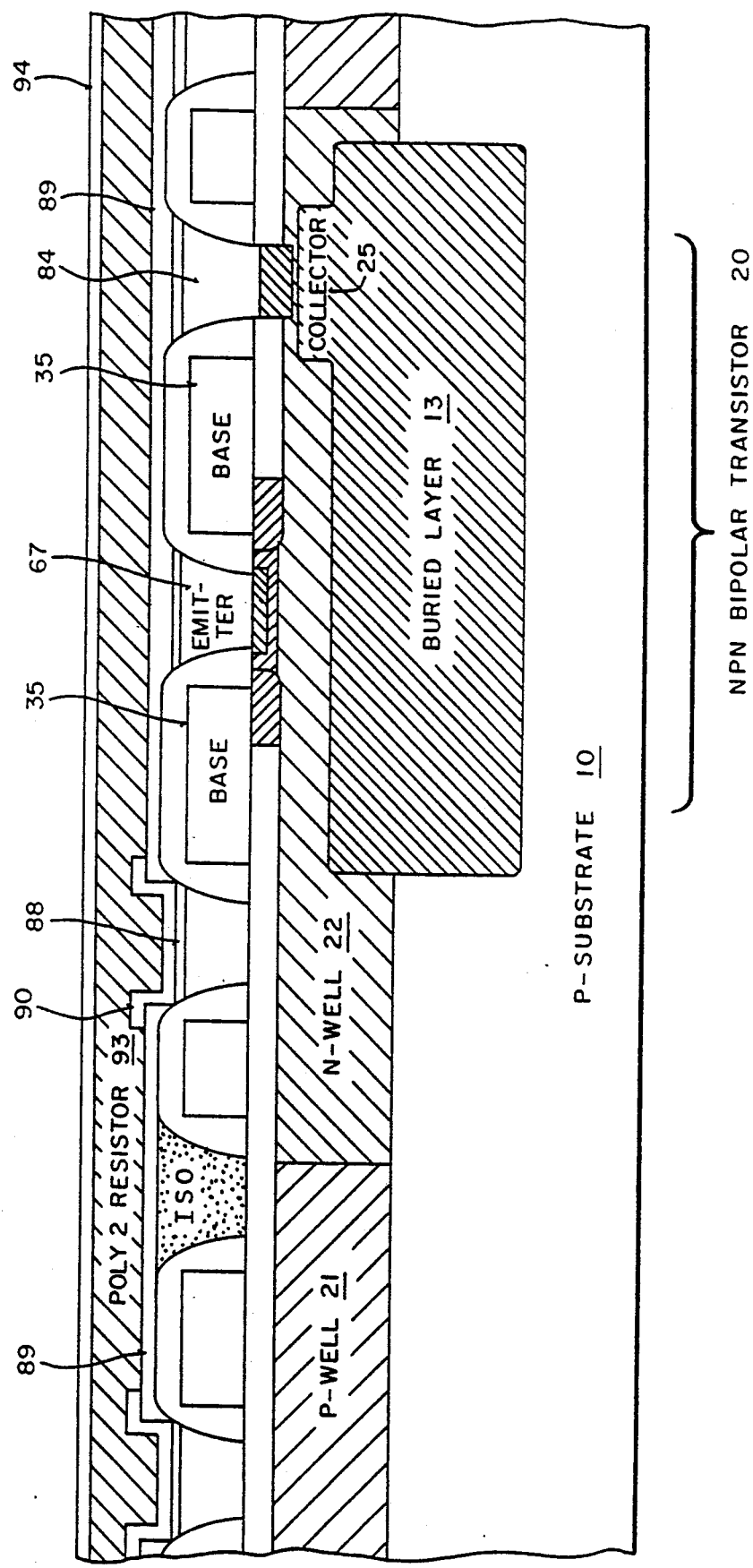
FIG_20B
→ FIG_20A

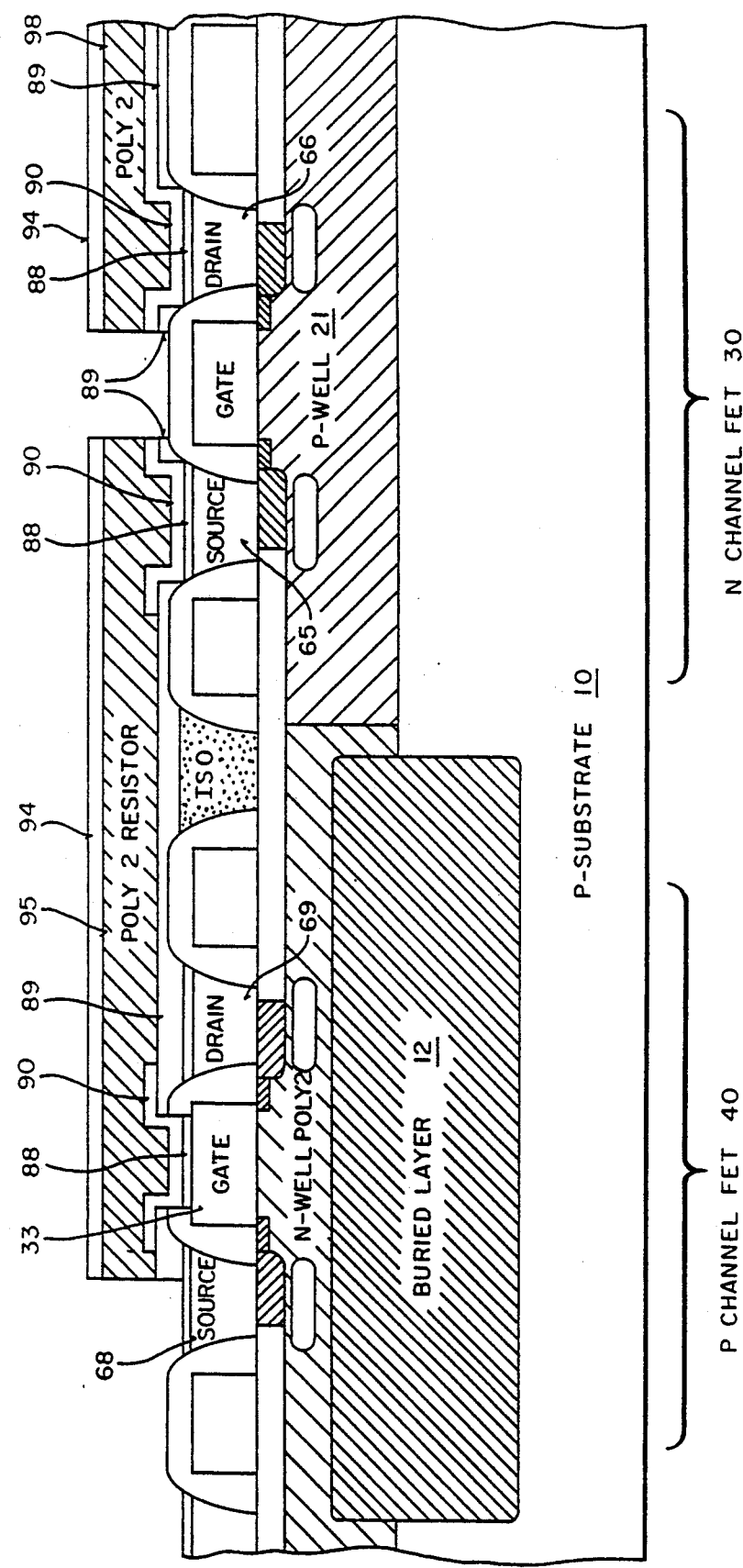

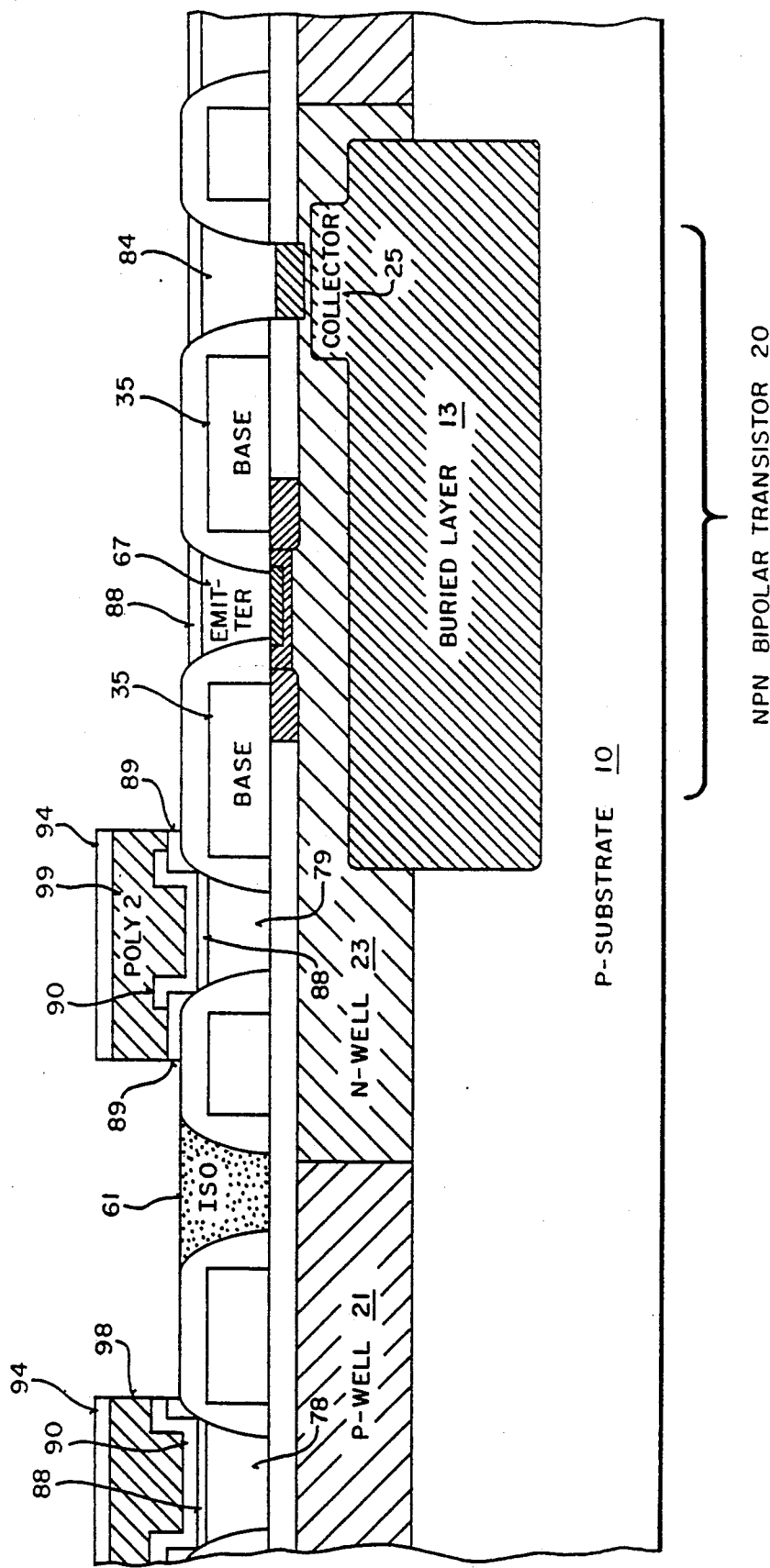

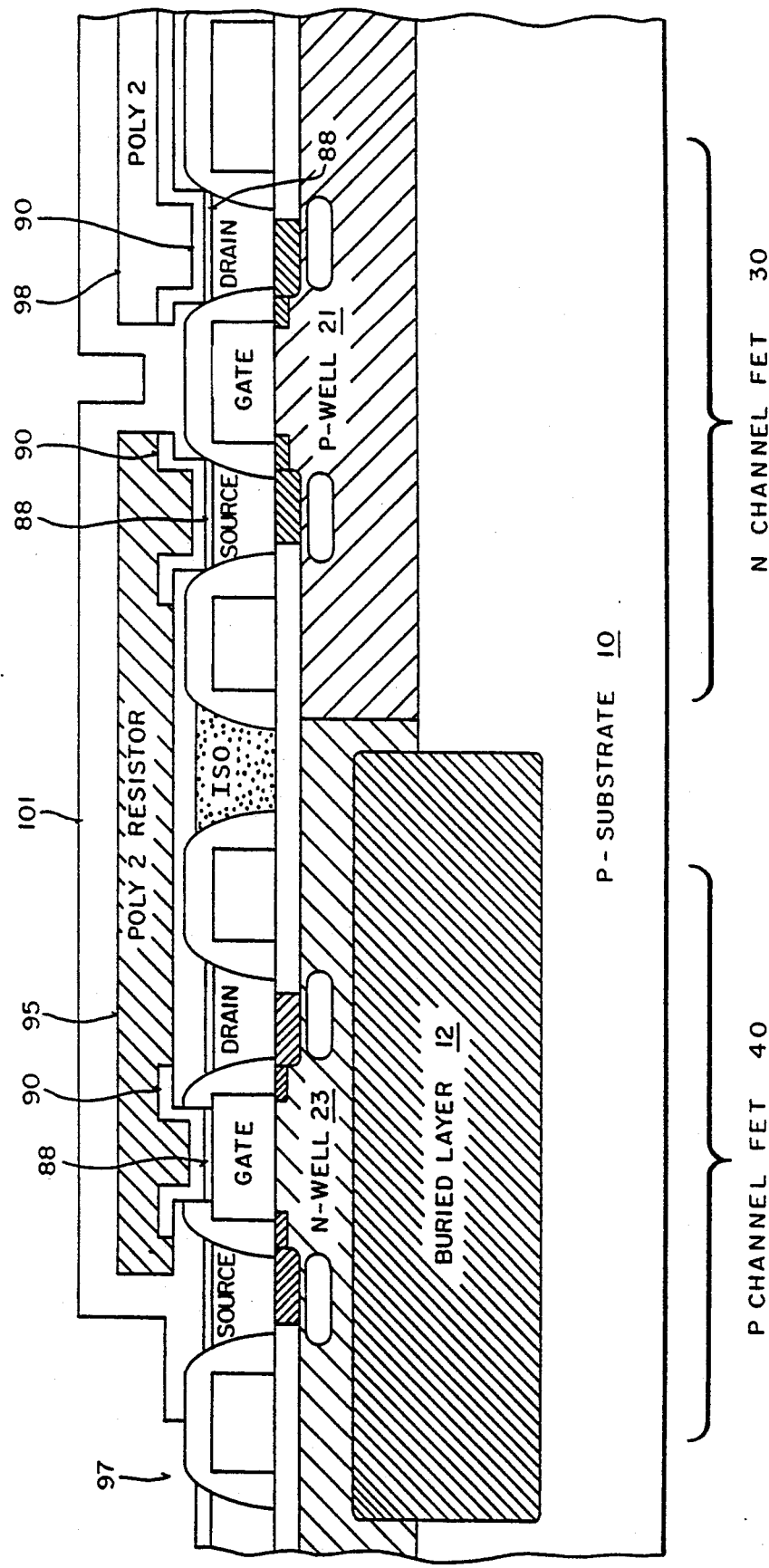

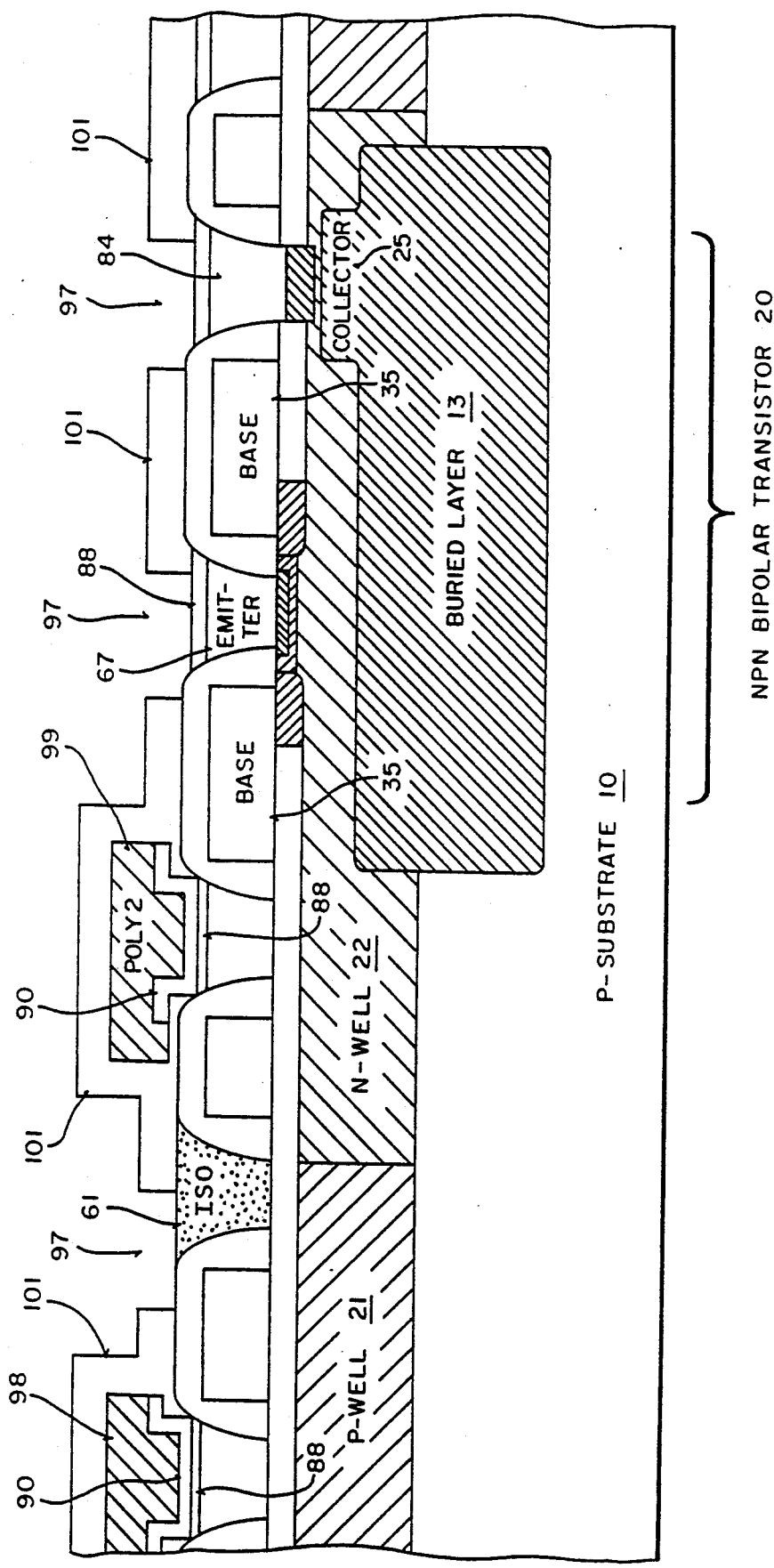
FIG_22B
← FIG_22A

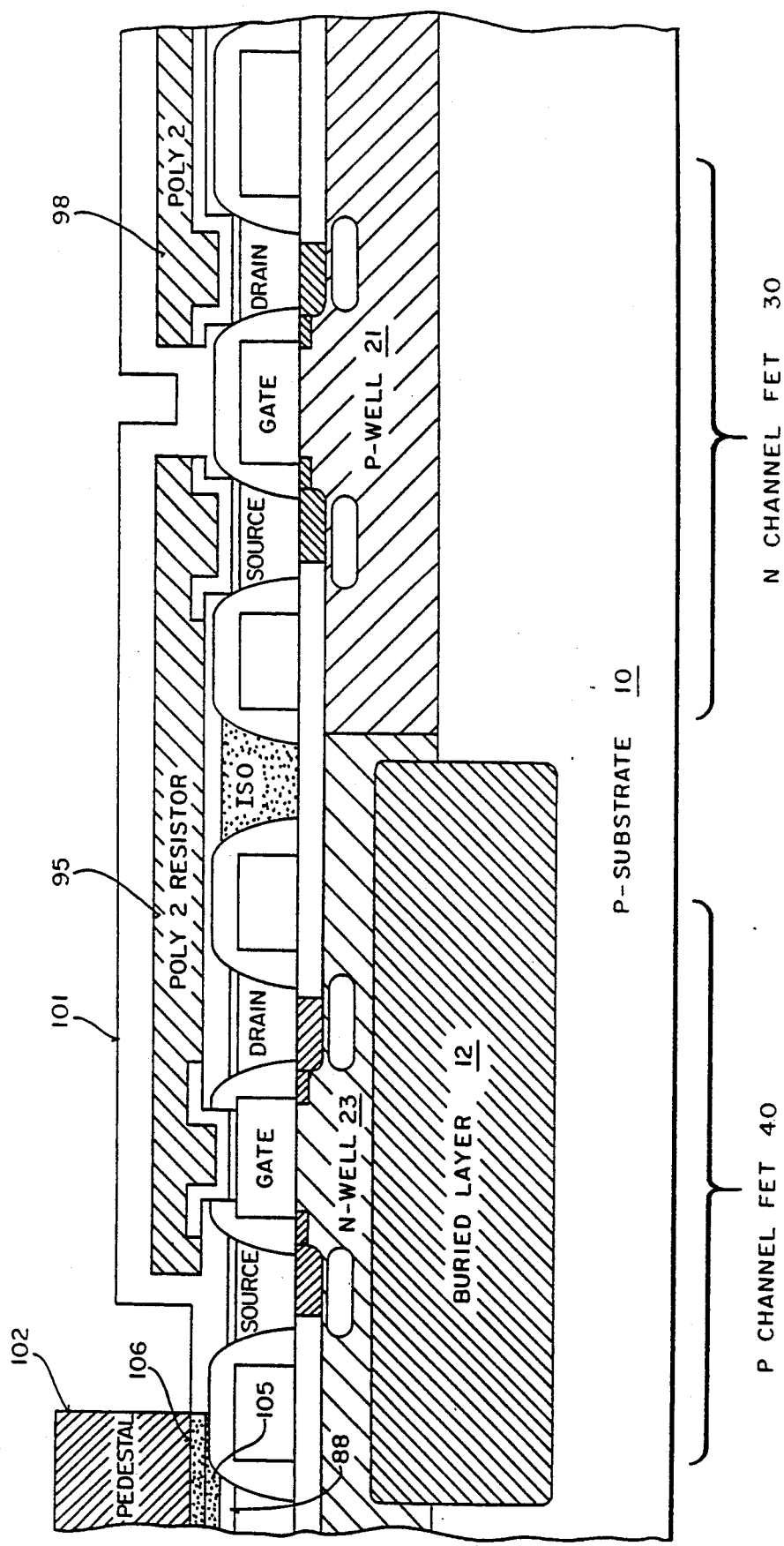

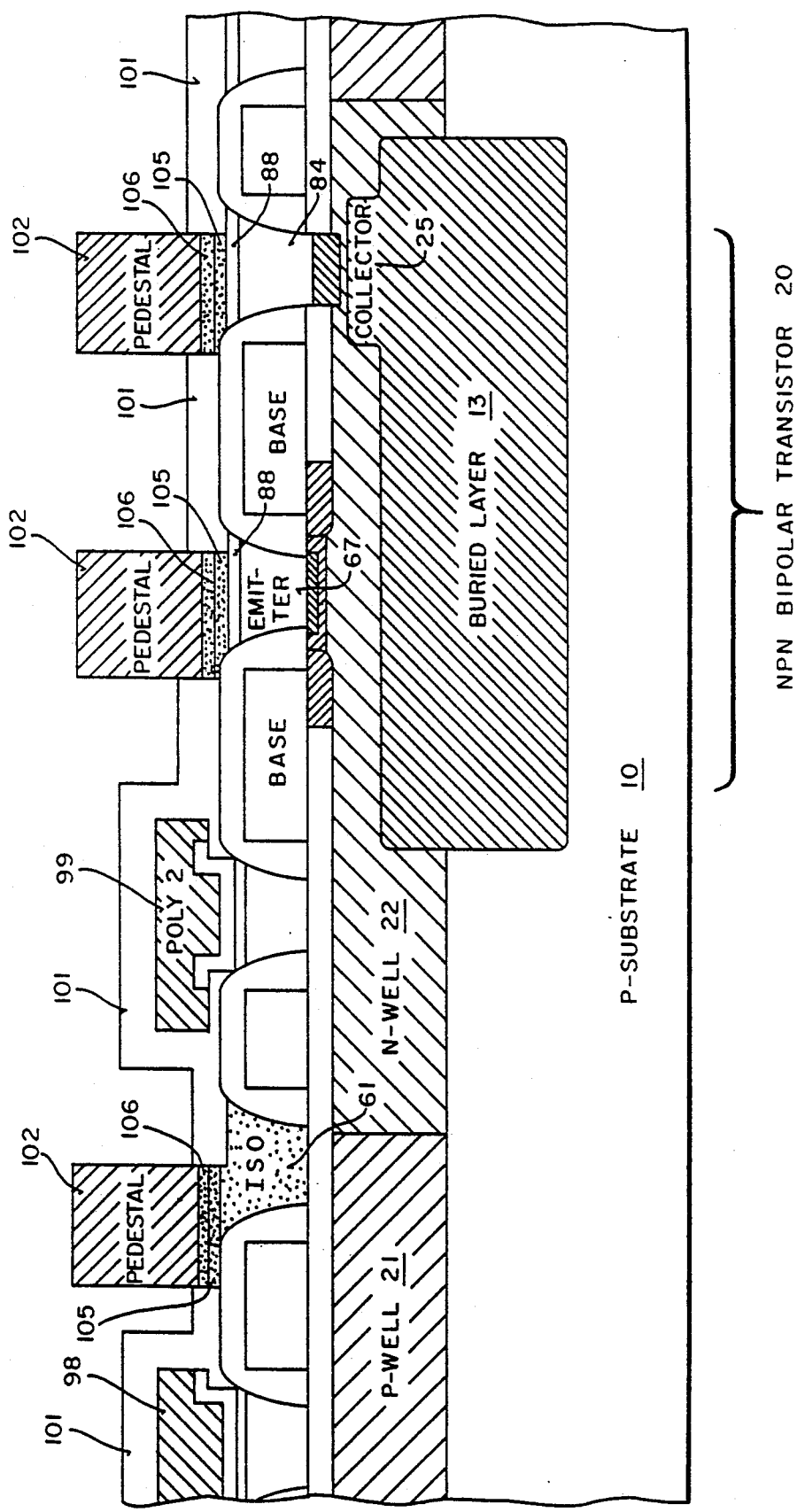

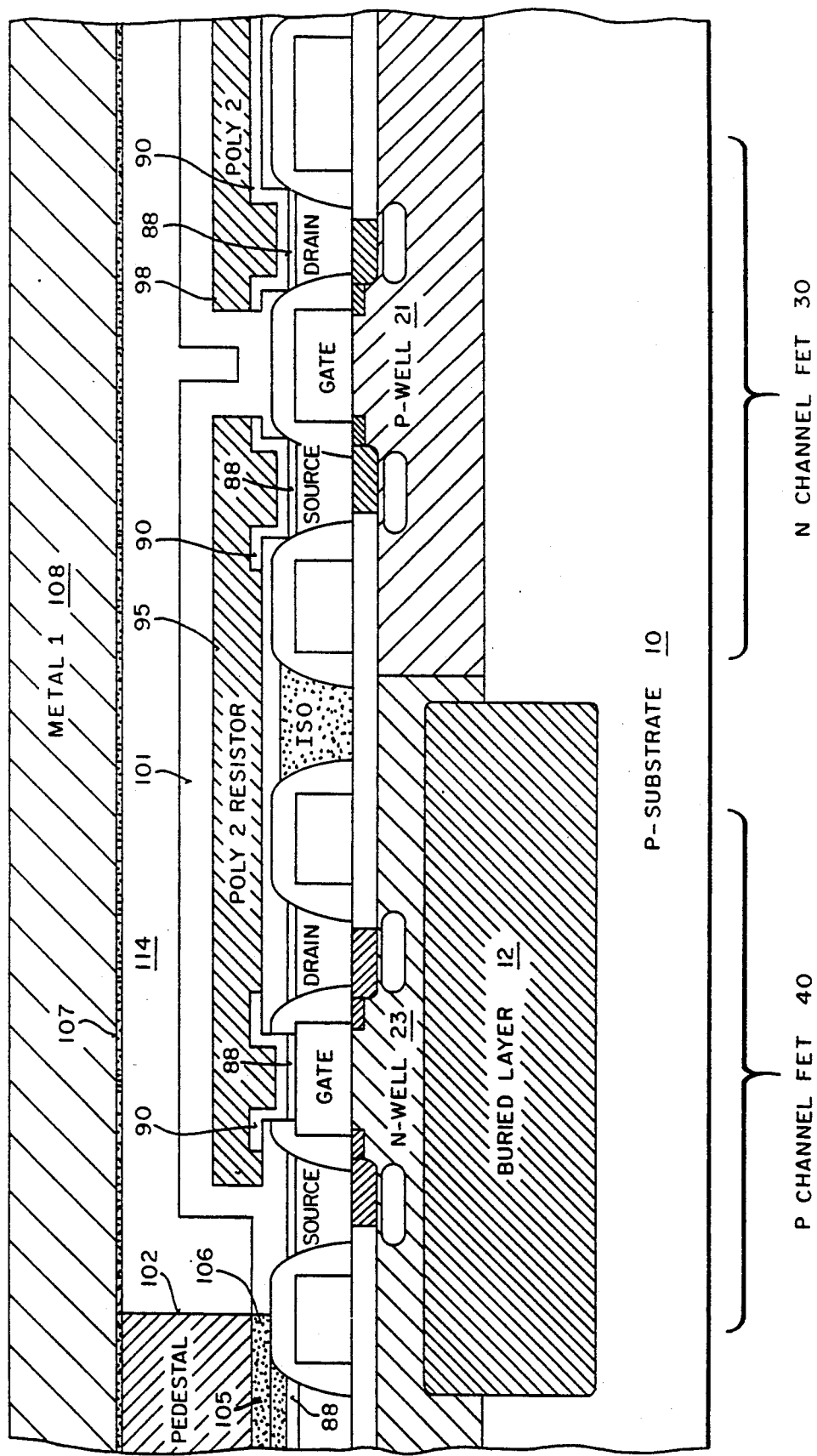

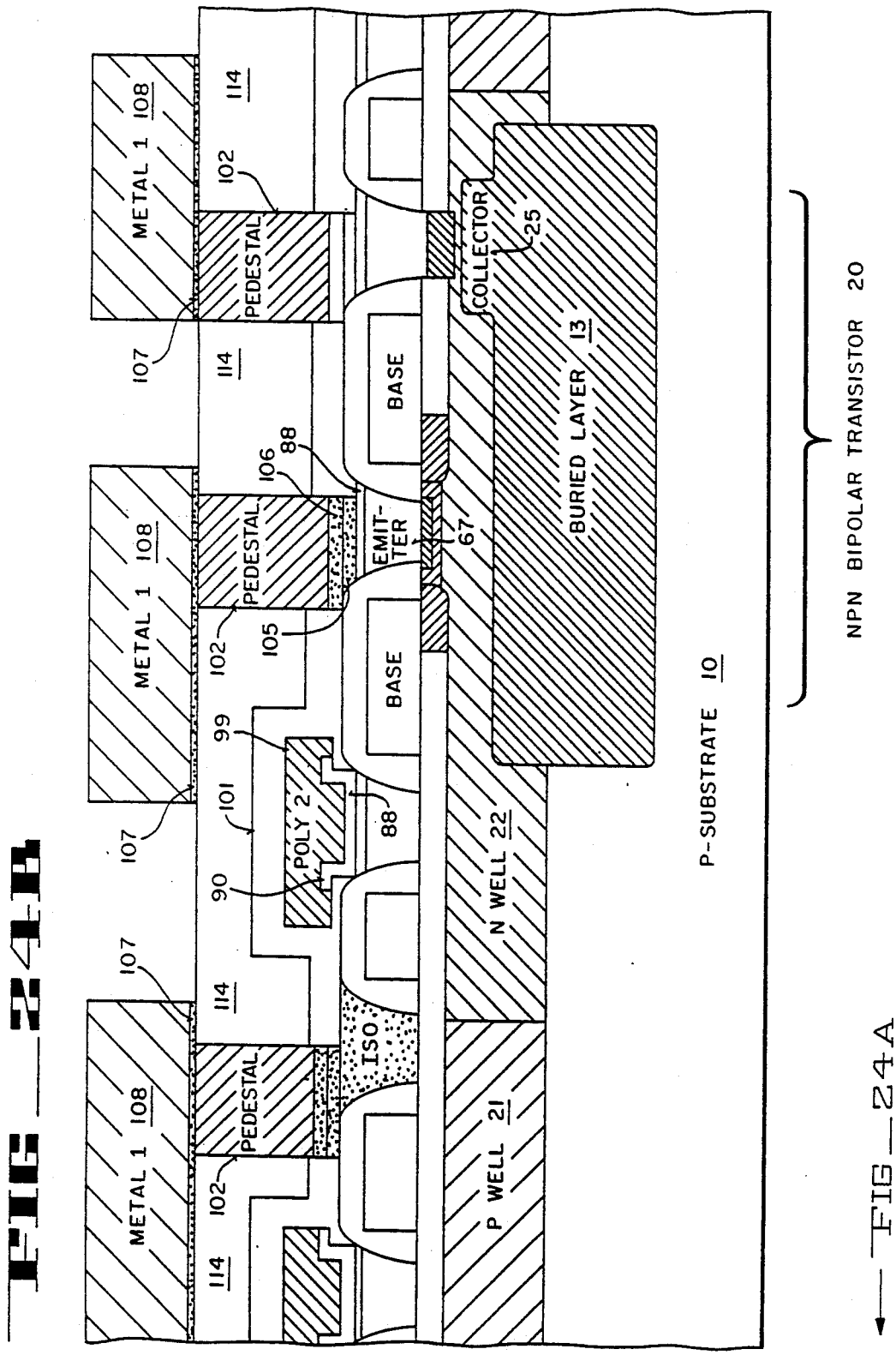

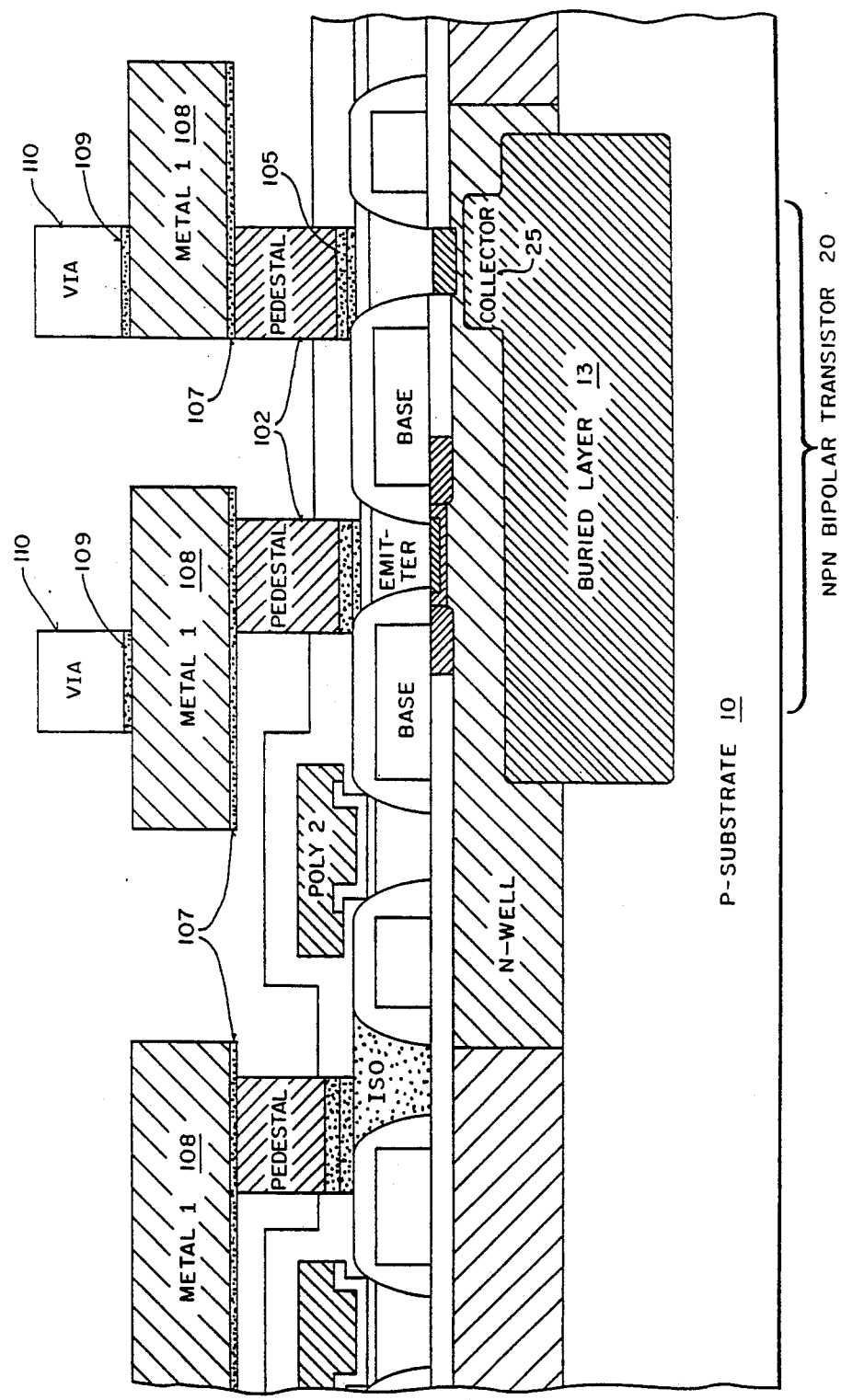

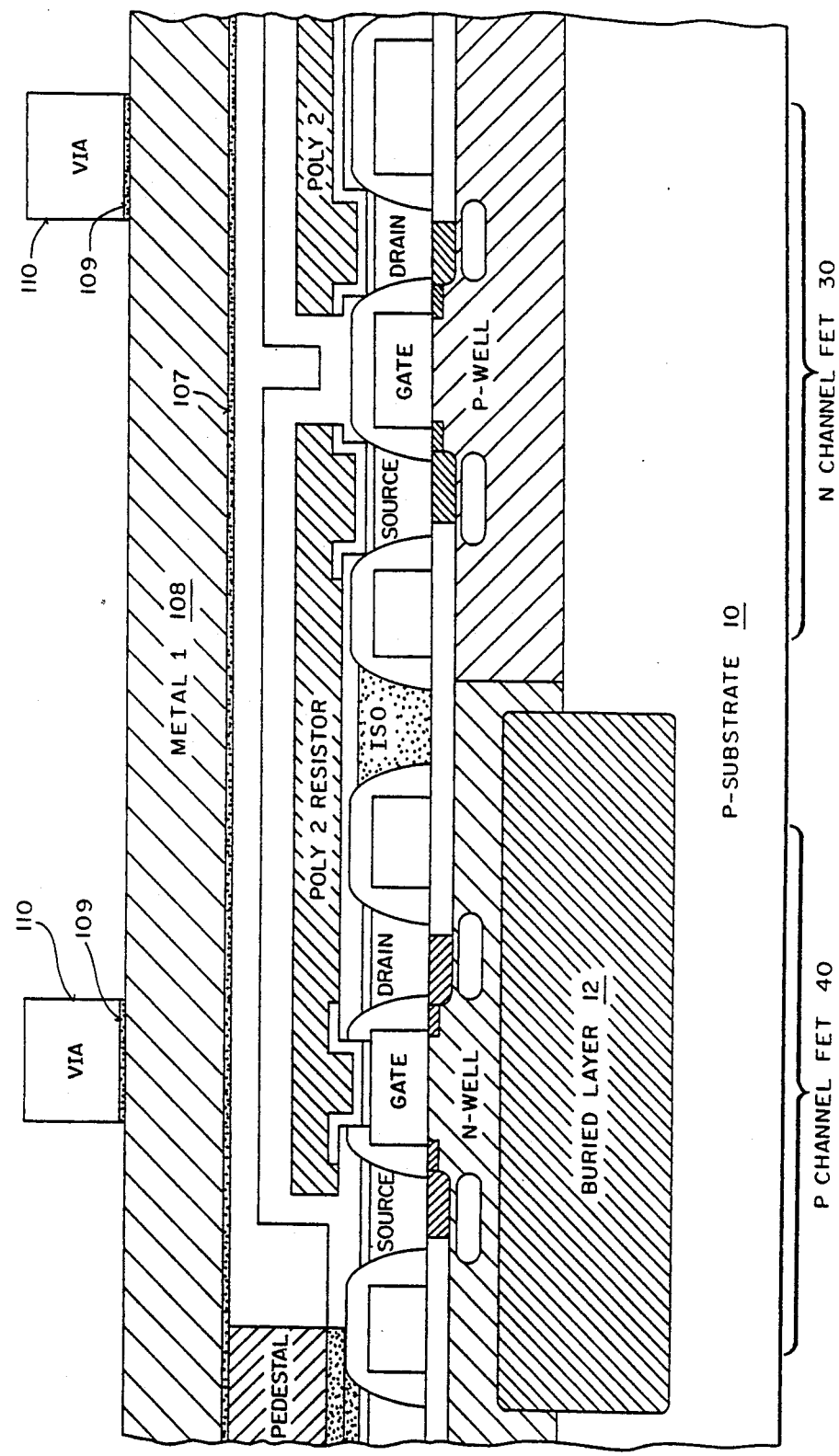

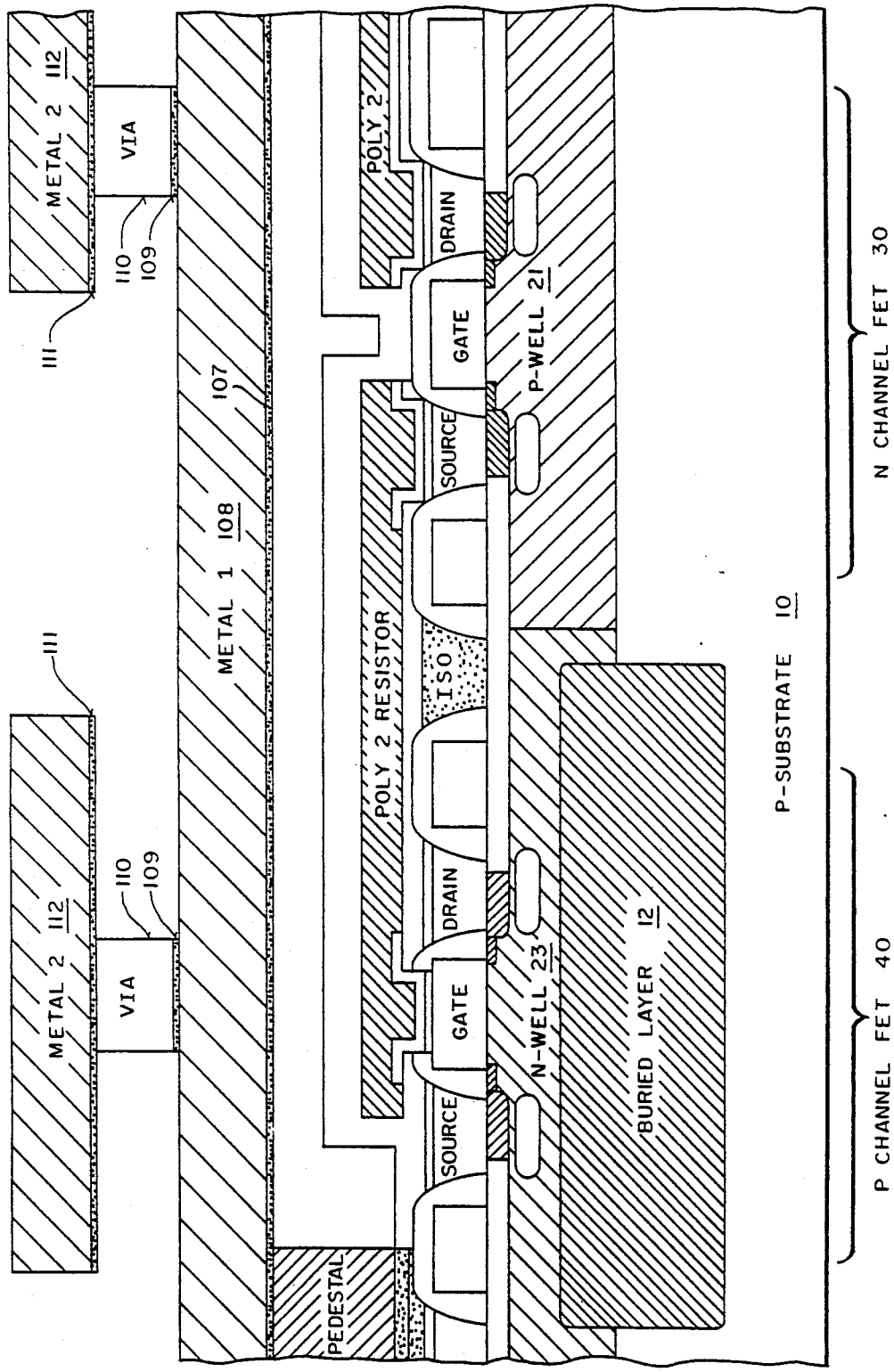

BICMOS PROCESS UTILIZING NOVEL PLANARIZATION TECHNIQUE

FIELD OF THE INVENTION

The present invention relates to processes for simultaneously fabricating bipolar and complimentary field-effect transistors in a semiconductor substrate.

BACKGROUND OF THE INVENTION

In recent years much effort has been directed toward perfecting a method of integrating bipolar and complimentary metal oxide semiconductor (CMOS) technologies on a single wafer. The ability to combine CMOS with bipolar processes in a single ("BiCMOS") process is extremely desirable for high performance circuits. For example, CMOS transistors are inherently low power devices with large noise margins that can achieve a high packing density. Meanwhile, bipolar transistors provide advantages in switching speed and current drive. Bipolar transistors are also characterized by high transconductance which is well suited for driving capacitive loads.

One of the difficulties presented in integrating an MOS device with a bipolar device in the same circuit is that the fabrication steps required to form each of the separate devices often differ radically. That is, the steps used to fabricate a bipolar device are vastly different from the steps required to fabricate a CMOS or an MOS device. As a result, conventional processes are often lengthy and complicated, using a large number of masking operations and numerous thermal cycles.

Another basic limitation to prior art processes has to do with the nature of optical lithography and its affect on the attainable circuit density. In the widely used technique of projection printing, an image of the patterns on the mask is projected onto a resist coated wafer. Upon the exposure of an individual chip site the wafer is moved or stepped on an interferometrically controlled XY table to the next site and the process is repeated. Using state-of-the-art optics, projection printing (also frequently referred to as direct-step-on-wafer or step-and-repeat) systems are capable of producing sub-micron resolutions.

However, this high level of resolution does not come without a corresponding trade-off. The trade-off in this case is the limited depth of focus over which the image quality is maintained. For projection printing, the depth of the focus is approximated by the equation $$\text{d.f. (depth of focus)} = \lambda/2(NA)^2$$

where NA is the numerical aperture of the projection optics and $\lambda$ is the exposure wavelength. Thus, high resolution (very large numerical aperture) is achieved at the expense of a very shallow depth of focus.

In other words, the ability to print a highly dense circuit layout, having minimal device sizes and structures, is especially dependant on the existence of a highly planar surface on which geometric shapes from a mask may be transferred. Unfortunately, the requirement of a highly planar surface is completely at odds with orthodox methods of forming a semiconductor circuit in a silicon substrate.

Traditionally, in fabricating an integrated circuit the silicon substrate layer is first subject to oxidation. Openings are etched in the oxide, and then impurities are introduced or implanted into the substrate. Next, the silicon surface is either reoxidized or subjected to depositions of polysilicon, CVD oxide, silicon nitride, etc. The result of these successive processing steps (e.g., oxidation, etching, implantation, reoxidation) are large steps or incongruities running across the surface of the wafer. Obviously, over the course of the entire process these steps or incongruities lead to a non-uniform, non-planar wafer surface. Consequently, the ability to maintain high image quality (due to the depth of focus problems described above) is substantially degraded in prior methods.

One way in which practitioners have attempted to minimize this problem is to planarize the surface of the wafer by reflowing a boron-phosphosilicate glass across the wafer surface prior to contact mask. The surface is then aggressively planarized using sophisticated etchants when the metalization steps are reached. Despite these attempts to replanarize the wafer surface in the back-end processing steps, the lack of planarization in the front-end processing steps (i.e., those steps leading up to the contact mask step) has already taken its toll on the devices. The inability to pattern compact and high-resolution device structures brings about low-density, low-performance circuits. Hence, past semiconductor processes, and particularly BiCMOS processes, have not been able to take full advantage of the high numerical aperture (i.e., resolution) which modern optical equipment can produce due to the depth of focus problem. The critical importance of maintaining planarization throughout each and every processing step is therefore appreciated.

As will be seen, the presently invented BiCMOS process maintains an extremely high level of planarization throughout all of the processing steps using a novel technique known as "waffelization". When combined with a number of additional novel processing features (each of which is believed to be separately inventive in its own right) the disclosed BiCMOS process is capable of producing device dimensions and circuit densities well beyond the limits of the prior art. For example, using the presently invented process it is possible to produce gate widths of 0.5 microns or less on MOS-type devices and emitter widths of roughly 0.2 microns for bipolar transistors. Consequently, it is contemplated that a 6-transistor memory cell may easily be fabricated within an area of about 3.0×4.8 microns—or a total dimension of approximately 14.4 square microns. This is about the size of a via contact opening in many prior processes.

In addition to achieving high circuit densities and high device performance through planarization of the wafer surface, the invented BiCMOS process is also characterized by its simplicity, reliability, its self-aligning nature, and the overall design flexibility provided—both from a circuit design perspective as well as an applications specific viewpoint.

Other prior art known to Applicant includes U.S. Pat. No. 4,727,046 of Tuntasood et al.; U.S. Pat. No. 4,826,783 of Choi et al.; and U.S. Pat. No. 4,816,423 of Havemann.

SUMMARY OF THE INVENTION

The present invention disclosed and claimed herein describes a process whereby MOS transistors and bipolar transistors are formed together in the same silicon substrate. In one embodiment, the invented process comprises the steps of first defining separate active areas in a substrate or epitaxial layer for each of the transistors. Active areas are defined by forming shallow recessed field oxidation regions in the substrate. Utilizing shallow field regions helps to reduce bird's-beak encroachment into the active areas and also produces a more planarized surface.

Next, a gate dielectric layer is formed over the surface of the wafer. Above the gate dielectric, a first layer of polysilicon is deposited. This first layer of polysilicon is then masked and selectively etched to form a plurality of first polysilicon members each of which is equally-spaced apart from one another. In other words, a plurality of spaces of equal width are etched into the polysilicon down to the underlying gate dielectric or substrate. The polysilicon members formed in this step comprise the gates of the MOS transistors and the extrinsic base contacts of the bipolar transistors.

After the first polysilicon members have been defined, the base regions of the bipolar transistors are formed by doping of the appropriate active areas. The first polysilicon members are then fully insulated by forming an oxide layer over the sidewalls and tops of each of the members. An additional layer of polysilicon is then deposited over the substrate to a thickness sufficient to cover the first polysilicon members and planarize the entire wafer surface. The additional layer of polysilicon uniformly fills each of the gaps or spaces formed during the previous etching step.

The additional layer of polysilicon is then etched to form a plurality of second polysilicon members which are electrically isolated from the first polysilicon members. Impurities, which are either present in the deposited additional polysilicon layer or are introduced by a supplemental step, are then diffused into the substrate to form the source/drain regions of the MOS transistors, and the extrinsic base and emitter regions of the NPN transistors. Moreover, the second polysilicon members also optionally form a first interconnect layer for the completed circuit. The final processing steps include those steps essential to the interconnection of the MOS and bipolar transistors.

The manifold inventive concepts embodied by the presently invented BiCMOS process are best described and understood by reference to the detailed description which follows. Each novel concept contributes certain technical advantages—the sum of which engenders an especially high-performance, highly-reliable and highly-dense circuit. The process itself is characterized by its simplicity, its self-aligning nature and the extreme level of planarization sustained throughout. A litany of the technical advantages and features of the invented process includes:

1. Planarization of the wafer surface through the process of waffelization. Beginning with the earliest processing steps, planarization is maintained all the way through metalization.

2. Use of a very thin field oxidation to preserve a narrow active pitch. This overcomes the problem of bird's -beak and interconnected coupling capacitance.

3. The availability of n-type and p-type MOSFETs in both enhancement, depletion and zero-threshold modes. A single masking step is employed for each type of device (n-type or p-type).

4. Use of amorphous polysilicon to facilitate planarization and avoid impressing a harmful grain structure into the substrate in the emitter regions of the bipolar transistors.

5. Self-aligned well compensation in a single masking step for the MOS transistors.

6. Use of polysilicon as an interconnect layer and as a diffusion source for creating hyper-shallow PN junctions.

7. Use of cobalt silicide as a contact to polysilicon. Cobalt silicide permits the formation of highly self-aligned contacts which may overlap gate, oxide and isolation regions.

8. An air-bridge interconnect system which utilizes polyimide as an intermediate dielectric layer. Optionally, the polyimide may be removed; thereby forming voids which act to reduce interlayer coupling capacitance to a minimum. Alternatively, these voids may be "backfilled" with various arbitrary materials to create exotic types of semiconductor devices aimed at specific applications.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 1A and 1B are cross-sections of a semiconductor structure illustrating the starting wafer material and the separate regions for forming NPN bipolar, n-channel field-effect, and p-channel field-effect transistors.

FIGS. 2A and 2B are cross-sections following formation of an n+ buried layer.

FIGS. 3A and 3B are cross-sections following formation of an epitaxial layer.

FIGS. 4A and 4B are cross-sections after formation of separate p and n-well regions.

FIGS. 5A and 5B are cross-sections after formation of field oxidation regions.

FIGS. 6A and 6B are cross-sections after opening an area for the NPN bipolar base region.

FIGS. 7A and 7B are cross-sections following deposition of the first polysilicon layer.

FIGS. 8A and 8B are cross-sections following gate etch.

FIGS. 9A and 9B are cross-sections following implantations of n and p-type lightly doped regions, the bipolar base regions, and the well compensation implants.

FIGS. 10A and 10B are cross-sections following oxide side wall spacer etch.

FIGS. 11A and 11B are cross-sections following planarization poly deposition.

FIGS. 12A and 12B are cross-sections after planarization poly etch back.

FIGS. 13A and 13B are cross-sections after isolation oxide regions have been formed.

FIGS. 14A and 14B are cross-sections illustrating source, drain, emitter, implants into the planarized poly regions.

FIGS. 15A and 15B are cross-sections following source, drain and emitter doping and drive-in.

FIGS. 16A and 16B are cross-sections following opening of the gate contact regions.

FIGS. 17A and 17B are cross-sections after formation of cobalt silicide contact regions.

FIGS. 18A and 18B are cross-sections following formation of poly/poly contacts.

FIGS. 19A and 19B are cross-sections following deposition and masking of titanium used for poly 2 silicide.

FIGS. 20A and 20B are cross-sections after deposition of poly 2 and the nitride top layer.

FIGS. 21A and 21B are cross-sections after poly 2 mask.

FIGS. 22A and 22B are cross-sections following masking for pedestal contacts.

FIGS. 23A and 23B are cross-sections following formation of pedestal contacts.

FIGS. 24A and 24B are cross-sections following metal 1 mask.

FIGS. 25A and 25B are cross-sections following formation of via pedestals.

FIGS. 26A and 26B are cross-sections after formation of metal 2 interconnection regions.

DESCRIPTION OF THE PREFERRED EMBODIMENT(S)

Figure 26B:
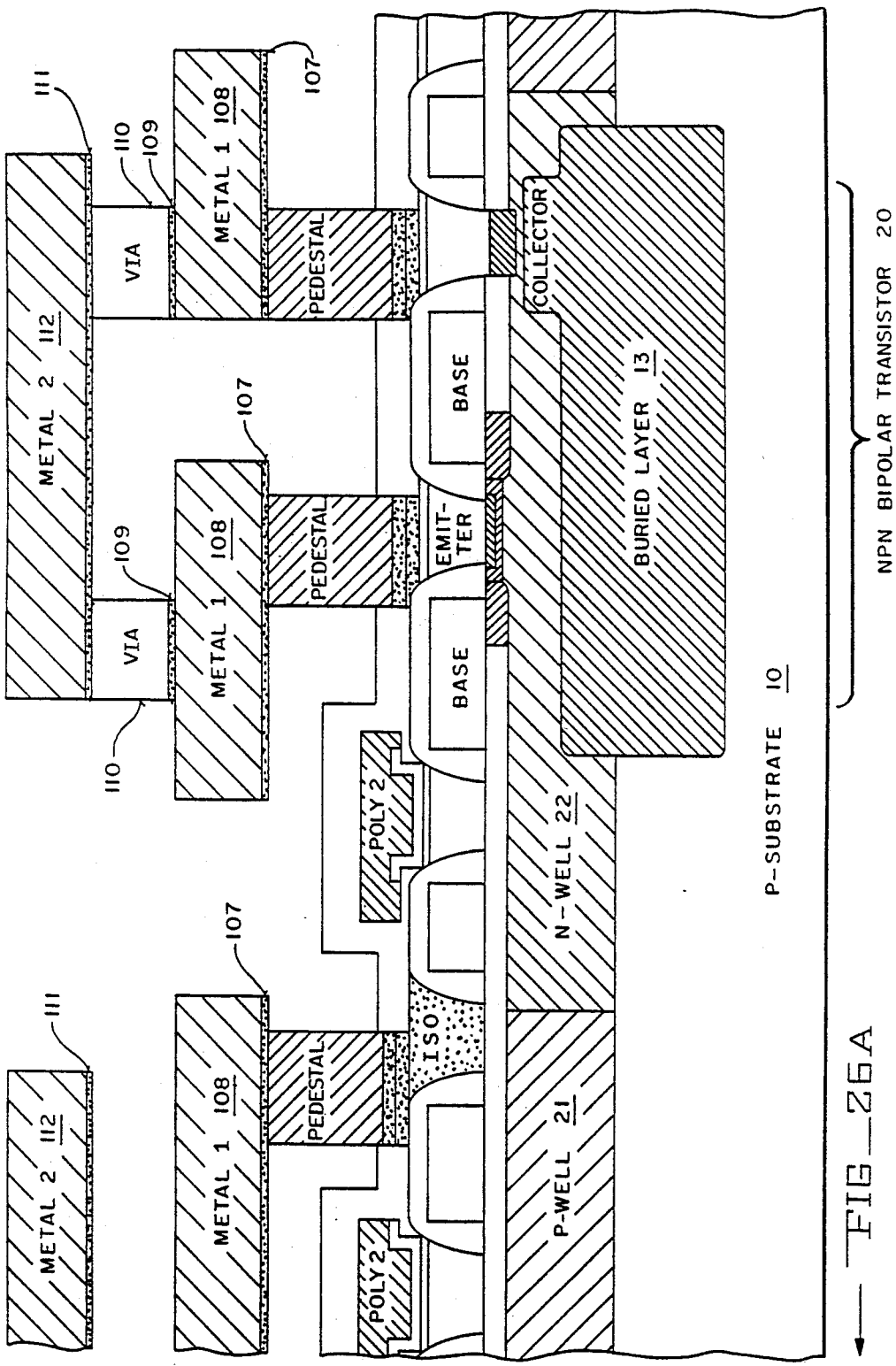

A novel BiCMOS process for simultaneously forming bipolar transistors and MOS transistors in the same semiconductor substrate is disclosed. In the following description, numerous specific details are set forth, such as specific conductivity types, dopants, thicknesses, etc., in order to provide a more thorough understanding of the present invention. It will be obvious, however, to one skilled in the art that these specific details are not necessary to practice the present invention. In other instances, other well-known processing steps and methods have not been shown in detail in order to avoid unnecessarily obscuring the present invention.

FORMATION OF THE ACTIVE REGIONS FOR THE BJTs AND MOSFETs

Referring to FIGS. 1A and 1B, a cross-sectional view of the starting semiconductor substrate 10 is shown. Substrate 10 has a crystal orientation of $<100>$ and has been doped with a p-conductivity type impurity to a resistivity of approximately 10 ohm-centimeters. Orientation $<100>$ is used because it provides the lowest possible surface state density. This is standard practice for MOS processing. Optionally, the back side of the wafer may be coated with a polysilicon layer as a means for introducing dislocations into the crystalline structure—the dislocations acting as impurity trapping sites for heavy metals.

Next, alignment marks are etched into the surface of the wafer using a reactive ion etch (RIE). These alignment marks are in the form of crosses, squares, etc., and are used as an alignment reference for subsequent masking layers. The alignment marks are formed using an alignment mask aligned to the wafer in accordance with standard photolithographic techniques. (e.g., depositing photoresist, masking the surface of the substrate, exposing the masked substrate to ultraviolet light, developing the photoresist, etc.). Considering the high degree of planarization achieved by the invented processes, reference alignment marks provide a simple and easy method of maintaining mask registration throughout later processing steps.

It should be understood that the alignment mask is an optional masking step in the presently invented process. Alternatively, visual alignment may be made to the implanted buried layer regions. However, since the surface of the wafer will be highly planarized throughout the entire process—making visual mask registration difficult—the inclusion of the alignment mask step is preferred. Furthermore, because of the contribution each oxide step has toward defeating planarization, it is desirable to avoid generating a buried layer oxide boundary edge simply for alignment purposes.

With reference to FIGS. 2A and 2B, buried layer regions 12 and 13 are formed using conventional ion implantation techniques. Antimony ions are implanted at an energy of approximately 180 KeV and at a dose of approximately $1.0 \times 10^{15}$ atoms per square centimeter (atoms/cm$^2$). Buried layer 13 forms the n+ collector region for NPN bipolar transistor 20 while buried layer region 12 forms an n+ doped region under p-channel transistor 40.

Following the antimony ion implantation, a p-type epitaxial layer 15 is deposited over the surface of the wafer as shown in FIGS. 3A and 3B. Epitaxial layer 15 is approximately 2 microns thick and is doped p-type to a concentration of about $1.0 \times 10^{17}$ atoms/cm$^3$. Layer 15 is formed by exposing the wafers to a dichlorosilane (SiH$_2$Cl$_2$) gas at approximately 1050° C. The antimony ions in buried layer regions 12 and 13 are subsequently driven (i.e., diffused) downward into p-substrate 10 and upward into epitaxial layer 15 at a temperature of about 1100° C. for approximately five hours in an atmosphere consisting of N$_2$+5% O$_2$. The drive-in cycle helps to repair damage done to the substrate surface during ion implantation.

Next, an n-well mask is employed to mask off those regions of epitaxial layer 15 which will subsequently become p-well regions. The exposed areas of epitaxial layer 15 are then subjected to a phosphorous ion implant at an energy of 180 KeV and a dose of $2.5 \times 10^{13}$ atoms/cm$^2$. After this implant, epitaxial layer 15 is divided into separate n-well and p-well regions as shown in FIGS. 4A and 4B.

In FIGS. 4A and 4B, n-well region 23 is utilized in the formation of p-channel field-effect transistor (FET) 40. P-well region 21 furnishes the proper conductivity type region for the formation of n-channel FET 30. N-well region 22 is similarly utilized in the formation of NPN bipolar junction transistor (BJT) 20.

Referring to FIGS. 5A and 5B, another high-energy implant is employed to form the collector plug region 25, which functions as a low resistance vertical contact down to the underlying n+ buried layer region 13. As mentioned earlier, buried layer region 13 eventually forms the collector of NPN transistor 20. After appropriate masking, phosphorous ions are implanted at an energy of 180 KeV and a dose of $1.0 \times 10^{15}$ atoms/cm$^2$. The collector drive and n-well drive are performed simultaneously at 1100° C. for approximately six hours in an atmosphere comprising N$_2$+5% O$_2$. The N$_2$+5% O$_2$ gas helps to establish an equilibrium between nitridation and oxidation of the surface of the wafer. This prevents excessive nitridation of the wafer surface which is usually undesirable.

Following the collector plug and n-well drive cycles, a thin (approximately 250 Å) pad silicon dioxide layer is grown across the entire surface of the wafer. This pad oxide is grown in a furnace at 900° Celsius (C.) for fifteen minutes using an oxygen gas flow. A standard silicon nitride deposition using gas phase, low pressure chemical vapor deposition (LOCVD) techniques follows growth of the pad oxide. This silicon nitride layer acts as a mask layer during formation of the field oxide regions. Growing a pad oxide beneath the nitride layer markedly reduces stress induced dislocations in the underlying silicon substrate. (Note that the pad oxide is not shown in the Figures because of the relative thinness of that layer.)

The growth of the field oxide (FOX) regions are performed using the well-known processing method known as recess oxidation (ROX). In the recess oxidation method a thick field oxide layer is first grown thermally in the patterned FOX regions. Due to the fact that thermally grown oxide takes up more volume than does single crystalline silicon, there is a substantial volume of silicon dioxide which grows above the planar surface of the substrate. This elevated portion of the silicon dioxide is subsequently etched isotropically to produce a recessed surface across the wafer. After etching the wafer surface, it is again oxidized, resulting in a nearly planar surface. Active regions for the devices are defined by the FOX regions at this point in the process.

Normally, field oxidation produces what is commonly referred to as birds'-head or birds'-beak features. These formations consist of an oxide bump (birds'-head) along with a lateral growth of oxide (birds'-beak) at the silicon nitride boundaries. The length of the birds'-beak is proportional to the thickness of the field oxide layer. Typically, lateral oxide penetration is between one-half and one times the field oxide thickness. The birds'-beak phenomena sets a fundamental limit on the pitch of the active region; that is, how close active layers can be placed adjacent to one another.

In the presently invented process, field oxide regions are defined using a high resolution active layer mask which opens selected areas in the silicon nitride layer. The nitride is etched anisotropically using a reactive ion etch (RIE). A first field oxide layer is then grown in these openings at 900° C. in steam to form a 2000 Å oxide film. This first field oxide film is then dipped off in a 10:1 solution of hydrogen fluoride (HF) 48% and water. A second field oxide layer is then grown at 900° C. in steam to form an approximately 1000–2000 Å field oxide layer 28 as shown in FIGS. 5A and 5B.

Because the field oxide thickness in the invented process is relatively thin when compared to prior art methods, the penetration of the birds'-beak into the active layer regions is markedly reduced. By way of example, active layer spacing is on the order of 1.0 microns. Previously, attempts to reduce the thickness of the field oxide region were avoided since a thin field oxide generally corresponds to a high coupling capacitance between the substrate and the overlying metal interconnects. The reason why a relatively thin field oxide is tolerated in the presently invented process is because the interconnection layers are not in contact with, nor in close proximity to, the substrate surface. This aspect of the present invention will be described later.

In addition, because field plate isolation is used in the presently invented BiCMOS process, the surface potential is easily controlled. Also, use of field plate isolation and thin field oxide contributes greatly to the radiation hardness of the circuit. This is of critical importance in certain military applications. FIGS. 5A and 5B show field oxidation regions 28 after the silicon nitride masking layer has been removed.

Yet another advantage of using a thin field oxide is that by choosing a silicon nitride mask layer thickness carefully, the field threshold adjustment implant can penetrate through the field oxide after it is grown, as well as the silicon nitride layer. In this way, a single implant may be utilized to provide correct $V_T$ for the transistors while simultaneously providing the proper field threshold level.

When used in this manner, the silicon nitride acts as a sort of decelerating or breaking layer—setting a shallow depth for the implant dose in the transistor active regions. Optionally, the silicon nitride layer can be removed prior to the field implant, resulting in significantly higher channel mobilities due to the deeper implant. Higher channel mobility translates into better transistor performance due to the corresponding reduction in impurity scattering.

The ability to perform transistor threshold and field implants simultaneously also provides great flexibility in selecting device types. For example, if boron is implanted in an n-channel device an enhancement-mode n-channel MOSFET having a threshold of approximately 0.5 volts is produced. On the other hand, if this implant is left out of the active regions (by appropriate masking) then a natural device (i.e., approximately 0 volt $V_T$) results. Furthermore, if the p-type enhancement-mode device implant is directed into the n-channel transistors, a $-0.5$ volt $V_T$ depletion mode device is created.

Moreover, a single masking/implant process step can be used to change the characteristics of selected field-effect devices from enhancement-mode, to depletion-mode, or to zero threshold type devices. Because of the symmetry between n-channel and p-channel devices each individual transistor is available in all three types. This results in a substantial savings in masking steps and allows interesting device type combinations. By way of example, it might be desired to produce a NAND gate which uses an enhancement-mode lower device and a zero threshold upper device.

Ion implantation is a most valuable tool for controlling threshold voltage. Very precise quantities and purities can be introduced making it possible to maintain extremely close control of $V_T$. For instance, where boron is implanted through a gate oxide for a p-channel device, the negatively charged boron acceptors serve to reduce the effects of the positive surface state charge. As a result, $V_T$ becomes less negative. Similarly, a shallow boron implant into the p-type substrate of an n-channel transistor can make $V_T$ positive—as required for an enhancement device. The capability, as described above, of allowing enhancement, depletion, and zero threshold type devices to be incorporated on the same chip using a single implant therefore provides many advantages to the integrated circuit designer.

In the currently preferred embodiment, the n-type $V_T$ and field implant mask aligns to the active layer region. A boron ion implantation follows at an energy of 100 KeV and a dose of approximately $5 \times 10^{12}$ atoms/cm$^2$. Following this implant, a p-type $V_T$ and field implant is performed. The masking layer is aligned to the active layer and phosphorous ions are implanted at 180 KeV with a dose of approximately $1 \times 10^{13}$ atoms/cm$^2$. Following the threshold implants, the field nitride regions are reactive ion etched until removed, then the underlying pad oxide is dipped off in a 100:1 solution of water and HF.

FORMATION OF THE GATE DIELECTRIC

At this point in the process we are ready to form the gate oxide for the n-channel and p-channel FETs. After the pad oxide etch there can exist residual nitride films around the birds'-beak regions. These residual films can suppress subsequent oxidation resulting in a thinner gate oxide in these areas. To insure that this residual nitride is completely removed a first gate oxide layer of approximately 200 Å is grown in a furnace at 900° C. in an atmosphere of 87% argon, 10% O$_2$ and 3% HCl. Immediately afterwards this first gate oxide is dipped off in a 100:1 solution of HF. This extra growth and etching step insures complete removal of residual nitride films. The second gate oxide (i.e., the actual gate oxide used in the devices) is also grown in a furnace at 900° C. using the same gas as was used in growth of the first gate oxide. This second gate oxide layer is carefully grown to a thickness of approximately 100 Å.

After the gate oxide has been formed, selected regions must be removed to create buried contacts down to the substrate. One example is in the case of bipolar NPN transistor 20 where a buried contact is needed for electrical connection down to the extrinsic base region. Traditionally, buried contacts are formed by first spinning a layer of photoresist over the gate oxide, developing the photoresist, etching the gate oxide in the contact areas, then depositing polysilicon. This technique has been widely used in NMOS transistor processes.

Conversely, because the presently invented BiCMOS process employs a gate oxide which is extremely thin (approximately 100 Å), it is undesirable to expose this thin oxide to reactive chemicals. Therefore, in the invented process after the growth of the gate oxide layer is completed, a first polysilicon deposition is performed in a furnace at 580° C. This produces a thin (approximately 500 Å) layer of amorphous polysilicon which covers all of the gate oxide previously grown. This thin layer of polysilicon acts to cap the very thin gate oxide prior to the formation of the buried contacts.

It is significant that this first protective polysilicon layer is amorphous in structure. By its nature, amorphous polysilicon is highly smooth and contains no embedded grain structure. In contrast, ordinary polysilicon (grown at a higher temperature) is generally much rougher and more granular than amorphous polysilicon. When ordinary polysilicon is reactive ion etched down to the single crystalline silicon substrate the grain structure of the polysilicon can become imprinted into the substrate surface. This causes considerable damage to the underlying crystal lattice and can diminish device performance, particularly in bipolar junction transistors.

FIGS. 6A and 6B show cross-sections in which the protective polysilicon layer 26 is opened in base contact region 27 using conventional masking techniques. The base contact regions of layer 26 are first etched using a reactive ion etch and then the underlying gate oxide is dipped off in a 100:1 solution of water and HF. (Note that in FIGS. 6A and 6B the underlying gate oxide layer is not shown due to its relative thinness when compared with other layers). The opening over region 27 is utilized to later form buried base contacts for BJT 20.

An important feature of the invented process is that both n-type and p-type buried contacts are available. This is in contrast with standard MOS processes where all of the polysilicon is typically doped n-type so that buried contacts to p-channel FETs or p-type BJT base regions are generally not available. If an attempt were made to form buried contacts to a p-type substrate using n-type polysilicon the n-type dopant from the polysilicon would diffuse down and form a PN junction with the underlying p-type material. In the presently invented process, p-type polysilicon is used in p-type channel FETs and an n-type polysilicon is utilized in n-channel FETs. Hence, as will be described in more detail below, symmetric buried contacts are available.

FORMATION OF FIRST LEVEL POLYSILICON MEMBERS

After the buried contact regions have been opened, a second, much thicker, layer of polysilicon is deposited over the wafer. In the preferred embodiment, the second polysilicon deposition occurs in a furnace at 580° C. This produces an amorphous layer which is approximately 2000 Å thick. Again, it is important that the second polysilicon deposition be amorphous to maintain an extremely smooth and planar surface.

In FIGS. 7A and 7B, the amorphous second polysilicon layer is shown as layer 31. Note that polysilicon layer 31 completely covers field oxidation regions 28 as well as base contact region 27. It is understood, of course, that there is no gate oxide present in base region 27 underlying poly layer 31. As described above, this oxide was removed in a previous processing step. But gate oxide does underlie poly layer 31 over the channel regions of n-channel FET 30 and p-channel FET 40.

Following the deposition of poly layer 31 a high temperature TEOS (tetra-ethyl-ortho-silicon) oxide 32 is deposited over the surface of poly layer 31. Reoxidation of poly layer 31 is avoided to prevent recrystalization of poly layer 31. A reoxidation cycle might also destroy the amorphous nature of layer 31 and form asperities therein.

Note also that in FIGS. 7A and 7B, poly layer 31 is illustrated as a uniformly planar surface for ease of representation. Actually, there exists a physical step over each of the buried contact regions. The height of the step being equal to the thickness of the protective poly layer 26 (see FIGS. 6A and 6B) plus the thickness of the gate oxide. The sum of the gate oxide and poly layers, and therefore the height of the step, is about 500 Å. (For purposes of discussion, the surface of the wafer is considered planar whenever any step or feature is 1000 Å or less in height.)

Referring now to FIGS. 8A and 8B, next in the sequence of steps is the polysilicon gate etch. To perform the gate etch an extremely high resolution masking layer is aligned back to the active layer of the devices. A reactive ion etch of oxide layer 32 is followed by a second reactive ion etch which anisotropically etches the underlying polysilicon layer. By using a highly selective etchant the anisotropic etch of the polysilicon stops on the thin gate oxide.

Recall that where emitters are to be formed there is no existing gate oxide to stop on. Over etching in these regions is potentially hazardous to the underlying crystal lattice. However, if amorphous polysilicon is used as described above, no grain pattern is impressed into the substrate. Thus the electrical properties of the emitter junction are maintained. Because of the use of amorphous polysilicon, over etching in the emitter regions does not have a deleterious effect on device performance.

Following the poly gate etch, a slight oxidation of the exposed sidewall polysilicon is performed. Approximately 1000 Å of oxide is grown on the polysilicon in a furnace at 900° C. in a steam atmosphere. Oxidizing the poly gate sidewalls helps to marginally reduce the gate width while fully insulating each of the polysilicon members. It also creates a minute birds'-beak at the silicon interface which reduces the electric field density near the polysilicon edges and corners. Oxidation of the sidewalls also densifies the top oxide layer 32.

At this point in the process, gate 33 of p-channel FET 40 has been defined along with gate 34 of n-channel FET 30 and the extrinsic base contacts 35 of NPN bipolar transistor 20. Additionally, polysilicon members 36 have also been defined along the surface of the wafer. The function of polysilicon members 36 will be explained in more detail later.

Note that in FIGS. 8A and 8B, uniform spaces 38 have been defined between each polysilicon member. In the currently preferred embodiment, spacings 38 are each about 0.5 microns in width. Maintaining a controlled and accurate polysilicon spacing 38 across the entirety of the wafer is of crucial importance to the goal of planarization. When viewed from the top, these uniform polysilicon spacings 38 create a "waffle-like" pattern across the surface of the wafer. Hence, the origin of the term "waffelization" to denote the technique for achieving complete planarization of the semiconductor surface.

Using a controlled poly space 38 (all polysilicon spaces being equal in dimension, i.e., "waffelized") makes possible the invented planarization scheme. This scheme is based on the isotropic (i.e., uniform in all directions) deposition of a material—in this case polysilicon—followed by an unmasked anisotropic (i.e., vertical) etch. Once spaces 38 have been etched out of the polysilicon layer and a sidewall oxide formed, an isotropic deposition of amorphous polysilicon is used to fill in spaces (i.e., the gaps between the previously patterned polysilicon lines). Since the spaces 38 are uniform across the wafer, each is filled at the same time and at an identical rate.

Deposition continuous until a totally planar surface is produced. Generally, this requires a polysilicon deposition to a thickness which is approximately twice the thickness of members 36. The anisotropic etch of this second polysilicon layer reduces the thickness until the second poly layer is roughly coplanar with poly members 36. At this stage, the first polysilicon members are electrically isolated from the second polysilicon layer. The second polysilicon layer is now confined to spaces 38 and comprises a plurality of second poly members 58 (see FIGS. 12A and 12B). To summarize, the effect of these processing steps is to fill the gaps between the poly lines, resulting in a planar surface. Details of these processing steps, with reference to the pertinent figures, will follow.

It is appreciated that constraining the first layer polysilicon spacings 38 to a fixed dimension places no constraint on the width of polysilicon members 33, 34, 35, 36. Thus, it is possible to have base contacts, gates, or polysilicon interconnect members with various widths. First polysilicon can take the form of a gate, an interconnect, or simply a dummy polysilicon member such as members 36 shown in FIGS. 8A and 8B. In addition, polysilicon members 36 may be employed either as an interconnect layer or simply to establish uniform spaces 38 across the surface of the wafer. As previously mentioned, defining equally-wide spaces 38 are a key concept to the invented planarization-by-waffelization scheme.

Following the etch of the polysilicon surface which defines members 33-36, oxide sidewalls are formed on each of the polysilicon members. A high temperature TEOS oxide is deposited at 700° C. to form a 2000 Å thick oxide layer over the wafer. This oxide is then reactive ion etched until the source/drain regions and emitter regions appear in the silicon surface. A slight reoxidation is then performed to protect the exposed silicon surface.

FIGS. 9A and 9B show each of the polysilicon members 33-36 being insulated by silicon dioxide regions 57 following reactive ion etching to create openings in spaces 38 down to the substrate. Notice that a slight slope is etched on each of the sidewall areas of oxide 57 between adjacent first polysilicon members. This slope helps to insure a uniform deposition of polysilicon in spaces 38.

Given that the chief constraint for achieving planarization at this stage in the process is maintaining uniform spaces of polysilicon, a great variety of polysilicon patterns may be realized. For instance, the surface of the wafer may primarily consist of large (i.e., very wide) spaces 38 with small islands or strips of polysilicon separated throughout. Alternatively, the surface of the wafer may be very dense with polysilicon and employ only the minimum (e.g., 0.5 microns) space 38 permitted by the process design rules. Thus, a great deal of flexibility is inherent in the topological patterning of the poly 1 material.

FORMATION OF THE SOURCE/DRAIN REGIONS FOR FETs AND BASE/EMITTER REGIONS FOR BJTs

Preferably, after the sidewall oxide regions 57 have been defined, formation of the source/drain regions for FETs 30 and 40 and base/emitter regions for BJT transistor 20 may proceed. Referring to FIGS. 10A and 10B, p-type lightly-doped drain/source (P-LDD) regions 54 and 53 are first formed just below the surface of the substrate. The same mask used for the implantation of regions 54 and 53 is also used in forming the intrinsic base region for BJT 20 and the well compensation regions 45 and 46 for p-channel FET 40.

The P-LDD+BJT base+well compensation mask aligns to the gate mask. Once openings in the photoresist are formed, a boron ion implantation at an energy of 30 KeV and a dose of $1.0 \times 10^{14}$ atoms/cm$^2$ produces lightly-doped regions 54 and 53 and intrinsic base region 50. The purpose of the lightly-doped implant is to enhance the reliability of each of the FET devices. If heavily doped n+ or p+ regions are near the gate oxide an extremely high electric field can result. The presence of a high electric field would enhance undesirable hot-electron effects in those transistors. Lightly-doping the source/drain regions near the substrate surface (i.e., adjacent to the gate) substantially reduces the electric field strength. As a result, device degradation due to hot-electron generation is suppressed. (In the preferred embodiment, the junction depth of regions 53, 54 and 50 is approximately 1500 Å.)

Note that the boron implant is made directly through the side wall portion of oxide layer 57 which surrounds gate member 33. The blocking effect that oxide 57 has on the implant helps to keep high concentrations of boron impurities away from the channel region. This also helps to reduce the vulnerability of the device to hot-electron effects.

Alternatively, the P-LDD implant can be performed prior to forming the sidewall spacer oxide regions 57. However, if the implant is performed before the oxidation then the boron atoms tend to diffuse laterally under the gate. This has the undesirable effect of increasing overlap capacitance between the gate and the source/drain regions.

Using the same masking step, a second boron ion implantation may be performed. In the preferred embodiment, this second implant is at an energy of 100 KeV and a dose of $1.0 \times 10^{13}$ atoms/cm$^2$. This high energy implant produces deep well compensation regions 45 and 46 in p-channel FET 40. (If the same mask is used a well compensation region is also formed in BJT 20. This well compensation implant region is not shown in FIGS. 10A and 10B since it is not critical to ordinary device performance. Of course, the base of BJT 20 may be protected by a second mask layer prior to the second boron ion implant to avoid forming a well compensation region in this device.)

Because n-well region 23 is heavily-doped, there is a correspondingly high juction capacitance $C_j$ associated with FET 40. While it is desirable to have heavy doping in the deep channel region to reduce short channel effects of the device, it is equally desirable to reduce $C_j$. Including additional well compensation implant regions 45 and 46 significantly reduces (by a factor of approximately three) the FET junction capacitance $C_j$, resulting in a higher speed, lower power circuit. Recognize that this well compensation implant costs no additional masks and is self-aligned with the source/drain regions.

Next, N-LDD regions 51 and 52, and well compensation regions 47 and 48 are formed using a single mask step as described above for the P-LDD implants. The N-LDD+well compensation mask aligns to gate 34. A phosphorous ion implant follows at 60 KeV and a dose of $1 \times 10^{14}$ atoms/cm$^2$ to form regions 51 and 52. This is followed by another phosphorous ion implant at 180 KeV with a dose of $1.0 \times 10^{13}$ atoms/cm$^2$ to form well compensation regions 47 and 48. As mentioned, lightly-doped regions 51 and 52 help to reduce hot-electron effects in n-channel FET 30. At the same time, well compensation regions 47 and 48 reduce junction area capacitance.

With reference to FIGS. 11A and 11B, after the N-LDD and well compensation implants have been performed, source, drain, emitter (SDE) polysilicon layer 58 is deposited isotropically over the surface of the wafer in a furnace at 580° C. This is the polysilicon which fills all of the spaces 38 across the wafer. Once again, SDE poly 58 is an amorphous poly layer and is deposited to a thickness of approximately 10,000 Å. Because SDE poly 58 is deposited isotropically, an absolutely uniform deposition takes place on all sides of oxide 57 and above silicon substrate. Uniform deposition rates as well as uniform spacing between polysilicon members insures that previously vacant spaces 38 are filled isotropically. In other words, if the spaces 38 between polysilicon members were nonuniformal or varied in width, then certain regions (narrower spaces) would fill quicker resulting in a nonplanar surface.

After a sufficient thickness of SDE poly 58 is deposited to insure planarization, it is anisotropically (vertically) etched back. This reactive ion etch of SDE poly 58 continues until the tops of the gates are cleared of polysilicon as is shown in FIGS. 12A and 12B. At this stage of the process, SDE poly 58 fills all of the spaces 38 between polysilicon members 33–36. Eventually, SDE poly members 58 will be used to produce the sources, drains, and emitters of the transistors in addition to forming an interconnect layer for the completed circuit. As is clearly seen in FIGS. 12A and 12B, following etch back of SDE poly layer 58 the surface of the wafer is entirely replanarized.

Unfortunately at this point, all of the devices are electrically shorted together. Logically then, the next processing step involves electrically isolating each of the devices 20, 30 and 40. To isolate the devices, a LPCVD nitride layer is first deposited over the entire surface of the wafer. Selected areas of the nitride layer are opened using a conventional mask step and portions of the SDE polysilicon are etched down to the underlying field oxide. Nitride protects the tops of all other devices. The etch of the SDE polysilicon is both anisotropic and isotropic so as to guarantee clearing all of the polysilicon out of the cavities.

A high temperature TEOS oxide is then deposited at 700° C. to a thickness of approximately 10,000 Å. This TEOS oxide is deposited isotropically and fills in the uniform spaces similarly to the SDE poly deposition—again utilizing waffelization to achieve planarization. The TEOS oxide forms the isolation regions 60 and 61 as illustrated in FIGS. 13A and 13B. Recognize that isolation region 61 isolates bipolar transistor 20 from n-channel FET 30 while isolation region 60 isolates p-channel FET 40 from n-channel FET 30 after the oxide is etched (RIE) to clear the oxide above the nitride. The underlying nitride layer is then etched off leaving the structure shown in FIGS. 13A and 13B.

The next masking step opens the source, drain and gate regions of n-channel FET 30. All three regions are then implanted with a phosphorous ion implant at 180 KeV with a dose of approximately $3.0 \times 10^{15}$ atoms/cm$^2$. This phosphorous ion implant is depicted in FIGS. 14A and 14B by the arrows 41. Phosphorous is deliberately chosen as the n+ type dopant because of its high diffusivity, i.e., its ability to rapidly distribute atoms throughout the polysilicon members. Other SDE polysilicon members—such as members 78 and 79 which could be used as an interconnect layer—may also be doped n-type using implant 41.

Once n-channel FET 30 has been implanted with phosphorous, another mask is applied to the wafer to open the area over p-channel FET 40. This p+ implant mask also opens up the base areas of BJT 20 while simultaneously protecting the emitters. Boron, having a relatively high diffusivity, is implanted at 100 KeV and a dose of $3.0 \times 10^{15}$ atoms/cm$^2$. This p+ implant, shown in FIGS. 14A and 14B by arrows 42, dopes polysilicon members 68, 33, 69, and 35 (forming the source, gate and drain polysilicon members of p-FET 40 and polysilicon base member 35 of BJT 20, respectively) heavily p-type.

An emitter implant follows the p+ implant and is performed in the same manner as described above. The emitter implant mask exposes the emitter polysilicon member 67 of BJT 20. An arsenic ion implant is then done at 180 KeV with a dose of $3.0 \times 10^{15}$ atoms/cm$^2$. Of course, the energy of the arsenic implant may be adjusted downward, if necessary, to avoid implanting arsenic ions into the intrinsic base region 50. The emitter implant is shown in FIGS. 14A and 14B by arrows 43.

Note that in addition to opening up emitter regions the emitter implant mask also may be used to open up areas over those polysilicon members which could become interconnection layers (e.g., members 78 and 79). In this situation, members 78 and 79 are subjected to the emitter implant in addition to the n+ implant used for doping n-FET 30. Yet another option is to dope regions 78 and 79 solely by means of implant 41.

Once the implant sequence 41-43 has been completed, a thermal anneal at 950° C. in an $N_2$ atmosphere for 60 minutes is performed. This anneal is what actually forms the transistor junctions in the silicon substrate. During the anneal, the previously implanted dopant diffuses from the overlying polysilicon members down into the substrate. In other words, each of the SDE polysilicon members functions as a separate diffusion source—introducing impurities into the underlying substrate to form source, drain, emitter and extrinsic base regions of the respective transistors. This is contrary to conventional methods which rely on either direct ion implantation or direct diffusion from a gaseous impurity source. The present method of utilizing doped polysilicon as a diffusion source provides much better control of diffusion rates and junction depth. The actual junctions formed by this method are characterized as being extremely shallow (necessary for very small device structures) and of a very high quality (resulting in low leakage transistors).

Diffusion from a polysilicon source also provides a novel way to form submicron polysilicon bipolar emitters. As polysilicon emitters provide superior performance in bipolar transistors, this simple doping method is a very valuable processing feature. This is particularly so in the case in a BiCMOS process where submicron polysilicon emitters and very shallow FET junctions are formed simultaneously. Simultaneous diffusion of n-type and p-type dopants into the substrate to form device junctions saves a considerable number of processing steps and obviates the need to subject the wafer to additional heat cycles.

Although the preferred embodiment described above relies on implanting the SDE polysilicon which resides above the source/drain and emitter regions using separate masks, it is to be understood that alternative ways of doping the polysilicon members are possible. For instance, the SDE polysilicon may be doped using standard diffusion techniques. In any case, alternative doping techniques are considered to be within the spirit and scope of the present invention.

FIGS. 15A and 15B illustrate a cross section of the wafer following the drive-in (i.e., anneal) of the source/drain, base and emitter regions of FETs 30 and 40 and BJT 20. In detailed summary, source/drain regions 73 and 74 of p-channel FET 40 are formed by diffusion of boron from doped polysilicon members 68 and 69; source/drain regions 75 and 76 of n-channel FET 30 are formed by diffusion of phosphorus from polysilicon members 65 and 66; extrinsic base region 81 is formed by diffusion of boron from doped polysilicon base member 35; and emitter region 77 is formed by diffusion of arsenic from doped polysilicon member 67. In the currently preferred embodiment, the junction depth of regions 73-76 and 81 are on the order approximately 0.17 microns while the junction depth of emitter region 77 is approximately 0.1 microns. Incidentally, the width of emitter region 77 is approximately 0.2 microns in the preferred embodiment of the present invention.

Thus, the single anneal performs two functions: First it distributes the impurities uniformly throughout the polysilicon members. Second, it diffuses those impurities into the silicon substrate to form hypershallow electrical junctions. (Note that in FIGS. 15A and 15B SDE polysilicon member 84 is shown having an associated n-type diffused region 82 directly below it in the silicon substrate. Diffusion region 82 extends down to collector plug 25 to form a low resistance contact with buried layer 13. Although not discussed above, SDE polysilicon member 84 is doped n-type using either emitter implant 43 or n-channel FET implant 41).

The invented BiCMOS process thus far described provides several unique advantages over prior art processes. To begin with, the present invention implements a novel and useful planarization scheme by controlling the spaces etched into a first layer of polysilicon (i.e., waffelization), across the entire surface of the wafer. Once the waffelized spaces have been etched, planarization is achieved by a second deposition of polysilicon (isotropic) followed by an unmasked anisotropic etch. This produces an extremely high degree of planarization which permits extremely small device structures and spacings to be formed.

A second way that the invented BiCMOS process achieves narrow device spacing is by the method of using a thin field oxide to overcome the problem of extended birds' beak. The high coupling capacitance—which usually results from the use of thin field oxide—is overcome by the novel metal interconnect scheme which will be described shortly.

Planarization is also aided by the use of amorphous polysilicon, which is naturally very smooth and devoid of any grain structure. These properties facilitate reactive ion etching, making it easier to etch accurate features. The use of amorphous polysilicon—lacking any grain structure—also avoids creating nonuniformities or asperities in the underlying crystal. This is of particular importance in the situation where the polysilicon layer is etched down to the emitter regions of the bipolar junction transistors.

Another useful addendum to the invented method of fabrication is the ability to add well compensation implants into the process in a self-aligned manner at the same time that lightly doped drain and bipolar base implants are performed. As has been described, no additional masking steps are needed for the well compensation implants. The effect of this implant however will be to reduce the FET junction capacitance by a factor of about three.

Additionally, the presently invented BiCMOS process provides the availability of n-type and p-type FETs in enhancement, depletion or zero threshold types using only a single mask step and implant for each type of FET (i.e., n-type or p-type). This provides great flexibility in circuit design while using a minimal number of mask steps.

Finally, a novel and useful way to form polysilicon source/drain structures and a novel way to form deep sub-micron polysilicon bipolar emitters has been described. SDE polysilicon is implanted with appropriate doping types and subsequently acts as a diffusion source to produce hypershallow junctions. Source, drain, extrinsic base and emitter regions are formed simultaneously using a single anneal step. The resulting junction depths are highly controlled and provide superior transistor performance. In addition, SDE polysilicon may also used as a low resistance interconnect layer.

Overall, the combination of each of the above-described novel features in the invented BiCMOS process results in device structures and densities which are superior to those produced by prior art processes. At this stage, any of several methods may be employed to complete the circuit structure. However, as will be discussed in detail, the present invention includes additional novel features which also contribute to enhanced device performance, reliability and layout density.

FORMATION OF THE DEVICE CONTACTS

Referring now to FIGS. 16A and 16B, a poly 1 gate contact mask is utilized to create opening 86 over gate member 33 of p-channel FET 40. This mask provides one means of access to the poly 1 (SDE poly, gate members, base contacts, poly interconnects and dummy polysilicon) level of the device structure. The approximate dimension of opening 86 is 0.5 microns in the preferred embodiment.

A salient feature of the invented process is the capability of having gate contacts overlap isolation or oxide regions without compromising the electrical integrity of the circuit. The only requirement with respect to gate contacts is that the gate contact opening 86 must not overlap any SDE polysilicon regions (e.g., 68, 69, etc.) since the result would be an unwanted electrical connection. The capacity to be able to provide a gate contact to poly 1 which can overlap oxide and isolation regions is extremely desirable. Overlapping gate contacts in this manner greatly improves the overall density of integrated circuit layouts. (Note that in FIGS. 16A and 16B the dimension of opening 86 is not shown to scale for illustrative purposes.)

After gate contact regions 86 have been opened, the wafer is subjected to an HF dip to clear any remaining oxide from the tops of the SDE polysilicon members (e.g., members 65-69). Cobalt is then evaporated or sputtered over the entire surface of the wafer to a thickness of approximately 1000 Å.

The choice of cobalt is central to the particular metalization scheme employed in this process. Once cobalt silicide is formed on the underlying polysilicon members it becomes impervious to nearly all etchants. The physical properties of cobalt silicide make it unusual among metal silicides since it forms no volatile halides—meaning, of course, that reactive ion or plasma etchers will not attack or destroy it. Cobalt silicide is also capable of withstanding very high temperatures. This means that the poly 1 gate contacts do not need to be covered with a second polysilicon layer (poly 2) to protect them from poly 2 etch damage later in the process. Hence, an appropriate choice of silicide (cobalt silicide in this case) leads to a significant density improvement. This improvement is especially pronounced in the case of memory cells.

After the cobalt silicide has been formed using a rapid thermal anneal, the unreacted cobalt, i.e., over oxide regions 57 and isolation regions 60 and 61, is stripped away. The remaining cobalt silicide regions 88 are shown in FIGS. 17A and 17B. Recognize that the cobalt silicide lowers the sheet resistance of polysilicon interconnection members (such as member 79) and provides a low contact resistance to the other polysilicon members (e.g., 65-69). This has the salutary effect of spreading the current density up into the cobalt layer and away from the substrate junctions.

A hydrogen alloy at 400° C. in forming gas (15% $H_2$ + 85% $N_2$) is performed next to introduce hydrogen ($H_2$) into the isolation regions of the circuit. Hydrogen is intentionally introduced to reduce the surface state charge density, $Q_{ss}$. Normally, in prior art processes, this step is done very late in the process. However, because all of the regions defined up to this point will soon be encased in a nitride layer (which is impenetrable to $H_2$) the isolation oxide regions are loaded with hydrogen at this point in the process.

Once the cobalt silicide layer regions have been defined, the devices may be tested parametrically to verify their functionality. Following parametric testing, the entire surface of the wafer is encased in a layer of silicon nitride to a thickness of approximately 1000 Å. With reference to FIGS. 18A and 18B, this layer of silicon nitride is shown as layer 89.

Next, a poly 1/poly 2 contact mask is used to open holes in the nitride layer 89 where poly 2 will contact poly 1. FIGS. 18A and 18B show openings to source 65 and drain 66 of n-channel FET 30, gate 33 of p-channel FET 40, and poly 1 interconnect members 78 and 79. Obviously, these openings are by way of example and other connections or openings may be made to other poly 1 regions depending on the specific circuit design or layout.

Another basic feature of the presently invented CMOS process is that the contact openings in nitride layer 89 are largely self-aligned. In other words, the contact openings can actually overlap into other regions (e.g., gates, isolation, oxide, etc.) since the reactive ion etch used to etch nitride will not attack oxide or cobalt silicide. It should be recognized that had another type of silicide been used—other than cobalt silicide—it could have been removed during reactive ion etching of nitride layer 89.

FORMATION OF SECOND LAYER POLYSILICON RESISTORS AND INTERCONNECTS

Following etching of nitride layer 89, a layer of titanium is patterned on the surface of the wafer using the well-known patterning technique of metal lift-off. FIGS. 19A and 19B show the patterned titanium 90 which, in the preferred embodiment, is deposited to a thickness of approximately 1000 521. Titanium layer 90 is used for low resistance poly 2 interconnect layers and also for low resistance contacts at the contact regions, or endpoint terminals, of poly 2 resistors.

Referring now to FIGS. 20A and 20B, a second polysilicon layer 93 is deposited over the wafer following the patterning of titanium layer 90. The deposition of polysilicon layer 93 occurs in a furnace at 580° C. to a total thickness of approximately 2000 Å. As before, polysilicon layer 93 is amorphous in structure in order to take advantage of the superior planar properties that amorphous polysilicon possesses. A 1000 Å silicon nitride layer 94 is then deposited over top of layer 93 using LPCVD techniques. A rapid thermal anneal at 1000° C. forms titanium disilicide ($TiSi_2$) with those regions of polysilicon layer 93 which contact titanium layer 90. Nitride layer 94 protects polysilicon layer 93 from possible contamination during exposure to subsequent processing steps.

Once nitride layer 94 has been deposited a poly 2 mask is aligned to the poly 1/poly 2 contact regions. The poly 2 mask is employed to define poly 2 interconnection layers as well as poly 2 resistors. Following patterning of the poly 2 mask, reactive ion etch is used to vertically etch down through nitride layer 94, poly 2 layer 93, titanium disilicide layer 90 and any underlying silicon nitride present in layer 89. The reactive ion etch however will not etch through cobalt silicide or exposed oxide. This allows a considerable margin for misalignment in the poly 2 mask operation.

FIGS. 21A and 21B illustrate a cross-section of the wafer following the reactive ion etched used to etch poly 2 and the surrounding nitride layers. As is clearly seen, this etching step defines poly 2 resistor 95 and poly 2 interconnect members 98 and 99. Recall that where poly 2 is used as an interconnect (as in member 98) the bottom portion of the poly 2 layer is completely silicided to form a low resistance interconnection medium. Conversely, where poly 2 is used as a resistive element (such as member 95) only the terminals or contact regions are silicided. Accordingly, resistor 95 connects gate 33 with source polysilicon contact member 65. In its undoped state, polysilicon has an extremely high resistivity—on the order of $10^9$ ohms/square—versus about 1 ohm/square for completely silicided polysilicon.

A significant by-product of the above-described method of defining poly 2 regions, is that it makes it possible to create titanium silicide lines which are much narrower than would normally be achievable using ordinary lithographic techniques (e.g., 0.1 micron interconnection lines). The reason for this is that the titanium interconnection lines in this process are first patterned and defined using a first mask layer (i.e., titanium metal-lift-off mask), and then subsequently etched using a second mask (i.e., poly 2 mask). Taking advantage of the fact that mask alignment is considerably more accurate than the optical resolution for a given mask layer, these two masking steps (along with the vertical reactive ion etch) can be used to define features having extremely narrow dimensions. In other words, this method provides a way of generating sub-micron, or sub-lithographic features by taking the image defined by one mask and moving it to two masks. Therefore, although FIGS. 21A and 21B show titanium silicide layers having dimensions defined by the lift-off pattern of a single mask, it is appreciated that much narrower interconnection lines—on the order of tenths of microns—may also be achieved.

After the poly 2 layer has been etched, another nitride layer is then deposited over the entire wafer to a thickness of approximately 1000 Å. In FIGS. 22A and 22B this nitride layer is represented by layer 101. Silicon nitride layer 101 is used to envelop and protect all of the devices.

Although at this point it appears that our goal of complete planarization has been defeated by the poly 2 deposition, it should be emphasized that the design rules in the preferred embodiment of the presently invented process prohibit direct contacts to polysilicon 2. Consequently, planarization actually remains intact since all contacts still reside in the same general plane. Moreover, as will be seen, additional steps are taken in the invented process to assure that planarization is re-established at every level of the metalization process.

FORMATION OF THE AIR-BRIDGE METAL INTERCONNECTS

In the remaining steps, a process to form a planarized, air-bridge interconnect system will be described. As a brief introduction, in this process an organic material (e.g., polyimide) is used as a temporary interlayer dielectric. Pedestal contacts and pedestal vias are utilized along with etch back planarization techniques to achieve a highly planar multilayer metalization scheme. In the currently preferred embodiment this metalization scheme is implemented with two layers of metal. It should be understood, however, that the process is not strictly limited in the number of layers which may be implemented.

Referring to FIGS. 22A and 22B, a cross-section of the wafer is illustrated following the definition of the pedestal contact openings 97. Pedestal contact openings 97 are formed using conventional masking techniques to etch nitride layer 101 in those areas where pedestal contacts will be placed. For example, pedestal contact openings are positioned over polysilicon member 84, member 67 and isolation region 61.

After the pedestal contacts have been formed, planarization is re-established at the next highest level using a method which is radically different when compared to prior art techniques. In the prior art, oxide openings to the underlying substrate are usually filled with metal. The metal is deposited over all of the irregularities or steps present in the substrate surface. In contrast, pedestal contacts in the invented process protrude above the silicon surface to a height which is above the highest irregularity in of the unplanarized surface.

Observe that in FIGS. 22A and 22B, the contact openings that are etched through nitride layer 101 are highly self-aligned. Once again, because the reactive ion etch used to etch silicon nitride is impervious to oxide or cobalt silicide, the contact openings for the pedestals can extend over the bases and gates of devices. They can also extend over isolation regions. This self-aligning contact scheme, by itself, results in a fundamental improvement in overall circuit density.

Contacts have traditionally been kept well away from gates and field oxide regions to prevent either a gate or a field short. Generally, this rule results in a minimum transistor which consists of a tiny active region with the adjacent contacts being disposed in huge open areas around the periphery of the transistor. Obviously this wastes a great deal of silicon area. Conversely, in the invented BiCMOS process contacts can have more than 50% of their total area residing over gate or field oxide regions.

Referring now to FIGS. 23A and 23B, a metal lift-off technique is used to define the pedestal contacts. Photoresist is first deposited over the wafer and then developed, exposing pedestal contact openings down to the substrate. A titanium layer 105 is then deposited to a thickness of 1000 Å. This is followed by a platinum deposition to form layer 106 to a thickness of 1000 Å. A gold layer 102 is then deposited to a thickness somewhere between 7000–10,000 Å.

Gold is the main current carrying member of the pedestal while platinum provides a barrier to prevent gold diffusion into the underlying substrate region. Titanium is included in the structure because of its low resistivity and its propensity to adhere to silicon. Because gold has one of the highest electromigration resistance levels of all the metals, this pedestal contact structure—comprising titanium, platinum and gold—is one of the most reliable metal contacts that may be produced in semiconductor technology today.

It is appreciated that because of the relative height of each of the pedestals (9000–12,000 Å), more than one layer of photoresist may need to be applied during the lift-off process. To make a thicker pedestal, a thicker photoresist layer is simply applied. Note also that in FIGS. 23A and 23B, all of the pedestals shown are illustrated as having the same dimension; that is, equal height and width. Although the pedestals are formed to the same height in this process, there is no requirement that any single pedestal be identical to any other pedestal in length and width. After the pedestals have been defined, a 410° C. alloy in forming gas is performed.

Once alloyed, a layer of polyimide is spun onto the wafer and cured at a temperature of 250° C. Well understood, polyimide is a plastic material with great strength and a very high melting point. The surface tension created from spinning the wafer distributes the polyimide uniformly across the wafer surface. Curing it at 250° C. evaporates out the solvent components of the polyimide and forms cross-linked bonds. Bond formation is frequently referred to as "imidization". While curing at 250° C. hardens the polyimide, it does not fully imidize the polyimide, as this would make the material virtually impossible to etch.

After curing, the flat polyimide layer has a thickness of approximately 25,000 Å. This is sufficiently thick so that the underlying topology has practically no effect on the surface tension of the polyimide. This insures a flat, planar upper surface. A reactive ion etch in $O_2$ is then performed to anisotropically etch back the cured polyimide until the tops of the pedestals 102 appear.

When the tops of the pedestal contacts have been exposed, two layers of photoresist are applied over the surface of the wafer. This photoresist film is then masked to define metal 1 interconnection patterns. Metal 1 deposition then takes place. As with the pedestal contacts, a thin layer of titanium is first deposited. This titanium layer is shown in FIGS. 24A and 24B as layer 107. Next, approximately 10,000 Å of gold is deposited as the main current carrier of the metal 1 interconnects 108. Incidentally, the thickness of the titanium layer is approximately 100 Å while the gold may range anywhere from between 7000–10,000 Å thick in the preferred embodiment. The metal 1 lines 108 are once again defined using metal lift-off. (Note that in FIGS. 24A and 24B, the polyimide layer is shown by layer 114, the top of which is co-planar with the bottom of titanium layer 107.)

Consider that in FIGS. 24A and 24B, pedestal contacts 102 are used in several different capacities. First of all, pedestal contacts 102 provide electrical connection to the underlying transistor structures. For example, emitter contact 67 of NPN bipolar transistor 20 is coupled directly to metal 1 using a pedestal contact 102. Similarly, the collector contact of BJT 20 is also connected to metal 1 through a pedestal contact.

Pedestals may also function as structural or physical support members. FIGS. 24A and 24B show a pedestal contact positioned over isolation region 61. The sole function of this pedestal contact is to provide structural support to the overhead metal 1 interconnect lines. Support members are necessary for those applications in which the underlying polyimide is subsequently removed (for reasons to be discussed later). In a sense, the entire metal 1/metal 2 interconnection system is analogous to a kind of microscopic electronic freeway system that carries current in metal lines suspended above the substrate surface.

The particular need to remove the underlying polyimide for certain applications gives rise to various design rule constraints. For instance, in the preferred embodiment of the present invention, the metal 1 interconnect lines have a minimum width of 0.5 microns and a maximum width of 2.0 microns. The maximum width constraint is necessary to allow the polyimide etchant to penetrate to the underlying polyimide. If metal 1 interconnections had no width constraints, it is possible that polyimide underlying a wide area of metal 1 might not be effectively removed. The maximum metal 1 design rule constraint therefore necessitates the use of parallel strips of metal for high power lines.

The design rules in the currently preferred embodiment also restrict the maximum pedestal spacing to approximately 10 microns. Again, this rule is developed from the need to physically support the metal 1 interconnection lines. Pedestal contacts spaced greater than 10 microns apart create a risk of having metal 1 interconnect lines collapse onto the devices below.

Referring now to FIGS. 25A and 25B, via pedestals 110 are shown formed on top of metal 1 lines 108. These via pedestals are formed using the same processing steps which were used to construct both the pedestal contacts 102 and metal interconnect lines 108. That is, the polyimide layer is first spun and cured onto the wafer, and then vertically etched exposing only the tops of the metal 1 interconnect lines. Then, using a two-layer photoresist metal lift-off technique, a titanium layer 109 is first deposited followed by a gold deposition to form the via pedestals 110. The thicknesses of layers 109 and 110 are approximately 100 Å and 7000–10,000 Å, respectively. It should be understood that in each of the layers 105, 107 and 109, chrome or some other similar metal, may be substituted for titanium—the purpose of these layers being only to provide improved adhesion for the overlying gold.

After the lift-off process which defines via pedestals 110, another layer of polyimide is spun on the wafer, cured and then vertically etched back to expose the tops of via pedestals 110. Metal 2 interconnections are then formed in the same manner as has been described in connection with the metal 1 interconnection lines.

FIGS. 26A and 26B show the completed metal interconnection system with titanium adhesion layer 111 directly below metal 2 interconnect lines 112. One of the beneficial features of the presently invented interconnect structure is that vias can sit directly over device contacts. This is highly desirable for realizing high density circuits and is generally prohibited in conventional processes.

Although it is not shown in any of the Figures, it is entirely possible to have a metal interconnection stack consisting of a pedestal contact 102, a metal 1 layer 108 and a via pedestal 110 whose sole function is to provide physical and structural support for the metal 2 interconnection lines 112. Such a metal stack would have its pedestal contact formed over oxide or isolation regions and would not provide any electrical connection to the underlying layers (e.g., substrate).

To form bonding pads, a polyimide is spun and cured and subsequently etched back to the tops of the metal 2 interconnect lines 112. Titanium (approximately 100 Å) followed by gold (approximately 1000 Å) is then deposited across the entire surface of the wafer to provide a plating base for the bonding pads. Next, the wafer is photolithographically masked to open the bonding pad locations. An electroplate of gold 25 microns thick is then deposited. This thickness of gold is preferred to accommodate tape automated bonding (TAB) following lift-off of the thick gold layer.

Although this completes the integrated circuit, it remains highly capacitive since polyimide is still present between the metal 2/metal 1/silicon surface regions. For those applications which are not particularly sensitive to this type of capacitance, or are relatively immune to the hydroscopic properties of polyimide, another layer of protective polyimide could be spun and cured over the surface of the wafer for mechanical protection. The wafer would then be sawn, broken, and packaged into a suitable plastic package. This would represent a low-cost, low-performance type of device.

For higher performance devices, the wafer is placed back into a reactive ion etch ($O_2$) until all of the polyimide not protected by metal (in a vertical direction) is etched out. Recall that a reactive ion etch is highly directional, i.e., anisotropic. Etching the polyimide in this way would allow opening of underlying polysilicon fuses. These fuses may be opened or blown energetically (e.g., laser) as required for the particular application. For example, redundant columns and memory cells often rely on the use of polysilicon fuses for interconnection.

Of course, this requires careful mask design of the metal 1 and metal 2 mask layers so that polysilicon fuse locations are never covered by metal 1 or metal 2 interconnect. Once the fuses have been opened, another layer of polyimide may be spun and cured over the wafer for mechanical protection. The wafer may then be backlapped and sawed into individual die. At this stage, the die could be bonded into any type of appropriate package (e.g., DIP, leadless chip carrier, etc.) or directly into a printed circuit board.

Once bonded, an oxygen asher etch (highly isotropic) is used to clear all of the polyimide from the die surface. The oxygen plasma ashers the polyimide (i.e., converts it to gas) out from under the metal interconnect lines leaving them supported solely by their pedestals. This means that, each metal interconnect line is now completely suspended in space. This results in the lowest possible parasitic capacitance for improved device speed at lower power levels.

As an alternative, an anisotropic etch may be used to remove the polyimide between the lines but not directly under them. This would result in a compromise structure wherein lateral coupling capacitance is reduced, but vertical coupling capacitance is not. Once the underlying polyimide is removed the part may be baked and encapsulated with a lid.

Where air bridge interconnects are undesirable or unnecessary, another alternative exists. In this approach, after the polyimide has been removed the die or wafer is coated with colloidal suspension of Teflon in water. This substance is then dried and sintered to fuse the Teflon into a solid mass. The Teflon plus water mixture flows by capillary action into the spaces or voids left by the ashering process. After sintering it will appear as if it has simply replaced the polyimide between the metal lines. Because Teflon has one of the lower dielectric constants of any solid, the resulting structure will have minimum parasitic capacitance for a solid structure. This technique can also be performed using plasma techniques to deposit an appropriate fluorocarbon polymer. Thus, other materials or polymers may be implemented using appropriate deposition processes.

APPLICATIONS OF THE PRESENTLY INVENTED BiCMOS PROCESS

The use of an air-bridge interconnection system also opens up the possibility of many new and exciting applications in the semiconductor technology field. For instance, instead of backfilling the air spaces with Teflon or polyimide, an organic material such as a liquid crystal or a Kerr cell material (e.g., nitrobenzene) may be substituted. By tailoring the air bridges to precise dimensions and backfilling with an organic material such as nitrobenzene, optical waveguide modulators may be created. Optical waveguide modulators are exceedingly useful for certain communications applications.

Careful selection of electrical/optical materials can also produce phase shifts in various signals to achieve intensity modulation. This would make it possible to build, by way of example, a 10,000 channel gigahertz speed optical modulator. Electro-optical semiconductor technology could result in devices wherein portions of a semiconductor circuit furnish intelligence while other sections provide modulation or optical coupling to laser-based interconnections. Accordingly, the air bridge interconnection scheme of the presently invented BiCMOS process is extremely rich and diverse in its possibilities.

In addition to organic materials, chemical or even biological materials may also be backfilled or implanted into the air bridge interconnect gaps to produce a heretofore unknown type of semiconductor device. For instance, a biological material or tissue could be backfilled into the air bridge voids as part of a biomedical device to be implanted into a biological organism. An appropriate filler material could provide the proper interface with the host organism, thereby eliminating or reducing the possibility of rejection. It is conceivable that such devices could find future application in heart pace-makers, kidney implants, brain implants, and so on.

Thus, a process for simultaneously fabricating MOS-type semiconductor devices and bipolar junction transistors on the same silicon substrate, has been described.

I claim:

1. A method of fabricating metal-oxide-semiconductor field-effect type devices (MOSFETs) and bipolar junction transistors (BJTs) in a semiconductor substrate comprising the steps, steps (e) and (f) being performed in no particular order, of:
   (a) defining active regions in said substrate for said MOSFETs and said BJTs;
   (b) forming a gate dielectric over said substrate;
   (c) depositing a first layer of polysilicon over said gate dielectric;
   (d) selectively etching said first polysilicon layer to form a plurality of first polysilicon members separated by a corresponding plurality of substantially equal spaces, a first portion of said first polysilicon members forming the gates of said MOSFETs, a second portion forming the extrinsic base contacts of said BJTs, and a third portion functioning as dummy members for maintaining the spacing between said first polysilicon members;
   (e) doping said active regions of said BJTs to form intrinsic base regions;
   (f) insulating said first polysilicon members;
   (g) depositing an additional layer of polysilicon to fill said spaces, each of said spaces being filled uniformly at substantially the same rate;
   (h) etching said additional polysilicon layer to form a plurality of second polysilicon members within each of said spaces, said second polysilicon members being electrically isolated from said first polysilicon members with the surface of said first and second polysilicon members being substantially coplanar to one another;
   (i) diffusing impurity atoms from said second polysilicon members into said substrate to form source, drain, extrinsic base, and emitter regions therein; and (j) interconnecting said MOSFETs and said BJTs to form an integrated circuit.

2. The method defined by claim 1 further comprising the step of introducing said impurity atoms into said second polysilicon members prior to said diffusing step.

3. The method defined by claim 2 wherein step (a) comprises the step of forming thin, recessed field oxide regions in said substrate.

4. The method defined by claim 3 wherein said recessed field oxide regions are between 1000–2000 Å thick.

5. The method defined by claim 2 wherein said first layer and said additional layer of polysilicon are both amorphous in structure.

6. The method defined in claim 5 wherein said additional layer of polysilicon is deposited isotropically and etched anisotropically.

7. The method defined by claim 6 wherein said additional polysilicon layer completely covers said first polysilicon layer, to a thickness at least as thick as that of said first polysilicon layer.

8. The method defined by claim 1 wherein a fourth portion of said first polysilicon members form interconnects for said integrated circuit.

9. The method defined by claim 7 wherein said spaces are approximately 0.5 microns in width.

10. A method of fabricating a bipolar junction transistor (BJT), an n-channel field-effect transistor (N-FET) and a p-channel field-effect transistor (P-FET) in a silicon substrate comprising the steps, steps (i) and (j) being performed in no particular order, of:
    (a) forming buried layer regions in said substrate for said P-FET and BJT;
    (b) depositing an epitaxial layer over said substrate;
    (c) forming n-well regions in said epitaxial layer for said P-FET and BJT, and p-well regions in said epitaxial layer for said N-FET;
    (d) defining active regions for said N-FET, P-FET and BJT by forming field oxide regions in said epitaxial layer;
    (e) forming a gate oxide over said epitaxial layer;
    (f) forming an opening in said gate oxide over said active region of said BJT;
    (g) depositing a first layer of polysilicon over said gate oxide and said opening;
    (h) selectively etching said first polysilicon layer to form a plurality of first polysilicon members separated by a corresponding plurality of substantially equal spaces, a first portion of said first polysilicon members forming the gates of said N-FET and said P-FET, a second portion forming the extrinsic base contact of said BJT, and a third portion functioning as dummy members for maintaining the spacing between said first polysilicon members;
    (i) doping said active region of said BJT to form an intrinsic base region;
    (j) forming an insulative layer on the vertical sides of said first polysilicon members;
    (k) isotropically depositing a second polysilicon layer to fill said spaces and to cover said first polysilicon members, each of said spaces being filled uniformly at substantially the same rate;
    (l) anisotropically etching said second polysilicon layer until the upper surface of said second polysilicon layer is substantially coplanar with said first polysilicon members thereby creating a plurality of second polysilicon members within said spaces, each of which are electrically isolated from said first polysilicon members, a portion of said second polysilicon members forming the source and drain contacts for said N-FET and P-FET, and the emitter contact for said BJT;
    (m) annealing said N-FET, P-FET and BJT to simultaneously diffuse impurity atoms from said second polysilicon members into said epitaxial layer to form source, drain, extrinsic base and emitter regions therein;
    (n) interconnecting said P-FET, said N-FET and said BJT to form an integrated circuit.

11. The method defined by claim 10 further comprising the step of introducing said impurity atoms into said second polysilicon members prior to said annealing step.

12. The method according to claim 10 wherein said field oxide regions are thinly recessed into said epitaxial layer.

13. The method according to claim 12 wherein said recessed field oxide regions are between 1000–2000 Å thick.

14. The method as defined by claim 13 wherein said gate oxide is approximately 100 Å thick.

15. The method as defined by claim 11 wherein said first and said second layers of polysilicon are both amorphous in structure.

16. The method as defined by claim 15 wherein a fourth portion of said first polysilicon members form a first set of interconnects for said integrated circuit.

17. The method as defined by claim 11 wherein said introducing step comprises the steps, in no particular order, of:
    implanting boron atoms into said source and drain contacts of said P-FET;
    implanting phosphorous atoms into said source and drain contacts of said N-FET; and
    implanting arsenic atoms into said emitter contact of said BJT.

18. The method as defined by claim 11 further comprising the step of implanting dopants into said first and second portions of said first polysilicon members prior to said annealing step.

19. The method as defined by claim 16 wherein another portion of said second polysilicon members form a second set of interconnects for said integrated circuit.

20. The method as defined by claim 15 wherein said spaces are about 0.5 microns wide.

21. A method of fabricating bipolar junction transistors (BJTs), n-channel field-effect transistors (N-FETs) and p-channel field-effect transistors (P-FETs) in a silicon substrate having a main face comprising the steps, steps (i) and (j) being performed in no particular order, of:
    (a) forming buried layer regions in said substrate where said P-FETs and said BJTs are to be located;
    (b) depositing an epitaxial layer over said substrate;
    (c) forming n-well regions in said epitaxial layer for said P-FETs and said BJTs, and p-well regions in said epitaxial layer for said N-FETs;
    (d) defining active regions for said N-FETs, P-FETs and BJTs by first thermally oxidizing selected regions of said epitaxial layer, and then isotropically etching said selected regions until they are roughly coplanar with said main face to produce thin, recessed field oxidation regions;
    (e) thermally growing a gate oxide over said epitaxial layer;

(f) forming openings in said gate oxide over said active regions of said BJTs;

(g) depositing a first layer of polysilicon over said gate oxide and said openings;

(h) selectively etching said first polysilicon layer to form a plurality of first polysilicon members separated by a corresponding plurality of substantially equal spaces a first portion of said first polysilicon members forming the gates of said N-FETs and said P-FETs, a second portion forming the extrinsic base contacts of said BJTs, and a third portion functioning as dummy members for maintaining an accurate and controlled spacing between said first polysilicon members;

(i) implanting said active regions of said BJTs with a p-type impurity to form intrinsic base regions;

(j) forming an insulative layer of silicon dioxide on the side walls of said first polysilicon members;

(k) depositing a second polysilicon layer to isotropically fill said spaces and to cover said first polysilicon members to a thickness sufficient to form a substantially planar surface over said substrate, each of said spaces being filled uniformly at substantially the same rate;

(l) anisotropically etching said second polysilicon layer until the upper surface of said second polysilicon layer is substantially coplanar with the upper surface of said first polysilicon members thereby creating a plurality of second polysilicon members within said spaces, each of which is electrically isolated from said first polysilicon members, a first portion of said second polysilicon members forming the source and drain contacts for said N-FETs, a second portion forming the source and drain contacts for said P-FETs, a third portion forming the emitter contacts for said BJTs;

(m) selectively implanting said second polysilicon members with dopants having high coefficients of diffusivity in polysilicon;

(n) annealing said N-FETs, P-FETs and BJTs to simultaneously diffuse said dopants from said second polysilicon members into said n-well and p-well regions to form source, drain, extrinsic base and emitter regions in said substrate;

(o) interconnecting said P-FETs, N-FETs and BJTs to form an integrated circuit.

22. The method defined in claim 21 wherein said field oxidation regions are between 1000 Å and 2000 Å thick.

23. The method defined in claim 22 wherein said gate oxide is approximately 100 Å thick.

24. The method defined in claim 21 wherein said first and said second layers of polysilicon are both amorphous in structure.

25. The method defined in claim 24 wherein a fourth portion of said first polysilicon members form a first set of interconnects in said integrated circuit.

26. The method defined in claim 21 wherein step (m) comprises the steps, in no particular order, of:
implanting boron atoms into said source and drain contacts of said P-FETs;
implanting phosphorous atoms into said source and drain contacts of said N-FETs; and
implanting arsenic atoms into said emitter contacts of said BJTs.

27. The method defined in claim 25 wherein a fourth portion of said second polysilicon members form a second set of interconnects in said integrated circuit.

28. The method defined in claim 21 further comprising the step of isolating said P-FETs, N-FETs and BJTs.

29. The method defined in claim 28 wherein said isolating step comprises the steps of:
etching selected ones of said second polysilicon members to create voids between corresponding adjacent first polysilicon members;
filling said voids with an insulating material.

30. The method defined by either claims 1, 10 or 21 wherein said interconnecting step comprises the steps of:
siliciding said first and second polysilicon members;
depositing a dielectric layer over said substrate;
selectively masking said insulative layer to form openings down to said silicided first and second polysilicon members;
depositing a third polysilicon layer;
patterning said third polysilicon layer to define interconnect lines coupled to said silicided first and second polysilicon members.

31. The method defined by claim 30 wherein said siliciding step comprises the step of forming a cobalt silicide layer on said first and said second polysilicon members.

32. The method as defined by claim 31 wherein said patterning step also defines polysilicon resistors in said third polysilicon layer.

33. The method as defined by claim 31 further comprising the steps of:
forming a plurality of pedestal contact members on said substrate, the tops of said pedestal contact members having a vertical height which extends above the highest feature of said third polysilicon layer, one portion of said contact members providing electrical contact to said integrated circuit, and another portion forming structural support members over insulative regions;
depositing a synthetic polymer over said substrate to a thickness greater than said vertical height;
planarizing said synthetic polymer consistent with said tops of said contact members; and
depositing and patterning a metal layer to form an additional interconnect layer for said integrated circuit.

34. The method as defined in claim 33 wherein said pedestal contact members are greater than 7000 Å thick.

35. The method as defined in claim 34 further comprising the step of removing said synthetic polymer such that said additional interconnect layer is solely supported by said pedestal contact members.

36. A semiconductor process for forming bipolar junction transistors (BJTs) and metal-oxide-semiconductor (MOS) devices in a silicon substrate comprising the steps of:

(a) patterning a first polysilicon layer over said substrate to form a plurality of equally spaced first polysilicon members, a first portion of said first polysilicon members forming said gates of said MOS devices, a second portion forming extrinsic base contacts to said BJTs, and a third portion functioning as dummy members which function to maintain the equal spacing between said first polysilicon members;

(b) depositing a first insulative layer over said first polysilicon members;

(c) depositing polysilicon in the spaces between said plurality of first polysilicon members thereby forming a corresponding plurality of second polysilicon members, a portion of said second polysilicon members forming source and drain contacts for said MOS devices and emitter contacts for said BJTs;

(d) forming openings in said first insulative layer over selected ones of said gates of said MOS devices;

(e) forming first silicide contact regions over said selected ones of said gates and over said second polysilicon members;

(f) depositing a second insulative layer over said BJTs and MOS devices;

(g) masking said second insulative layer to form openings which extend down to said first silicide contact regions;

(h) depositing an interconnective layer; and (i) etching said interconnective layer and said second insulative layer, but not said first silicided contact regions, to define interconnect lines coupling said MOS devices and said BJTs.

37. THe method defined by claim 36 wherein said first silicide contact regions comprise cobalt silicide.

38. The method defined by claim 36 wherein said first and second polysilicon members are both amorphous in structure.

39. The method defined by claim 38 wherein wherein said spaces are filled uniformly and at substantially the same rate during step (c).

40. The method defined by claim 39 wherein said interconnective layer comprises a third layer of polysilicon.

41. A process for fabricating semiconductor devices, including MOS-type field-effect devices, in a silicon substrate, said process maintaining a high level of planarization to increase circuit density and performance, said process comprising the steps of:

(a) forming a gate oxide over said substrate;

(b) depositing a first polysilicon layer over said gate oxide;

(c) etching said first polysilicon layer to form a plurality of first polysilicon members separated by a corresponding plurality of substantially equal spaces, a first portion of said first polysilicon members forming the gates of said field-effect devices, and a second portion functioning as dummy members for maintaining the spacing between said first polysilicon members;

(d) insulating said first polysilicon members;

(e) uniformly filling said spaces with polysilicon thereby creating a plurality of second polysilicon members, each of said spaces being filled at substantially the same rate due to said spacing, said first and second polysilicon members comprising the gates, and contacts for said semiconductor devices.

42. The method as defined in claim 41 wherein selected ones of said second polysilicon members also function as a diffusion source for the formation of source and drain regions in said substrate.

43. The method is defined by claim 41 wherein step (e) further comprises the steps of:

depositing a second polysilicon layer over said substrate, said second polysilicon layer uniformly filling said spaces and covering said first polysilicon members;

anisotropically etching said second polysilicon layer until said first polysilicon layer is substantially coplanar with said second polysilicon layer, said etching step creating said plurality of second polysilicon members within said spaces.

44. The method as defined by claim 43 further comprising the step of forming source and drain regions for said devices and said substrate either following step (c) or step (d).

45. The method as defined in claim 43 wherein said first and second polysilicon layers are both amorphous in structure.

46. The method as defined in claim 45 wherein a third portion of said first polysilicon members also form extrinsic base contacts for bipolar junction transistors.

47. The method as defined in claim 46 wherein a portion of said second polysilicon members form the emitter contacts for said bipolar junction transistors.

48. The method as defined in claim 47 further comprising the initial step of forming thin field isolation regions recessed in said substrate, said isolation regions defining the active regions for said devices.

49. The method as defined in claim 48 further comprising the steps of depositing a third polysilicon layer over said wafer surface; and patterning said third polysilicon layer to define polysilicon interconnects which provide electrical connection between said first and second polysilicon members.

50. The method as defined in claim 49 further including the step of forming a planar air-bridge metal interconnect layer providing electrical connection between said second polysilicon members.

* * * * *